United States Patent [19]

Hyatt

[11] Patent Number: 4,942,516
[45] Date of Patent: Jul. 17, 1990

[54] SINGLE CHIP INTEGRATED CIRCUIT COMPUTER ARCHITECTURE

[76] Inventor: Gilbert P. Hyatt, 7841 Jennifer Cir., La Palma, Calif. 90623

[21] Appl. No.: 209,115

[22] Filed: Jun. 17, 1988

Related U.S. Application Data

[63] Continuation-in-part of Ser. No. 223,959, Jan. 12, 1981, abandoned, and a continuation-in-part of Ser. No. 860,253, Dec. 14, 1977, abandoned, and a continuation-in-part of Ser. No. 860,256, Dec. 14, 1977, Pat. No. 4,829,419, and a continuation-in-part of Ser. No. 860,258, Dec. 14, 1977, and a continuation-in-part of Ser. No. 402,520, Oct. 1, 1973, Pat. No. 4,825,364, and a continuation-in-part of Ser. No. 101,881, Dec. 28, 1970, abandoned, and a continuation-in-part of Ser. No. 879,293, Nov. 24, 1969, abandoned.

[51] Int. Cl.$^5$ .................................................. G06F 1/00
[52] U.S. Cl. .................................... 364/200; 364/232.8
[58] Field of Search .................................. 364/200, 900

[56] References Cited

U.S. PATENT DOCUMENTS

| | | |
|---|---|---|
| 2,918,669 | 12/1959 | Klein . |
| 3,028,659 | 4/1962 | Chow . |
| 3,248,711 | 4/1966 | Lewin . |
| 3,266,023 | 8/1966 | Werme ................................ 340/72.5 |
| 3,286,239 | 11/1966 | Thompson et al. ............... 340/172.5 |
| 3,315,235 | 4/1967 | Carnevale et al. ............... 340/172.5 |
| 3,332,071 | 7/1967 | Goldman et al. . |
| 3,368,205 | 2/1968 | Hunter et al. ..................... 340/172.5 |
| 3,370,276 | 2/1968 | Schell, Jr. ......................... 340/172.5 |
| 3,415,981 | 12/1968 | Smith et al. ................... 340/172.5 X |
| 3,416,139 | 12/1968 | Marx .................................. 340/172.5 |
| 3,430,209 | 2/1969 | Goshorn et al. .................. 340/172.5 |
| 3,440,618 | 4/1969 | Chinlund .......................... 340/172.5 |
| 3,462,742 | 8/1969 | Miller et al. .......................... 364/200 |
| 3,517,171 | 6/1970 | Avizienis ..................... 340/172.5 X |
| 3,535,683 | 10/1970 | Woods et al. ..................... 340/172.5 |
| 3,548,172 | 12/1970 | Centner et al. ................. 235/151.11 |
| 3,548,382 | 12/1970 | Lichty et al. ..................... 340/172.5 |
| 3,560,933 | 2/1971 | Schwartz .......................... 340/172.5 |
| 3,566,358 | 2/1971 | Hasbrouck ....................... 340/172.5 |
| 3,573,741 | 4/1971 | Gavril ............................... 340/172.5 |
| 3,579,201 | 5/1971 | Langley .............................. 364/200 |
| 3,582,902 | 6/1971 | Hirtle et al. ...................... 340/172.5 |
| 3,585,601 | 6/1971 | Lahrson et al. .................. 340/172.5 |
| 3,585,607 | 6/1971 | DeHaan et al. .................. 340/172.5 |
| 3,602,901 | 8/1971 | Dixon et al. ...................... 340/172.5 |
| 3,618,037 | 11/1971 | Wollum et al. ................... 340/172.5 |
| 3,626,385 | 12/1971 | Bouman ............................ 340/172.5 |
| 3,633,011 | 1/1972 | Bederman et al. ............... 340/172.5 |
| 3,633,268 | 1/1972 | Engbert . |
| 3,646,522 | 2/1972 | Furman et al. ................... 340/172.5 |
| 3,651,484 | 3/1972 | Smeallie .............................. 364/200 |
| 3,659,275 | 4/1972 | Marshall ....................... 340/172.5 X |
| 3,668,653 | 6/1972 | Fair et al. ......................... 340/172.5 |
| 3,671,727 | 6/1972 | Rhoades ......................... 235/151.11 |
| 3,673,576 | 6/1972 | Donaldson, Jr. ................. 340/172.5 |
| 3,676,656 | 7/1972 | Schmidt ......................... 364/900 X |
| 3,680,054 | 7/1972 | Bunker et al. .................... 340/172.5 |
| 3,681,755 | 8/1972 | Stone et al. ....................... 340/172.5 |
| 3,681,757 | 8/1972 | Allen et al. ....................... 340/172.5 |
| 3,686,637 | 8/1972 | Zachar et al. . |
| 3,702,988 | 11/1972 | Haney et al. ........................ 364/200 |
| 3,728,710 | 4/1973 | Berg ............................. 340/172.5 X |
| 3,757,306 | 9/1973 | Boone ................................. 364/200 |
| 4,074,351 | 2/1978 | Boone ................................. 364/200 |
| 4,463,421 | 7/1984 | Laws .................................. 364/200 |
| 4,825,364 | 4/1989 | Hyatt . |
| 4,829,419 | 5/1989 | Hyatt . |

OTHER PUBLICATIONS

A Bigger Market for a Better MOS; Electronic Design Magazine; Apr. 12, 1969.

(List continued on next page.)

*Primary Examiner*—Raulfe B. Zache
*Attorney, Agent, or Firm*—Gilbert P. Hyatt; Gregory L. Roth

[57] ABSTRACT

Microcomputer architecture is provided that facilitates a fully integrated circuit computer on a single integrated circuit chip. The architecture includes use of an integrated circuit ROM for program storage, an integrated circuit RAM or scratch pad memory for alterable operand storage, and integrated circuit logic. Additional architectural features include serial data communication, pulse modulated communication, eight bit instruction bytes, sixteen bit operand words, and shared I/O channels.

41 Claims, 30 Drawing Sheets

OTHER PUBLICATIONS

Bates; Lower Costs for Longer Words; Electronics Magazine; Oct. 28, 1968.
Beelitz et al.; System Architecture for Large-Scale Integration; AFIPS Conference Proceedings; Nov. 1967.
Booher; MOS GP Computer; AFIPS Conference Proceedings; Dec. 1968.
Boysel; Adder on a Chip: LSI Helps Reduce Cost of Small Machine; Electronics; Mar. 1968.
Boysel; Memory on a Chip: A Step Toward Large Scale Integration; Electronics; Feb. 1967.
Brinton; Computer with Peripherals Will Rent for $40 a Month; Electronics; Oct. 1968.
Campeau; The Block-Oriented Computer; IEEE Transactions on Computers; Aug. 1969.
Carroll et al.; The Airborne 4 PI Computer: IBM Aims at Aerospace Guidance; Electronics Magazine; Mar. 1967.
Chu; Digital Computer Design Fundamentals; McGraw-Hill Book Company Inc; 1962.
Conway et al.; A Computer System Designer's View of Large Scale Integration; AFIPS Conference Proceedings; Dec. 1968.
Cserhalmi et al.; Efficient Partitioning for the Batch-Fabricated Fourth Generation Computer; AFIPS Conference Proceedings; Dec. 1968.
DeCastro et al.; Nova Can't Lose Its Instructions; Electronics Magazine; Dec. 9, 1968.
Electronic Components Conference HIC, LSI, but Few Discretes; The Electronic Engineer; Jun. 1967.
Electronic Memories Inc.; Memory Drawings.
Electronic Abroad; Electronics Magazine; Jul. 8, 1968.
Electronics Review; Electronics Magazine; Jun. 24, 1968.
Electronics Review; Electronics Magazine; Nov. 25, 1968.
Farina; Large-Scale Integration: A Status Report; Datamation; Feb. 1968.
Fedde; Plated Wire: A Long Shot That's Paying Off; Electronics Magazine; Nov. 11, 1968.
Flores; Weaving Wires for Aerospace Jobs; Electronics Magazine; Nov. 11, 1968.
Golden et al.; IBM 360 Programming and Computing; Prentis-Hall Inc.; 1967.
Hopkins; Electronic Navigator Charts Man's Path to the Moon; Electronics; Jan. 1967.
Hornbuckle et al.; The LX-I Microprocessor and Its Application to Real-Time Signal Processing; IEEE Transactions on Computers; Aug. 1970.
Hudson; The Applications and Implications of Large Scale Integration; Computer Design; Jun. 1968.
Intel MCS-4 Micro-Computer Set; Brochure, Intel Corporation; Jan. 1972.
Jeenel; Programming for Digital Computers; McGraw Hill; 1959.
Joseph; Impact of Large Scale Integration on Aerospace Computers; IEEE Transactions on Electronic Computers; Oct. 1967.
Levy et al.; System Utilization of Large Scale Integration; IEEE Transactions on Electronic Computers; Oct. 1967.
Lewis et al.; Clear the Hurdles of Microprocessors; Electronic Design Magazine; Sep. 27, 1973.
Lewis et al.; Microprocessor or Random Logic?; Electronic Design Magazine; Sep. 1, 1973.
LSI Still Chases Its Press Clippings; Electronics Magazine; Jun. 1968.
Memory Stacks Up as a Rugged Item; Electronics Magazine; Jul. 8, 1968.
Mesniaeff; The Technical Ins and Outs of Computerized Numerical Control; Control Engineering; Mar. 1971.
Nichols; A Logical Next Step for Read-Only Memories; Electronics Magazine; Jun. 1967.
O'Donnell; Engineering for Systems Using Large Scale Integration; AFIPS Conference Proceedings; Dec. 1968.
Phillips et al.; Complex Monolithic Arrays: Some Aspects of Design and Fabrication; IEEE JSSC; Dec. 1967.
Podraza et al.; Efficient MSI Partitioning for a Digital Computer; IEEE Transactions on Computers, Nov. 1970.
Priel; Semiconductor Arrays Get Bigger and Denser; Electronics Magazine; Jan. 20, 1969.
Remex Technical Manual; Unidirectional Tape Reader Models RR0104RA, RR0304RA.
Rhea; LSI Stress Swings from Technology to Cost; Aerospace Technology; Feb. 1968.

(List continued on next page.)

OTHER PUBLICATIONS

Riley; Compromise; Electronics Magazine; Oct. 28, 1968.
Riley; Third-Generation Small Computer to Make Its Debut in December; Electronics Magazine; Sep. 30, 1968.
Rudenberg; Large-Scale Integration: Promises Versus Accomplishments—The Dilemma of Our Industry; AFIPS Conference Proceedings; Nov. 1969.
Sherman; Programming and Coding Digital Computers; John Wiley & Sons Inc.; 1963.
Standard Read-Only Memories Simplify Complex Logic Design; Electronics Magazine; Jan. 5, 1970.
Stark; Digital Computer Programming; MacMillian Company; 1967.
Thomas; Computer Generated Intraconnections for LSI; National Electronics Conference; 1968.
Thornton et al.; Preface; IEEE JSSC, Feb. 1970.
Three Machine Tool Shows—Or Were They Control Show?; Control Engineering, Nov. 1970.
U.S. Markets 1974; Electronics Magazine; Jan. 10, 1974.
Watson; LSI and Systems the Changing Interface; Electronics; Mar. 1969.
Weinberger; Large Scale Integration of MOS Complex Logic: A Layout Method; IEEE JSSC; Dec. 1967.
Wickes; A Compatible MOS/LSI Microprocessor Device Family; Computer Design Magazine; Jul. 1973.
Blume et al.; Single-Chip 8-Bit Microcomputer Fills Gap Between Calculator Types and Powerful Multichip Processors; Electronics (Intel); Nov. 25, 1976.
Raphael; Microcomputers, "Computers-On-A-Chip"; Process Design (Intel); Jan.-Feb. 1975.
Alaspa et al.; COS/MOS Parallel Processor Array IEEE Journal of Solid State Circuits, (10/1970).
Bohn; Variable Size LSI Arrays Using Customized Uni-Cells NEREM Record, (1967).
Calhoun et al.; A Means of Reducing Custom LSI Interconnection Requirements; IEEE Journal of Solid State Circuits, (10/1972).
D'Agostine; A Flexible Approach to Emitter-Coupled Logic Arrays; International Solid State Circuits Conference, (2/15/1968).
Dingwall; High-Yield Processing for Fixed-Interconnect Large-Scale Integrated Arrays; IEEE Transactions on Electron Devices, (9/1968).
Dunn et al.; At Last, A Bipolar Shift Register with the Same Bit Capacity as MOS; Electronics, (12/8/1969).
Freitag; Automatic Mask Generation for Integrated Circuits; NEREM Record, (1966).
Freitag; Design Automation for Large Scale Integration; Westcon, (8/1966).
Frohman-Bent-Chkowsky et al; Silicon Gate MOS Technology and its Memory Applications; Westcon (8/1970).
Gross et al; Computer Systems for Pattern Generator Control; Bell System Technical Journal (11/1970).
Heath; Large-Scale Integration in Electronics; Scientific American (3/1970).
Hochman et al; Technological Advances in Large Scale Intergration; IEEE Spectrum (5/1970).
Julitz et al; Design of LSI Utilizing 3 Levels of Interconnection Metallization; Proceedings of the National Electronics Conference (1968).
Lathrop; Discretionary Wiring Approach to Large Scale Integration; Westcon (8/1966).
Lynn; Computer-Aided Layout System for Integrated Circuits; IEEE Transactions on Circuit Theory (1/1971).
Marvin et al; Customizing by Interconnection; Electronics (2/20/1967).
Mays; A Brief Survey of Computer-Aided Integrated Circuit Layout; IEEE Transactions on Circuit Theory (1/1971).
Mend et al; Microminiature Solid-State Imaging System Utilizing Hybrid LSI Techniques; IEEE Journal of Solid Atate Circuits (10/1970).
Penisten; Impact of LSI Technology on the Electronics Market; Design Interface Seminar (3/28/1969).
Rosenfeld; Computer Assisted Mask Production; IEEE Proceedings (9/1969).
Schischa et al; System Design as Influenced by Large Scale Integration; Nerem Record (1967).
Sirkin et al; Microprograming Made Easy-With a 4,096-bit Bipolar ROM; Electronics (3/15/71).
Thornton; LSI Subsystems Assembled by the Silicon Water-Chip Technique; International Solid State Circuits Conference (2/15/1968).
Ulrickson; Computer Aided LSI Design; Wescon (8/1969).
Electronic Arrays Inc.; Electronics (7/19/69).
Intel; Electronics (1/5/70).
Philco; Electronics (1/19/70).
Electronic Arrays Inc.; Electronics (2/16/70).
Solitron Devices Inc.; Electronics (03/30/70).
Philco; Electronics (4/27/70).
Texas Instruments Inc.; Electronics (9/14/70).
Kenics Electronics; Electronics (9/28/70).
Electronic Arrays Inc.; Electronics (11/23/70).
Unisem; Electronics (11/23/70).
Hughes Aircraft; Electronics (12/7/70).
Monolithic Memories Inc.; Electronics (5/24/71).

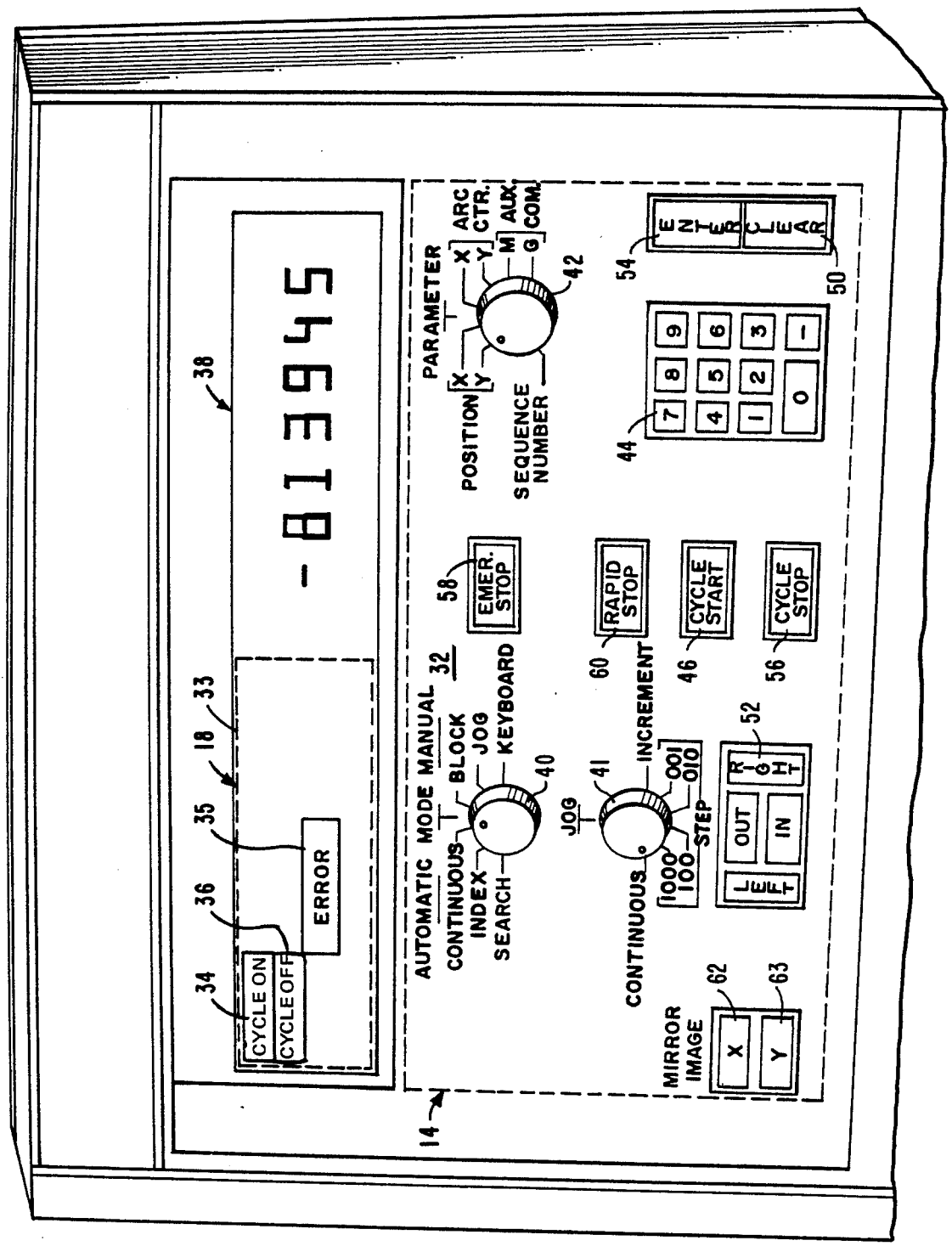
FIG.—2A

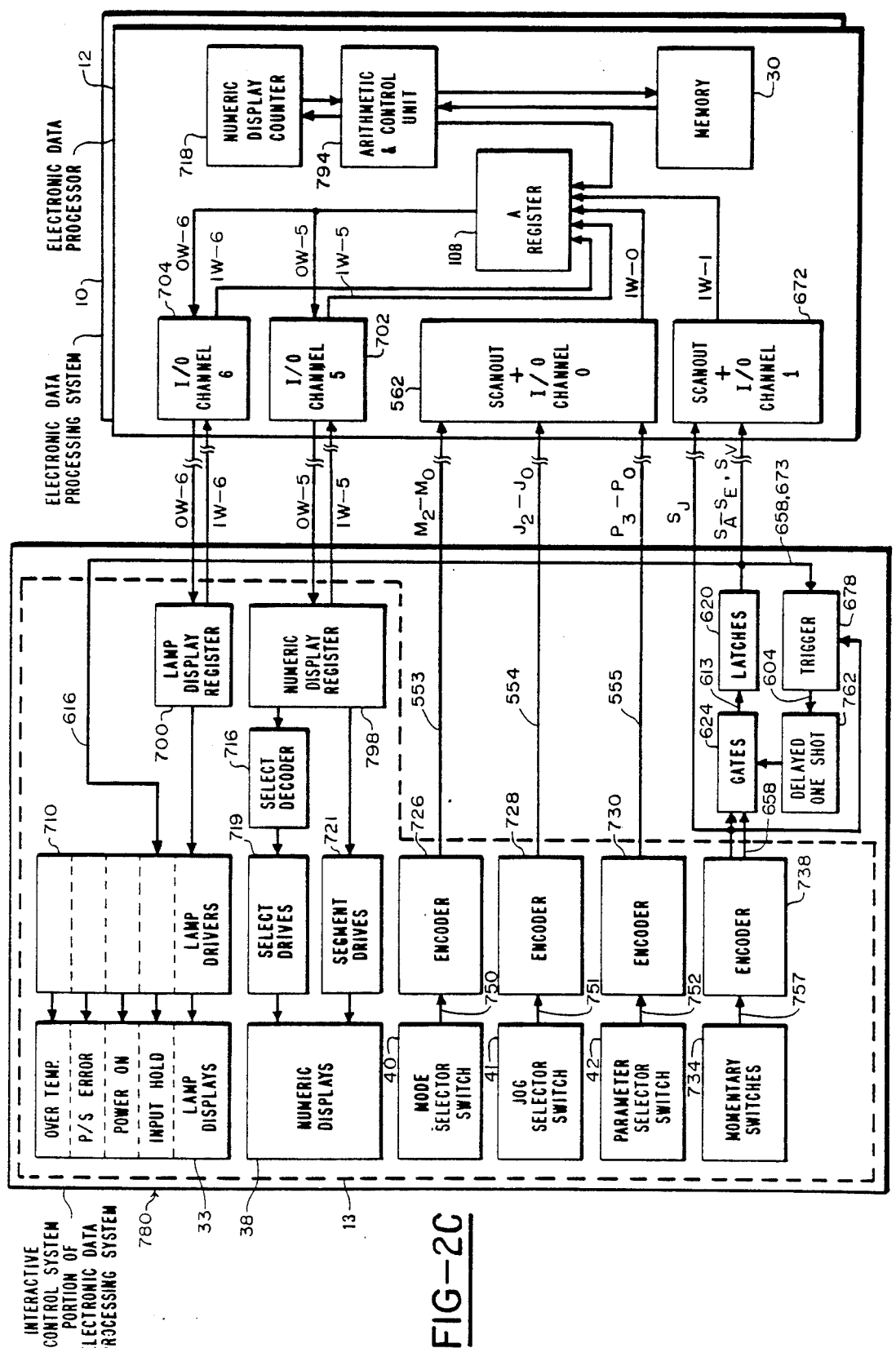

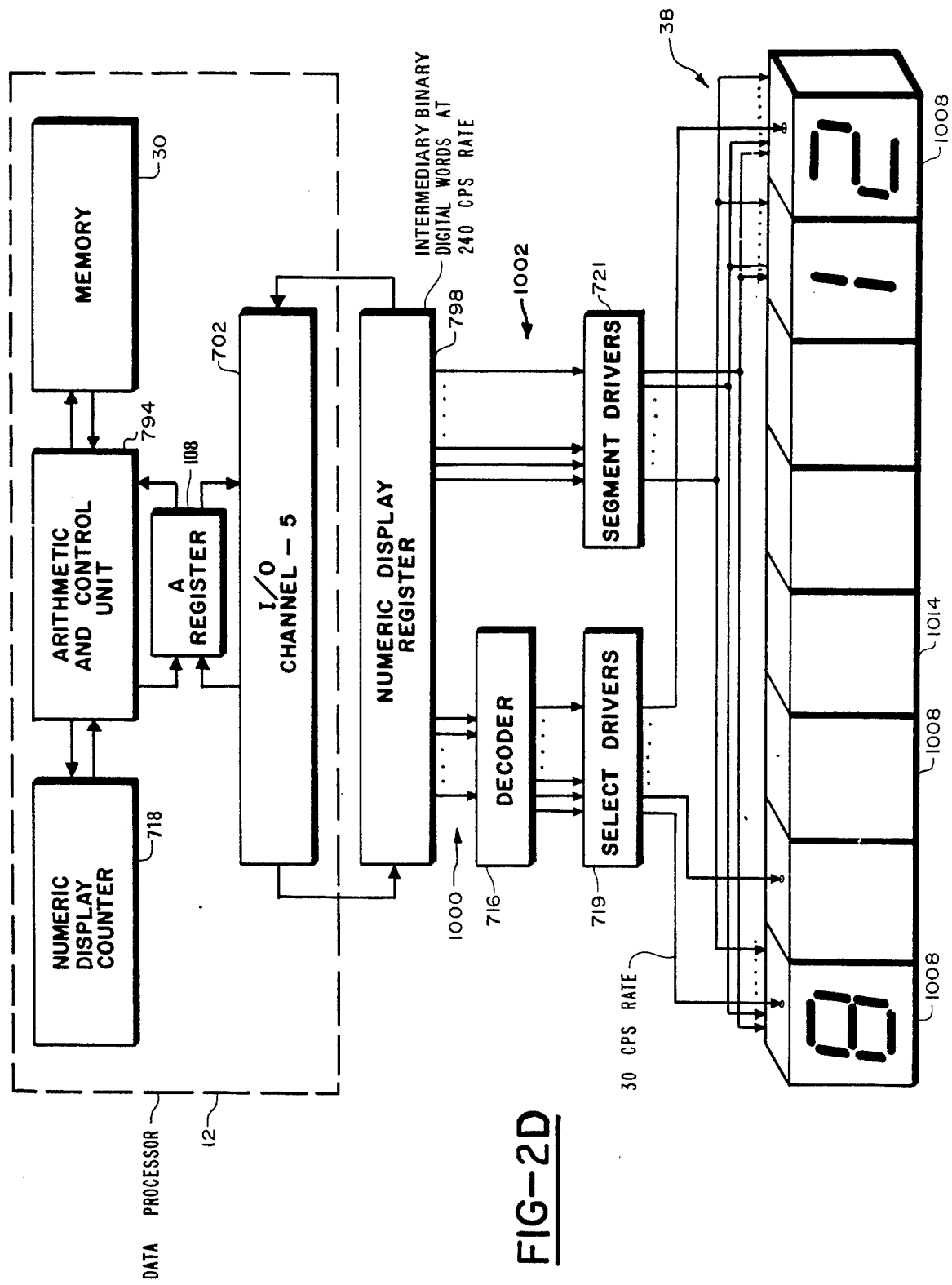

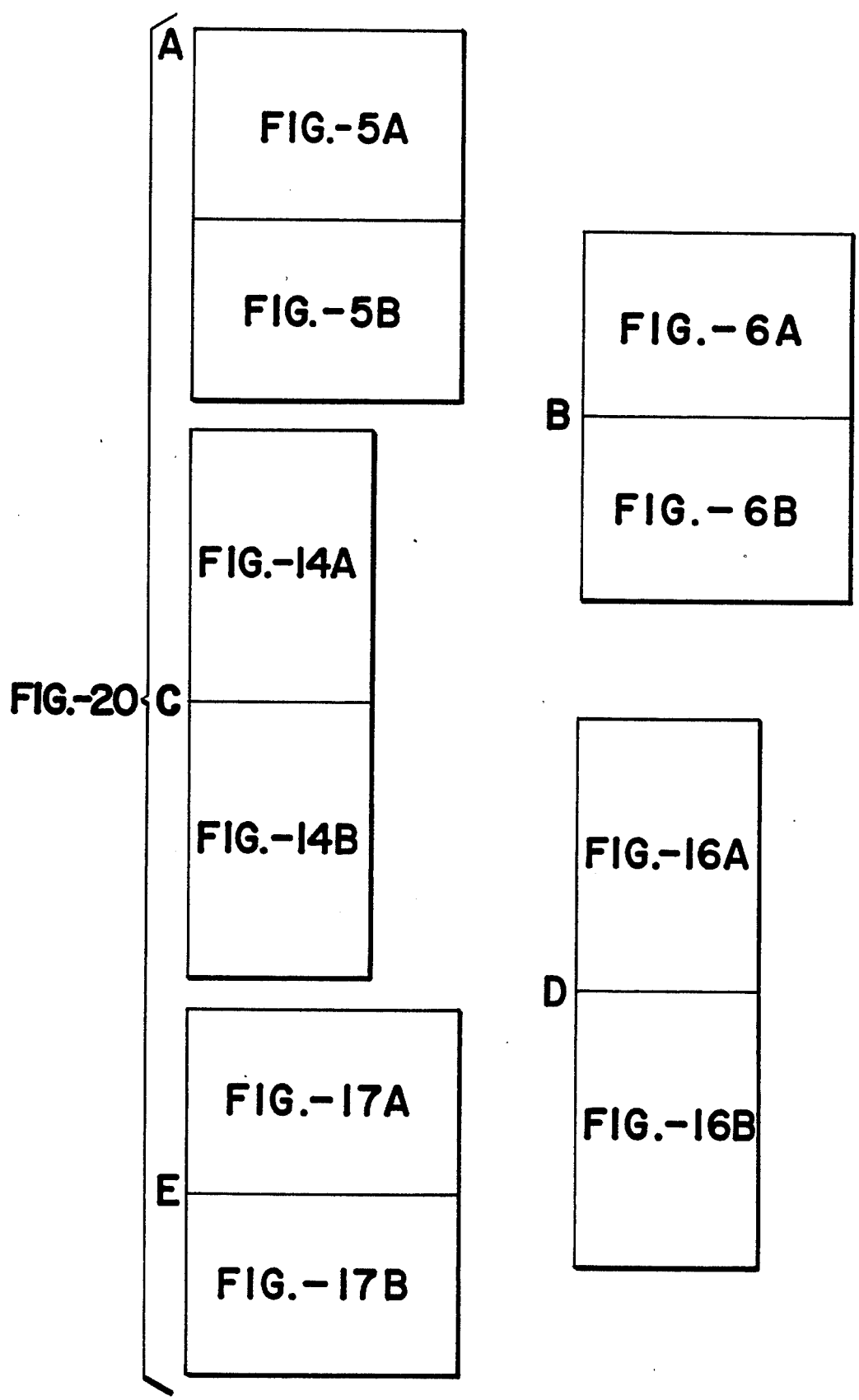

SINGLE CHIP INTEGRATED CIRCUIT COMPUTER ARCHITECTURE

CROSS-REFERENCE TO RELATED APPLICATIONS

This patent applications is a continuation-in-part of the following parent patent applications all by Gilbert P. Hyatt:
1. Method and apparatus for processing the digital output of an input means Ser. No. 879,293 filed on Nov. 24, 1969 now abandoned;
2. Factored data processing system for dedicated applications Ser. No. 101,881 filed on Dec. 28, 1970 and now abandoned;
3. Single chip integrated circuit computer architecture Ser. No. 860,253 filed on Dec. 14, 1977 and now abandoned;
4. Microcomputer control of machines Ser. No. 860,256 filed on Dec. 14, 1977 and now U.S. Pat. No. 4,829,419 issued on May 9, 1989;
5. Computerized machine control system Ser. No. 860,258 filed on Dec. 14, 1977;
6. Monolithic data processor with memory refresh Ser. No. 402,520 filed on Oct. 1, 1973 and now U.S. Pat. No. 4,825,364 issued on Apr. 25, 1989;
7. Data processing system Ser. No. 223,959 filed on Jan. 12, 1981 and now abandoned;

wherein the benefit of the filing dates of the above-referenced parent patent applications is herein claimed under 35 USC 120, 35 USC 121, and other authorities provided therefor; and wherein the above-reference patent applications are herein incorporated-by-reference as if fully set forth at length herein.

This patent application is further related to related patent application entitled Interactive control system Ser. No. 101,449 filed on Dec. 28, 1970 by Lee, Cole, Hirsch, Hyatt, and Wimmer now abandoned which is herein incorporated-by-reference as if fully set forth at length herein.

BACKGROUND OF THE INVENTION

1. Field of the Invention

This invention relates to electronic data processing systems and more particularly to integrated circuit computer.

2. History of the Prior Art

The computer prior art is characterized by computer architectures that are not adapted to fully integrated circuit computers. Such prior art architectures are configured around non-volatile electrically alterable memories such as core memories which are large, power consuming, expensive and are not conveniently miniaturized nor batch fabricated as possible with integrated circuit processes. Prior art systems have been configured around such core memory type computers, thereby constraining system architecture by computer architectural limitations.

A further discussion of the prior art is set forth in parent application Ser. No. 101,881 as-amended at page 1 line 29 to page 3 line 29; which discussion is herein incorporated by reference.

Digital computers have been widely used for complex computational and processing applications but have only started to be used in the less sophisticated business and industrial applications and have not been used in consumer-type applications. High cost and complexity of computer systems are two of the main reasons for these limitations in computer applications. A computer is not a useful device by itself because it must be contained in a system with input and output devices in order to interact with the outside environment. Unnecessary complexity has resulted in the prior art, both in configuring the computer and in configuring the system. This complexity has resulted in high costs and other effects of complexity. A comprehensive discussion of the prior art is presented to illustrate the reason for this prior art computer system complexity to provide a basis for discussing this invention.

Computers are basically numerical computation devices and, before they can be useful, it is necessary to provide a suitable mechanism to supply input digital data to the computer upon which computations are to be performed in response to the computer's stored program and also to provide suitable output mechanisms for removing the computer digital data from the computer system known to those skilled in the art as peripheral equipment. Typically, such peripheral subsystems are self-contained, stand-along devices which operate "off-line" from the computer and which are physically and operationally separate and identifiable from the actual data processing subsystem within the computer system. A typical input peripheral subsystem might be a punched tape reader, a control panel, a high-speed punched card reader, a magnetic tape reader, a typewriter or the like. A typical output peripheral subsystem might be a typewriter, a high-speed line printer, a visual display device such as a cathode ray tube or an array of alpha numeric tubes or some form of servo system which enables the computer to control some physical or mechanical device.

In the prior art, the actual data processor subsystem and the peripheral subsystem have usually been designed separately in the belief that this enabled each to perform its particular function in the system in an optimum manner. Each subsystem is designed to operate in its own particular signal format which is usually intrinsic to that particular subsystem. For example, the actual data processor or central computer in the system is usually designed to operate from whole words, each consisting of many bits in parallel, and to perform the computations within the data processor subsystem at the extremely high rates of speed which pure electronic devices can achieve. In contrast to this, most peripheral subsystems include moving mechanical components which limit their rates of speed to much lower rates, usually several orders of magnitude lower than the speed of purely electronic data processing subsystems. In addition, depending upon its physical nature, each particular peripheral subsystem usually dictates a particular signal format in which it operates. For example, an input peripheral subsystem such as a punched tape reader or a typewriter supplies sequential information in a particular format and at rates largely determined by the mechanical characteristics of the input peripheral subsystem. Output peripheral subsystems such as typewriters, high-speed line printers, servo systems or the like in turn require that control signals having particular formats adapted to the particular output peripheral subsystem be applied to the peripheral subsystem in order that the subsystem perform its function in the system in an optimum manner.

Since the central data processor subsystem operates in its signal format and each of its input and output peripherals operates in its own signal format which is practically always different from the signal format of the central data processor, some means must be provided to translate between these various signal formats in order that the peripheral subsystems can provide their intended function of providing input signals to the computer and extracting the output signals from the computer. The usual prior art way of effecting this translation is to provide a separate interface unit between each peripheral subsystem and the central data processor subsystem. The necessity of these interface units was not questioned in the prior art. Indeed, it was generally considered that, in addition to the necessary signal translating function, they performed many other useful functions in the system which resulted in an overall simpler and more useful computer system. For example, the interface units served to "buffer" the peripheral subsystem from the central data processor unit to synchronize the operation of the central data processor subsystem and the peripheral subsystem.

Computer designers assigned peripheral tasks to the special-purpose interface units between the peripheral subsystems and the central data processor subsystem in order that input data would be available to the central data processor subsystem in its own desired format at whatever times it desired this information, and that the interface units for the output peripheral subsystems might receive output signals from the computer at the computer's own convenience and in the computer signal format. These interface units usually included many special-purpose logic circuits or devices which were unique to the particular peripheral subsystem associated with that interface unit.

For example, input peripheral subsystems of the type described above develop rudimentary input signals in their own signal format which might include time-ambiguous information. Such rudimentary input signals are customarily preprocessed in the interface unit associated with the peripheral subsystem to provide a signal in central data processor format. Thus, those skilled in the art have not considered the interface units to be merely a necessary evil which must be interposed between the peripheral subsystem and the central data processor subsystem. Instead, such units have been considered to have many positive virtues which enable the overall computer system to perform its overall function in the only feasible manner.

These interface units performed what might be called the communication function of the system. This communication function, both between the central data processor subsystem and the peripheral subsystems and between the system and the "outside world" is largely controlled and performed by these interface units. These communication functions are performed without reference to the data processor's stored program, in an off-line manner. The data processor is thus left to do only its "intended task" of performing computations under control of its stored program, or of performing the computation function in the system.

Because of the high cost of designing and manufacturing an electronic computer, computers have traditionally been designed to perform a large variety of data processing functions, and interfaced peripheral equipment is therefore arranged to permit maximum use of computer time. The interfacing provides signal conditioning, synchronization to the selected intrinsic time base, and transfer of command and data signals. Thus, electronic data processors have been organized on an essentially modular basis, with processor, storage, housekeeping and peripheral modules all committed to a particular machine language, timing and intercommunication format. Electronic data processing systems may be implemented with integrated circuits. However, such systems are not fully integrated circuit or monolithic systems because of requirements for variable as well as constant data storage, and therefore use core or other similar types of storage. The system may be "dedicated" to a particular function, but remains essentially a processor and the significance of dedication is that other capabilities built into the system are unused.

A number of data processing systems are now referred to as including "dedicated" computers. A "dedicated" computer is a general-purpose unit which is "dedicated" to operate only in a particular application. The "dedication" of the computer denotes a limitation on the usage of a computer having a capability to operate in additional applications.

Although a computer dedicated in this sense may be a general-purpose machine of a standard commercial type, substantial peripheral and interface equipment is very often required. For example, completely different control panels may be required for similar but different applications, and this in turn entails the usage of a unique hardwired interface for each control panel in order to make it operate in conjunction with the system.

Control panels in prior art systems are typically an array of panel-mounted components, including switches and lamps, interconnected with discrete wiring and cabling, which is routed to electronics boards. Interlocking and control functions are hardwired as an integral part of the panel. The numerics are either refreshed with hardwired electronics or are not refreshed at all, but latched with redundant electronics. Switches and lamps are often directly connected to various parts of the system to control and monitor hardwired functions. The prior art control panels generally have large bundles of interconnecting cabling resulting in degraded reliability and poor economy coupled with hardwired functions that can only be changed by rewiring and restructuring the system physically, yielding little if any degree of versatility.

The so-called mini-computers now in widespread use are relatively low in cost compared to earlier systems but costs of interfacing and peripheral equipment are often considerably in excess of the cost of a mini-computer itself. By dedicating a computer to a specific application, considerable savings in cost can be realized by using a relatively low cost mini-computer since a computer having large capabilities may not be needed for a specific application. However, the cost of peripheral equipment and necessary interfacing remains substantial. Furthermore, inclusion of this dedication results in loss of general-purpose capabilities of the mini-computer.

Some of the peripheral and interfacing disadvantages have been substantially reduced in some special-purpose machines of which a prominent example is found in numerical control systems. Such systems, however, inherently lack the versatility of systems incorporating general-purpose computers. Consequently in order to incorporate new features or to extend their system versatility, even within a particular application, they must either be significantly redesigned or new subsystems must be added along with appropriate interfacing. Thus, a special-purpose system may not be able to compute a contouring function; and to incorporate such a capability, special-purpose circuitry must be integrated into the system. On the other hand, where a general-purpose computer is used with conventional interfacing to input-output systems, computational and memory capacity may be only partially realized. However, any change of system orientation, such as change or addition of an item of peripheral equipment, still requires conventional interfacing to be added. The prior art is further shown in the prior art reference cited herein.

SUMMARY OF THE INVENTION

A computer architecture is provided that can be fully implemented with integrated circuits. An integrated circuit ROM is used for program storage and an integrated circuit scratch pad memory is used for alterable storage of operands. This invention considers that a fully integrated circuit computer may require non-volatile and electrically alterable capability such as provided with prior art core memories. Integrated circuit memories having both non-volatile and alterable capability did not exist at the effective filing date of the instant application. Therefore, a combination of memories is used to overcome the limitations of existing memories. An integrated circuit ROM is used to provide non-volatile storage capability, both the ROM is not able to provide alterable capability. Therefore, an integrated circuit alterable memory is used to provide alterable storage capability even though the storage is volatile. A computer architecture is provided for accessing instructions stored in ROM for processing operands stored in alterable scratch pad memory to utilize the advantages of both memory types and to compensate for the disadvantages of both memory types.

A further summary of the present invention is set forth in parent application Ser. No. 101,881 as-amended at page 4 line 2 to page 6 line 13; which summary is herein incorporated by reference.

The data processing system of the present invention provides improvements over prior art systems such as reduced cost, improved versatility, and improved performance. These improvements are unique in the art, wherein terminology has been adapted to describe these improvements; as discussed below.

Prior art computer systems use a central data processor interacting with peripheral devices having interface controllers, wherein the data processor and the peripheral devices are physically identifiable "stand-alone" units. Advantages are obtained in the system of the present invention by reducing or eliminating the rigid physical partitioning of the prior art systems; wherein the data processor and the peripheral devices may be merged together to reduce physical and operational boundaries, which may be called physical distribution of the data processor.

Further, the prior art interfaces and peripheral controllers may be reduced or eliminated by the data processor providing operations usually performed with the prior art controllers and interfaces. The data processor performing the prior art controller and interface operations under program control may be called operational dispersion of the data processor. Further, the peripherals may be simplified such as by reduction or elimination of the prior art interfaces and controllers so that the peripherals are no longer "stand-alone" devices and may be called elemented extremities of the data processor; wherein the term elemental pertains to simplified, reduced, or minimized and the term extremity pertains to a device at the extremity of the data processor such as a data processor input device or output device. A "factored" system may describe the system of the present invention wherein the various operations are "factored" and, when common factors exist, redundant factors may be eliminated. For example, when a controlling capability exists in both a data processor and an interface controller, the common capability may be identified and the redundant capability removed or "factored" out of the controller; wherein the data processor may provide this capability with a reduction in controller hardware and with an increase in versatility associated with programmable data processor operations. Because a data processor uses time-sharing to a very high level by executing sequential instructions, this capability may cost no more than a small amount of program memory to store an interface controller program routine.

Systems in accordance with the invention are characterized by a unique combination of high performance and versatility with low cost. The versatility results from extension of the general-purpose nature of a data processor to the entirety of the system, including its extremities. Consequently, the system can often be oriented to perform a significantly different task or tasks primarily by programming changes. The concurrent low cost is attained in large part by usage of elemental input and output units of ultimate simplicity. A mutual interdependence is employed, on a systems basis, between processor-dependent extremities and widespread operative dispersion, to contribute significantly to these results. Of great importance, it is to be noted that this novel restructuring into factored systems does not unduly burden or inherently restrict the data processor capability. Instead, the system per se acquires a more general-purpose capability.

An important aspect of the invention is that systems in accordance with it may be committed for best cost-performance characteristics to the performance of a given task or class of tasks by virtue of employment of only those extremities associated with the selected tasks. In such situations, only particular extremities are employed, extraneous data processor capability is reduced, and the operation of the system may be further varied toward the chosen ends, while retaining the general-purpose processor capability on a systems level. In a specific example given by way of illustration only, a factored numerical control system utilizes operative dispersion in conjunction with elemental extremities performing prime functions. The system may be used to perform a single task or subtask involving any or all of these prime functions.

Novel usage is made conjointly of operative dispersion of functions where the data processor may be required to perform subsidiary real-time extremity associated subtasks under program control, permitting communication between a data processor and an extremity in signal format intrinsic to that extremity and acceptable to the data processor. These relationships become most clear as they pertain to elemental extremities or appendages, which not only fulfill the functions of overstructured peripherals, but constitute generalized operators of much greater versatility. Such systems become "committed" to a particular task or family of tasks when the extremities or appendages are limited to those needed for that task and when computational and memory capabilities are similarly restricted.

A general-purpose data processor is provided with the digital portions fully implementable with integrated circuits. Thus, an integrated circuit read-only memory (ROM) provides an example of a capability not found in present data processing systems. Other examples are a random-access memory (RAM) and other types of flip-flop memories used alone or in combinations of integrated circuit memories for this data processing system.

BRIEF DESCRIPTION OF THE DRAWINGS

A better understanding of the invention may be had from a consideration of the following detailed description, taken in conjunction with the accompanying drawings, in which:

FIGS. 2A to 2D (herein called FIG. 2) illustrate a control panel and display panel making up part of the numerical control system of FIG. 1 where FIG. 2A shows a front view of the control panel and display panel, FIG. 2B shows a partly broken away front view of the control and display panel, FIG. 2C shows the interrelation between the control panel and display panel and the data processing system, and FIG. 2D shows the data processor dependent arrangement for refreshing the numeric displays;

FIGS. 14A to 14F are herein called FIG. 14.

FIGS. 15A and 15B are herein called FIG. 15.

FIG. 20 illustrates the manner in which the separate sheets of drawings of FIGS. 5A and 5B, FIGS. 6A and 6B, FIGS. 14A and 14B, FIGS. 16A and 16B, and FIGS. 17A and 17B are combined to form FIGS. 5, 6, 14, 16 and 17 respectively.

DETAILED DESCRIPTION

Introduction

Figure 1:
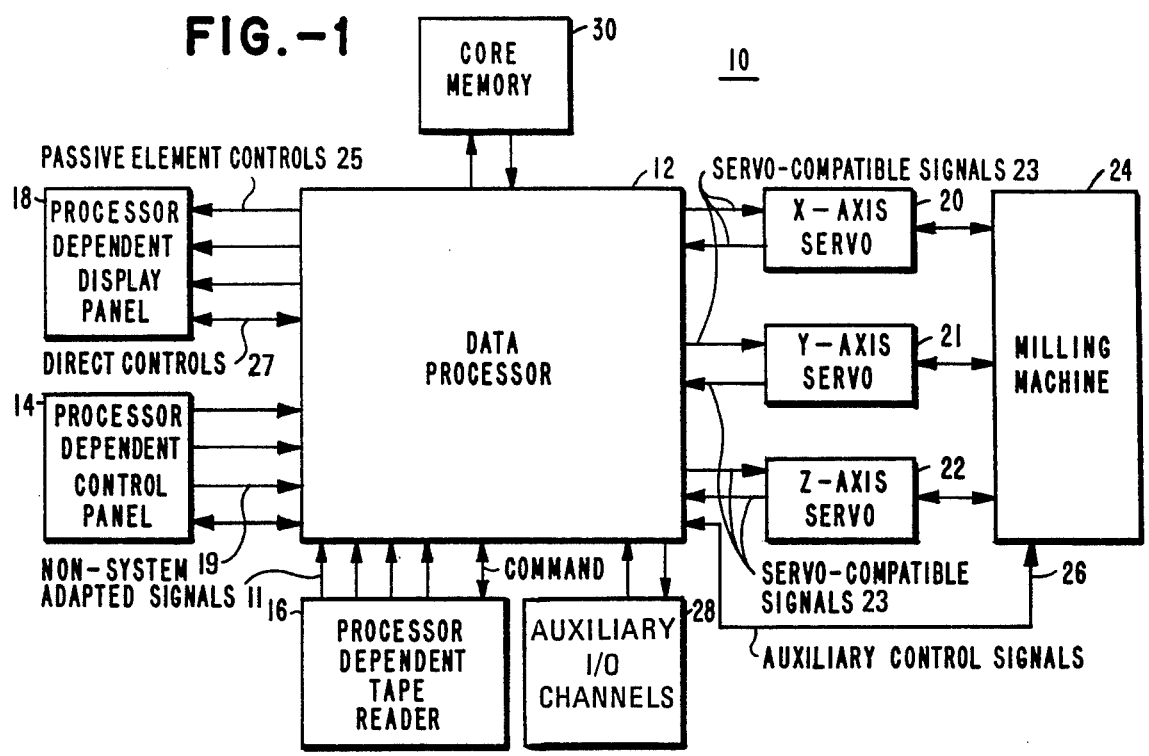
FIG. 1 is a block diagram representation of a numerical control system in accordance with the invention.

By way of example, a factored computer system is represented in block diagram form in FIG. 1 as a numerical control system 10, including an electronic data processor 12, arranged in accordance with the invention. The specific example referred to here and described hereafter relates to a three-axis controlled milling machine, but it will readily be appreciated that systems in accordance with the invention may be applied to a wide variety of tasks including communication, process control, processing of business data and other control functions such as photo-optical pattern generators and multi-turret machines.

A preferred embodiment disclosing coupling of circuits and devices is provided in the discussions, in the tables of logical equations, and in the figures herein.

In accordance with the basic concepts of a factored electronics system, the numerical control system (FIG. 1) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 12 and the various extremities that communicate with the data processor through this input-output structure.

The data processor 12 is shown by way of this example to be used in conjunction with a core memory 30. The basic architecture of this data processor will permit an integrated circuit memory, such as a read-only memory (ROM), or a random-access memory (RAM) or flip-flop type memory to be substituted for the core memory 30 to provide a completely integrated circuit computer which might be called a monolithic computer. This monolithic data processor can be implemented on a single integrated circuit chip which can include a read only memory, an alterable memory, and program execution circuitry on the same chip.

The architecture of the computer is oriented towards a factored computer system to permit the data processor to operate in close conjunction with the extremities for this factored computer system. The special organization and instruction repertoire aid in implementing this factored computer system.

The control panel operates with the data processor in a mutually interdependent fashion to yield interactive capability for operator functions.

The photoelectric tape reader 16 is an extremity that inputs part programs to define the part to be cut by the milling machine 24. The real-time non-adapted signal form 19B intrinsic to the tape reader 16 includes not only data but tape reader characteristics caused by photo-optical, electro-mechanical, and electrical effects that are inherent to the tape reader, described in the referenced application A Method And Apparatus For Processing The Digital Output Of An Input Means. The data processor accepts these intrinsic signal forms directly from the tape reader and derives the required data from the ambiguity and errors present in this intrinsic signal form.

The milling machine 24 is an extremity of the system which can be implemented as an elemental extremity in conjunction with the data processor. Direct control of the various machine functions, such as storing the tool positions, compensating for tool characteristics, and controlling a turret motor for tool selection reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 20, 21, and 22 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole-number square-wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer functions of controlling, performing mathematical operations, and storing data into a physically distributed, operatively dispersed system providing concurrent internal control of coaction with associated extremities.

The substantially direct communication between the computer and the extremities permits the reduction or elimination of interface logic and interface controllers required in prior art systems.

Specific data processor features include an adaptive memory control power interrupt technique preventing detrimental system operation and a memory protect technique creating inalterable fields in an electrically alterable memory. Functional modifiers permit shortened program instructions without sacrifice of program capability or flexibility.

One technical area in which systems in accordance with the invention have particular advantage is in the control of multi-axis machine tools and the control of photo-optical plotters to provide output products. Other areas of particular advantage include the processing of communications and business data, for instance, payroll processing and inventory control. In all of these applications the system can receive rudimentary data in real-time intrinsic signal form from an elemental extremity such as an axis servo, process the non-adapted intrinsic signals, and provide data to the system. The system in turn commands an output device in a signal form which may be readily usable by or intrinsic to the output device, such as a servo system. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign, but primarily involves changes in the data processor program.

A general-purpose data processor in accordance with this invention may include multiple data and program registers, a random access memory and a scratch pad memory, and non-buffered, directly coupled input-output lines connected to elemental input-output devices. These elements perform basic or prime functions and are physically distributed at different locations in the system, with operative dispersion making them functionally available throughout the system. This system comprises a numerical control machine, e.g., for three axis controlled milling machine, and closely integrates the operator and other input and output functions into the numerical control tasks. Minimal structure input-output extremities in this particular example comprise an elemental tape reader 16 and operator panels 14 and 18, servos 20, 21, and 22 for independent tool axis control and a passive data display 18. The data processor in real time concurrently monitors these extremities, preprocesses the external manifestations into machine-adaptable or intrinsic data, and generates extremity intrinsic or extremity-adapted extrinsic commands. The system concurrently operates under program control to perform the other aspects of the task, including carrying out complex computations for tool path control, generating servo commands for each of the controlled axes, sequencing through the program, providing other machine controls and generating graphical and printed output data if needed.

Part program inputs are provided by a photoelectric punched tape reader having Model No. RRS0304RA, manufactured by Remex Electronics. The manual for this tape reader is TRM-902U and is incorporated herein by reference.

Data and program storage is provided by a core memory 30 which may be a commercially available memory having Part No. 909838-A01, manufactured by Electronic Memories, Inc. Electronic Memories Inc. drawings 909811–909819 and 910792 show this memory in detail and are incorporated herein by reference. This is an 8-bit 4096 word core memory which is primarily devoted to program storage. Remaining portions may be used for data storage if desired. In this application, the core memory 30 (CM) may be replaced by a read-only memory (ROM) such as a MOS FET read-only memory sold commercially by General Instruments Corporation of Hicksville, New York or a flip-flop memory.

In a typical, very generalized example of the operation of the system of FIG. 1 for control of a milling machine 24, the data processor 12 accepts part program data from the tape reader 16 and operator inputs from the control panel 14 to commence the computation of servo commands. As the reader 16 and panel 14 are operated, the processor 12 is under program control to monitor the operative states of these devices and preprocesses the rudimentary data itself. Concurrently, and also under program control, the display panel 18 is activated by exciting the passive elements to form desired characters at a flicker-free rate. These time-related monitoring and pre-processing subtask functions concerned with the extremities continue to be carried out as needed as the processor 12 enters into its computational and processing functions concerned with its main task, that of executing the part program in real time. Thereafter, command data is translated into servo commands for the individual servos 20, 21, and 22, in intrinsic servo signal form. Feedback signals in the intrinsic servo format are likewise returned to the processor 12, pre-processed for conversion into the processor base language and utilized in further computations.

Programming of computers is a well-known art and is described in detail in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference. The programs to provide data processor operations described hereinafter will be obvious to those skilled in the programming art from the descriptions of these desired operations. Further, coding of programs for use with the particular computer described herein will be obvious to those skilled in the programming art from the description of computer instructions provided hereinafter.

There are profound differences between systems thus arranged and operated and systems of the prior art. In the physical and operational sense, the data processor 12 is a much greater portion of the whole, and the associated units 14, 16, 18, 20, 21 and 22 are extremities of the processor 12. These extremities, which may not be independent in terms of control, are largely directly coupled to the processor 12. Each elemental extremity has certain characteristic relationships to the system, although other differences necessarily exist. Each relies essentially upon the operatively dispersed program capabilities of the processor 12. Each further effectively relies upon the processor 12 for pre-processing of the non-adapted signal forms for interpretation of signals and meaningful time-related data transfer. In this respect, digital buffering, conversion, and signal conditioning functions ordinarily provided by interface logic circuits are also avoided. Furthermore, the processor 12 itself need not be tailored in configuration to cooperate with predetermined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 12 can be distributed throughout the preponderance of the task-performing system. Yet, by virtue of the operational dispersion of the system and other prime functions, this task-performing system may readily be modified, with a minimum of hardware changes to perform another task. Such change entails the essential modification of the system program, and also modification of the subtask programs and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general-purpose computational capability of the system hereafter described can generally be utilized to perform many functions such as contouring functions.

The data processor 12 is organized to operate in a manner somewhat similar to presently known stored program digital computers. The fundamental theory and technology of such presently known systems are described in Chapter 11 of *Digital Computer Design Fundamentals* Yaohan Chu, McGraw-Hill Book Co., Inc. (New York, 1962) incorporated herein by reference.

The data processor 12 is organized to process 8-bit words with most working and storage registers having a 16-bit capacity permitting the storage of two words. Serial transfer of data is used throughout the data processor 12 to minimize the logic and interconnections required.

The data processor 12 includes a 12-bit memory address register (M Register) which defines a memory location being accessed in the main memory 30. A memory data register (D-Register) defines an operand location such as in the scratch pad memory and input/output (I/0) channels. Thirty-two Scratch Pad Memory (SPM) Registers provide convenient intermediate storage, independent of the main memory. A three-bit counter divides the execution of program instructions into word times and a four-bit counter subdivides the word times into bit times, the basic operating intervals.

The data processor operates by executing programmed instructions received from the main memory. When an instruction is received control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation, the data processor recycles through the matrix including flow diagram paths LIQ and P89; or LIQ, P89, and Y7 or LIQ, FAJ, FAL, FAM, FAN, and FAO; or LIQ, P89, Y7, FAK, FAL, FAM, FAN, and FAO as shown in FIG. 5B to begin execution of the next instruction.

The following description of the system, as will be evident to those skilled in the art, comprises a complete definition of a preferred embodiment in accordance with the invention. In order to simplify the description and drawings, extensive use has been made of logical equations, which per se are definitive of detailed circuit elements and interconnections for a specific system, in accordance with modern integrated circuit techniques and is well known to those skilled in the art. In order to simplify the description, extensive and orderly reference is made to principal micro operations, both in the form of the states of major subsystems at particular points in time during these micro operations as well as in the form of the sequences and purposes of each micro operation. The totality of these principal micro operations completely define the operation of this processor system.

It will also be recognized by those skilled in the art that the description of details of structure and operation of a general-purpose computer system is of necessity extended and complex. For convenience and ease of understanding the following description commences with those units most apparent to and used by an operator.

Control Panel and Display Panel

A control system for an electronic data processing system minimizes hardwiring and specialized components and circuits and provides bidirectional communication between a data processor within the data processing system and an operator via intermediary binary digital input an output words. A separate aspect is the provision of a master control panel configuration including means for receiving input and output elements having generalized identities, in conjunction with encoder and decoder means interposed in the circuitry and reducing the interconnections between the panel and the data processing system. The control system converts the status of selector switches and momentary switches to signals representing an intermediary input word. The data processor processes and interprets the signals representing the input word and generates appropriate system responses. The data processor also generates and processes intermediary output words having a selected format for controlling lamp displays and segmented elements generating numeric displays. Consequently, the panel and system have relatively few interconnections but the use of generalized terms permits input positions and output displays to have varying and selectable meanings, as determined by the data processing system itself. The interactive control system includes decoders and drivers which illuminate displays in response to the output words. Circuitry is reduced by using a single numeric display register to control illumination of several numeric displays by sequentially illuminating the numeric displays at a flicker-free rate. Each numeric display is excited at a rate of 30 cycles per second, requiring the contents of the numeric display register to be changed at a cyclic rate of 240 cycles per second.

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on processor coaction for performance of the task of interactive communication with an operator. The data processor operates under the control of a selected stored program to interpret input words and produce an appropriate system response, and provide output words having an appropriate format.

An elemental panel for use in systems of the type disclosed herein are processor dependent structures having means for receiving panel elements and having circuit conductors for coupling elements, and having electronic means in the conductive paths for signal processing. By this arrangement, uncommitted elements can be added or changed and the significance of given panel positions can be determined at processor option under program control without being previously committed through wired operation. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is then sampled and interpreted by the data processor.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted.

The numeric display elements may be segmented tubes, Nixie tubes, or similar devices displaying a selected character. A single numeric character display register is used to control all of the numeric displays. Output words are transferred to the numeric display register at a rapid periodic rate. One portion of these words contains a tube (element) select code identifying a particular element and a second part of the word contains a code identifying the character to be displayed. Appropriate decoding logic responsive to the numeric display register causes the appropriate segment drivers of the selected numeric display tube to be activated to display the output character. Each numeric display is then driven in turn to display a selected character. In order to refresh the numeric display at a flicker-free rate of 30 times per second, the processor places a new word in the numeric register at a cyclic rate of 30 times the number of numeric word displays desired each second. Assuming 8 numeric displays, the rate would be 240 times per second and would consume only a small part of the operating time of a modern high speed data processor.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays and by changing associated captions in the interactive control system. Corresponding changes in data processor responses are accomplished by making appropriate changes in the stored program This invention provides an interactive control system establishing bidirectional communication between an operator and a data processing system. All control and data information passing between an operator and the system passes through an electronic data processor via the medium of intermediary binary digital words.

As shown in FIGS. 1 and 2C an electronic data processing system 10 includes an electronic data processor 12 and an interactive control system 780. In general, the electronic data processing system may be any such system but the full advantages of this invention are best realized when used in conjunction with a system which has been committed or dedicated to a specific task or family or tasks, such as numerical control, payroll, accounting, or inventory control. It will be assumed herein, however, that the electronic data processing system 10 is committed to the task of numerical control of a milling machine.

The interactive control system 780 (FIG. 2C) includes a control panel 13 as well as gates 624 and latches 620 which are physically located on available space of a printed circuit board within the electronic data processor 12 but functionally operate as part of the interactive control system 780.

Figure 2B:
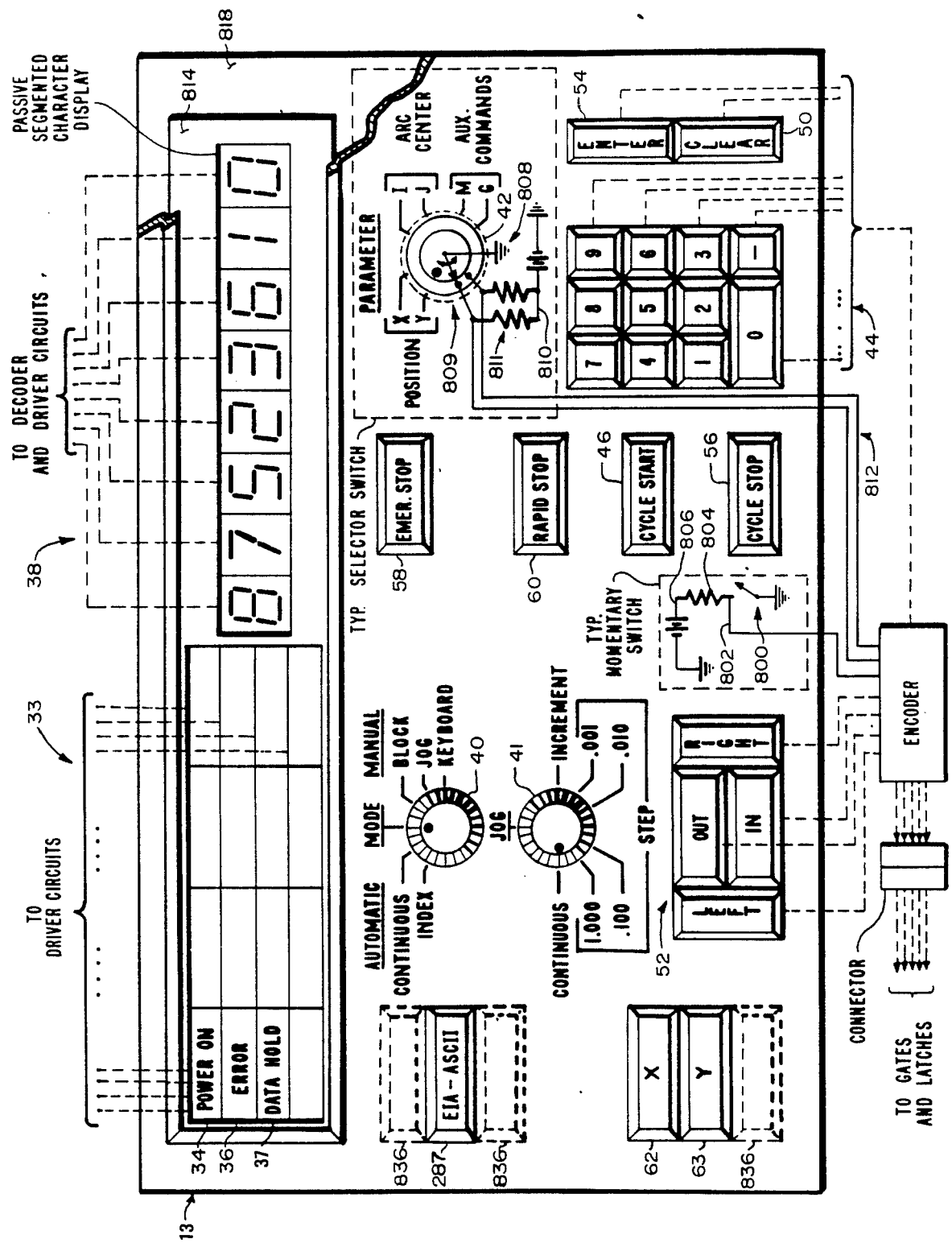

As shown in FIG. 2B a master panel board 818 supports components and circuits, including a display portion 118 of the control system. The panel board 818 may be a printed circuit board having conventional spaced apart apertures or receptacles 36 (FIG. 2B) on the front side into which selector switches and momentary switches may be inserted. Printed circuit wiring to each of the element positions and a minimal amount of electronic circuitry is mounted on the back of the panel board 818 to facilitate error free communication with the data processor. By placing this circuitry in close proximity to the switches and displays, signal lines are held to a minimum length, thereby minimizing costs and errors.

The elemental nature of system subsystems and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

This control panel provides a means for interactivity between the data processor and an operator. Included in this interactivity is a unique feature which permits the data processor to "lead the operator by the hand" through various operations and procedures the operator must perform for proper machine operation.

For this purpose, an operator's manual may be used in conjunction with the numeric displays on the control panel and a special program in the data processor. The operator's manual is divided into several sections, each pertaining to a particular mode of machine operation. The parameter switch would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

As illustrated in FIG. 2, the control panel 14 and the display panel 18 are mounted in a single rectangular plane with the display panel 18 occupying the upper portion of the plane and the control panel 14 occupying the lower portion of the plane. The lefthand portion of the display panel 18 is occupied by status indicator lamp displays 33 such as the Cycle On indicator lamp 34 and an error indicator lamp 35. These lamp displays provide feedback to the operator by indicating system modes and conditions. All status indicator lamp displays 33 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 33 are a bank of troubleshooting lamps such as an error indication lamp 35, which are normally obscured behind the filter, but become flashing displays if a malfunction or error should occur. The righthand portion of the display panel 18 is composed of eight numeric displays 38 which may be used to identify the magnitude of system parameters.

Display Panel

As described more fully in copending application "Interactive Control System", Ser. No. 101,449, filed Dec. 28, 1970 by Lee et al, and incorporated herein by reference, each lamp display 33 is driven by a well known lamp driver circuit which is controlled by one bit in a lamp display register. The lamp display register stores an intermediary output word output from the data processor 12 which defines the status of the lamp displays 33. In contrast, the numeric displays 38 are driven sequentially in accordance with an intermediary output word stored in a numeric display register.

The display system may be considered to have physical distribution, operative dispersion, and operates with intrinsic signal forms in accordance with the invention. The operative dispersion of the system permits the elemental processor dependent display panel to operate in conjunction with other elements performing prime functions to accomplish a subtask, the communication of information with an operator.

Each numeric display lamp 38 is excited at a 30 cycle per secondflicker free rate under program control in accordance with information contained within a numeric display register. Since the numeric display register controls the excitation of all eight numeric display tubes 38, its content must change at a cyclic rate of $8 \times 30 = 240$ times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The data processor also generates preprocessed intermediary output words having selected formats and transfers them from the A-Register to a numeric display register 798 and a lamp display register 700 through I/O Channel-5 702 and I/O Channel-6 704, respectively.

These channels provide bidirectional communication of intermediary output words with the A-Register, permitting previously output words to be returned to the A-Register to check for errors occurring during transmission. The interpretation and processing of intermediary words takes place within the data processor.

The displays include both lamp displays 33 and numeric displays 38. As shown in FIG. 2B both the lamp displays 33 and the numeric displays 38 are mounted on the display subpanel board 814 which is in turn mounted on the mother panel board 818. The lamp displays may be conventional bayonet type lamps and the display subpanel board 18 contains a batch fabricated block of lamp sockets which receive the lamps. These lamp sockets provide the multiple functions of mounting, electrical connection and heat sink. Each lamp may be selectively connected to ground either directly or through a flasher bus. The lamp displays are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements are conventional 9 segment displays capable of displaying all numerical characters and some alphabetic characters. However, the interactive control system has sufficient data capacity to accommodate 13 segment tubes capable of displaying all numeric and alphabetic characters if desired. The eight numeric display elements of this embodiment are mounted horizontally on the display subpanel board 818.

Coupled to the lamp displays 33 are lamp drivers 710 which are coupled to the lamp display register 700. With the exception of a few lamp drivers 710 which are hardwired to respond to special functions such as over temperature, P/S error, Power on and input hold, each lamp driver responds to a selected bit of an intermediary binary digital output word stored in the lamp display register 700.

As shown in greater detail in FIG. 2D, the implementation of the 8 numeric display elements 38 is considerably more complex than that used for the lamp displays. Because each numeric display element 1008 requires multibit control signals a cyclic technique is used to drive all eight numeric display elements 1008 from a single numeric display register 798, thereby greatly reducing the amount of circuitry required. To accomplish this the eight numeric display elements are sequentially excited at a flicker-free 30 cps rate. In order to excite each numeric display element 1008 at a rate of 30 cps the contents of the numeric display register must change at a cyclic rate of 240 cps.

The numeric display functions are performed in the data processor 12 under program control and include the numeric display counter 718, the update control, the refresh control, and the data registers. These functions are not physically identifiable, but are implemented under program control of the data processor. The display parameter is converted from a binary to a BCD code, then modified for the special segment code requirements of the numeric display tube. The tube identification code is packed into the word, which is output to the numeric display register in the interactive control system.

In order to excite one of the numeric display elements 1008 the data processor 12 utilizes the count of the numeric display counter 718 implemented under program control, for example, binary 3 indicating that the third numeric display element 1014 is to be excited, to access a location in the memory 30 storing information to excite the third numeric display with the proper character. This information is transferred from the memory 30 to a least significant portion of the A-Register 108 where it is joined by the binary count from the numeric display counter parameter (3) stored in memory in the most significant portion to form the intermediary digital output word.

This output word is transferred from the A-Register 108 through I/O Channel-5 702 to the numeric display register 798. As the word is output the numeric display counter is incremented so that the fourth numeric display element will be excited next. In addition to providing intermediary output words to the numeric display register at a rate of 240 cps, the data processor also updates the locations in the memory 30 which store the information determining the character to be displayed by each numeric display element. This updating occurs at a cyclic rate of 16 cps or twice per second for each memory location. This is about as fast as the eye of the operator can follow changes in the characters displayed by the numeric display elements 1008.

The contents of the three numeric display select bits in the most significant portion of the numeric display register 798 are communicated by three pairs of lines, each pair representing the Q and $\overline{Q}$ outputs from a flip-flop, to a decoder 716. The decoder activates one of eight select drivers 719, the third select driver in this instance. Simultaneously, nine segment drivers 721 are selectively excited according to the character information stored in the least significant portion of the word in the numeric display register 798, each driver being responsive to a different bit. In some circumstances, it may be desirable to convert the character information to a binary code, thereby reducing the number of bits required to define a character, but necessitating the use of a decoder between the numeric display register 798 and the segment drivers 721. However, such a coded technique is not used in this application.

The segment drivers 721 present drive signals forming the stored character to the appropriate segments of all eight numeric display elements 1008. However, only the third numeric display element 1014, which receives a select signal from the select drivers 719, displays the selected character.

Control Panel

The control panel, which is also described in copending application Interactive Control System, Ser. No. 101,449, filed Dec. 28, 1970 by Lee et al, has three selector switches and a plurality of momentary switches as shown in FIG. 2. The three selector switches, a Mode switch 40, a Jog switch 41 and a Parameter switch 42, are multiple position rotary switches. The Mode selector switch 40 defines one of the six operating modes of the system, the Jog switch 41 defines the machine displacement for each jog command executed when in the jog mode, and the Parameter switch 42 defines the parameter to be displayed on the numeric displays 38 and, when in the keyboard mode, defines the address of the parameter to be entered through the keyboard. The remaining switches are momentary switches which maintain contact only so long as they are held down.

The Mode selector switch 40 defines the major operating conditions of the system which are: (1) Search, (2) Index, (3) Continuous, (4) Block, (5) Jog, and (6) Keyboard. The Search position of the Mode selector switch permits an operator to identify a desired part program block of commands from a punched tape or from a self-contained parts program memory such as the core memory 30, and then initiate an automatic search for that block of commands. A sequence number, which is used to identify the selected block of commands, is entered through a keyboard 44 made up of momentary switches. The number which is entered through the keyboard 44 is displayed on the numeric displays 38 to permit the operator to verify the number which has been entered.

The numerical control system 10 uses a zero synchronization or index point with respect to which all positions of the machine tool are defined. The Index position of the Mode selector switch 40 causes the machine tool to return to the previously defined index point. When in the index mode, depression of the Cycle Start switch 46 will cause the numerical control system 10 to drive the machine tool precisely to the index point.

The Continuous position of the Mode selector switch 40 is used only after system initialization and initial work piece setup. Depression of the Cycle Start button 46 while in the Continuous mode initiates fully automatic operation as commanded by the part program from the tape reader 16 or other source of part programs.

The Block position of the Mode selector switch 40 permits an operator to control the numerical control system 10 in a semi-automatic mode for operations such as part program checkout. In this mode, the system will access a single block of commands from a part program, execute those commands, and then enter the Cycle Stop condition. When in this mode, a part program can be executed one block at a time by refraining from depressing the Cycle Start switch 46 until subsequent to the completion of execution of the previous block of commands.

The keyboard position of the Mode selector switch 40 permits operator control of the system in a semi-automatic mode. A block of part program commands can be entered through the keyboard 44, and then executed when the Cycle Start switch 46 is depressed. When commands are loaded through the keyboard 44, the parameters will automatically appear on the numeric displays 38. Data input errors can be easily corrected by depressing a Clear switch 50 and reentering the parameter through the Keyboard 44.

The Jog position of the Mode selector switch 40 permits an operator to reposition the machine tool in a semi-automatic manner for operations such as initial work piece setup or index definition. The Jog selector switch 41 and the Jog Direction switches 52 may be used by the operator to conveniently reposition the machine tool. With these basic controls, the machine can be positioned precisely to within the resolution of a system (0.0005 inch) with a minimum of effort, fixtures, readouts, and optics. The numerical control system 10 executes precision positioning commands in accordance with the distances and directions selected without burdening the operator with tedious measuring functions. In addition, the numeric displays 38 will show the machine position for positive verification while in this mode.

The Jog selector switch 41 becomes operative only when the Mode selector switch 40 is in the Jog position, and defines the machine displacement for each jog command executed. The selectable positions are: (1) Continuous, (2) 1.0000 inch step, (3) 0.1000 inch step, (4) 0.0100 inch step, (5) 0.0010 inch step, (6) Increment.

The Continuous position of the Jog selector switch 41 will cause the system to drive continuously in a direction commanded by one of four Jog Direction switches 52. These direction switches 52 cause the machine tool to move left, right, in, or out depending upon which one of the four switches is depressed. While in the Continuous Jog position, the machine tool is driven continuously in the commanded direction for the duration of time that a Jog Direction switch is maintained in a depressed state. Electronic detents are implemented causing the machine to decelerate and accelerate subsequent to each one inch of translation of the machine tool. This action graphically defines and permits the operator to observe the magnitude of motion for convenient operation. In addition, continuous jogging will always terminate a precise number of inches from the starting point for accurate control of displacement.

The four step positions of the Jog selector switch 41 cause the system to drive the machine tool a precise step distance selected each time Jog Direction switch is depressed.

The Increment position of the Jog selector switch 41 causes the system to drive the machine tool a single precise least significant increment of distance each time a Jog Direction switch 52 is depressed, 0.0005 inch in this embodiment of the invention. When in the Step or Increment positions, regardless of whether the Jog direction switch is maintained in a depressed state for an instant or continuously, the machine will still execute only the single commanded step and then halt. Additional motion can only be initiated by releasing and again depressing a Jog Direction switch 52. This eliminates the need for rapid operator response, since the precise step commanded will be executed independent of the duration of time that a direction switch 52 is depressed.

The position of the Parameter selector switch 42 defines the parameter to be displayed on the numeric displays 38 and, when the Mode selector switch 40 is in the Keyboard position, the block of commands being entered through the keyboard 44 is displayed. The selectable parameters for this numerical control system 10 are: (1) Sequence No. —N, (2) Absolute Position —X, (3) Absolute Position —Y, (4) Arc Center —I, (5) Arc Center —J, (6) Auxiliary Command —M, (7) Auxiliary Command —G.

The Sequence Number position causes the numeric displays 38 to show the address of a block of punched tape commands being read from the punched tape while in the Continuous or Block mode. The Sequence Number position of the Parameter selector switch 42 also causes the numeric displays 38 to show the sequence number being entered through the keyboard 44 while the Mode selector switch is in the Keyboard position. This is done prior to initiating a tape search in the Search mode.

The Absolute Position location of the Parameter selector switch 42 causes the numeric displays 38 to monitor the position of the machine tool relative to the floating zero or index point. When the Mode selector switch 40 is in the Keyboard location and the Parameter selector switch 42 is in one of the Position locations, the system enters and the numeric displays 38 show the position commanded by the operator to be entered through the keyboard 44. For instance, suppose the operator wishes to position the machine tool at an X coordinate of 05.6000. To do this, he turns the Mode selector switch 40 to the Keyboard position and the Parameter selector switch 42 to the Absolute Position X, and then enters the numbers 05.6000 through the keyboard 44. At this point, the numeric displays 38 are showing the number 05.6000 and the system is ready to move the machine tool to this X position when the Mode selector switch 40 is in the Keyboard location and the Cycle Start button 46 is depressed.

In similar manner the Arc Center and Auxiliary Command locations of the Parameter selector switch 42 are used in the Keyboard mode to enter the commands from the keyboard.

There are several momentary switches in addition to the Keyboard switches 44, Cycle Start switch 46, Jog Direction switches 52 and Clear switch 50 whose functions have previously been described. All of the momentary switches are hermetically sealed reed relay switches. A latching interlock is provided, making the system insensitive to dynamic switch conditions such as switch bounce. In addition, operation is independent of operator action such as the duration of switch depression and additional switch commands which might result in ambiguities are automatically locked out as long as one of the momentary switches remains depressed.

For operator convenience the momentary switches are grouped into functional arrays, for example, the Keyboard switches 44 and the Jog Direction switches 52.

The keyboard 44 is composed of ten numeric keys defined as 0 through 9 and a negative sign key. The zero key can be used for the plus sign when required. The numeric and sign keys of the keyboard 44 are used to enter data in the Keyboard mode and a Clear key 50 adjacent to the keyboard 44 blanks the numeric displays 38 prior to the entering of the data. An Enter key 54 causes a parameter to be accepted by the numeric control system 10 after it has been entered through the keyboard 44 and verified by the operator's observation of the numeric display 38. In the Keyboard mode the various parameters can be varied or entered as required. Parameter verification is achieved by rotating the parameter selector switch 42 to the respective position and monitoring the numeric display 38. Parameter modification is accomplished by depressing the Clear key 50, resulting in a presentation on the numeric display 38 of the newly keyed numbers. The entered parameter will automatically be accepted by the computer for processing and for display under program control.

The Cycle Start switch 46 and the Cycle Stop switch 56 are used to initiate or terminate automatic operation, respectively When in the cycle off condition, as identified by the Cycle Off status indicator lamp 36, the operator can initiate automatic operation by depressing the Cycle Start switch 46. The system will automatically execute commands until detecting a condition that defines cycle stop which is:

(1) In the Search mode, detecting the required tape location.

(2) In the Index mode, repositioning the machine to the floating zero point.

(3) In the Continuous mode, completing the execution of a block of tape commands in response to appropriate G or M commands contained therein, or if the operator has depressed the Cycle stop switch 56.

(4) In the Block mode, completing the execution of a single block of tape commands.

(5) In the Jog mode, completing execution of the jog command.

(6) In the Keyboard mode, completing execution of a single block of keyboard commands.

When in the Continuous mode with the cycle on condition as identified by the Cycle On status indicator lamp, the operator can discontinue automatic operation by depressing the Cycle Stop switch 56. The system will complete the execution of the block of commands in process and then enter the cycle off condition as identified by the Cycle Off lamp.

When the system is in a mode other than the continuous mode with the cycle on condition, it is not necessary for the operator to depress the Cycle Stop switch to discontinue automatic operation, because all modes other than the Continuous mode execute a single set of commands and then automatically enter the cycle off condition. An Emergency Stop switch 58 is used to discontinue automatic operation rapidly and to force the system into a reinitialization condition. It will then be necessary to perform the system initialization sequence prior to operating the system. The system initialization sequence involves:

(1) position the Mode selector switch 40 to the Jog position.

(2) jog the machine tool to the index position.

(3) position the Mode selector switch 40 to the Index location.

(4) depress the Cycle Start switch 46 to load the index position of the machine tool.

(5) if required, load the punched tape in the tape reader.

The Jog Direction switches 52 are used by the operator to define the direction of motion and to initiate this motion, but only if the system is in the Jog mode. In addition, the position of the Jog selector switch 41 will define the type of motion, i.e. Continuous, Step, or Increment. The jog directions of (1) Right, (2) Left, (3) In, and (4) Out, are defined by facing the machine from the control panel side.

The rapid stop switch 60 causes all machine motion to stop immediately, but permits operation to be resumed with the Cycle Start switch.

A pair of Mirror Image switches 62, 63 are used to selectively reverse the commanded directions of motion. Alternate depression of the X or Y mirror image switches 62, 63, respectively, will cause the mirror image status indicator lamps contained in the bank of lamp displays 33 to change state from +X or +Y to −X or −Y and conversely. The operational condition presented on the mirror image status indicator lamps defines to the operator system conditions.

Three multi-position selector switches, a mode selector switch 40, a jog selector switch 41 and a parameter selector switch 42 provide primarily control type functions. Because hardwiring of switch controls is avoided by having intermediary output words communicated to and interpreted by the data processor, the number of selector switches as well as the number of contacts on each selector switch can be easily varied to meet the requirements of a specific application. In this embodiment the interactive control system can accommodate a maximum of 4 selector switches, each having 15 positions. However, even the 7 switch positions on the mode selector switch 40 and the Jog selector switch 41 and the 15 switch positions on the parameter selector switch 42 are not fully used in this application.

The selector switches are implemented by grounding the wiper arm 808 and connecting each switch contact 809 to a positive voltage 810 through a resistor 811 (FIG. 2B). This arrangement causes the signals from the contact outputs 809 to represent the inverse of the selector switch position, a condition particularly suitable to modern integrated circuit logic gates.

As shown generally in FIG. 2C the 7 signals from the contacts of the mode selector switch 40 and the 7 signals from the contacts of the jog selector switch 41 are each converted by encoders 726 and 728 respectively, into 3-bit binary coded signals. Similarly, the 15 signals from the contacts of the parameter selector switch 42 are converted by an encoder 730 to 4-bit binary coded signals. These encoded signals are connected to Scan-out and I/O Channel-0 562 which converts the parallel signals to a serial intermediary binary digital word as they are shifted into the A-Register 108 of the data processor 12.

Although each of the decoders 726, 778, and 730 can accommodate one more input signal, the binary coded output represented by all zeros is not implemented to permit the data processor to detect a switching error. If the wiper arm of a selector switch 40, 41, or 42 is between contacts or fails to make proper contact with a contact the associated encoder 726, 728 or 730 provides an all zero output. The data processor 12 interprets an all zero output as an error condition and causes an "error" display lamp to be illuminated after a short delay to allow for normal switching time.

Referring now to FIG. 2B, 24 momentary switches typified by switches 62 are shown mounted on the panel board 818. As with the selector switches, the number of momentary switches can be easily varied to meet the requirements of a specific application. The circuitry of the present embodiment can accommodate up to 31 momentary switches with locations for possible additional switches represented by dotted outlines 836.

Reed switches which are mounted in apertures in the panel board 818 are used exclusively in the preferred embodiment for the momentary switches to insure the highest level of reliability, versatility and cost effectiveness, but other well known switches may also be used. As with the selector switches, the momentary switches are implemented by grounding the wiper contacts 800 and connecting the stationary contacts through a pull down resistor 804 to a positive voltage 806.

Figure 15A:
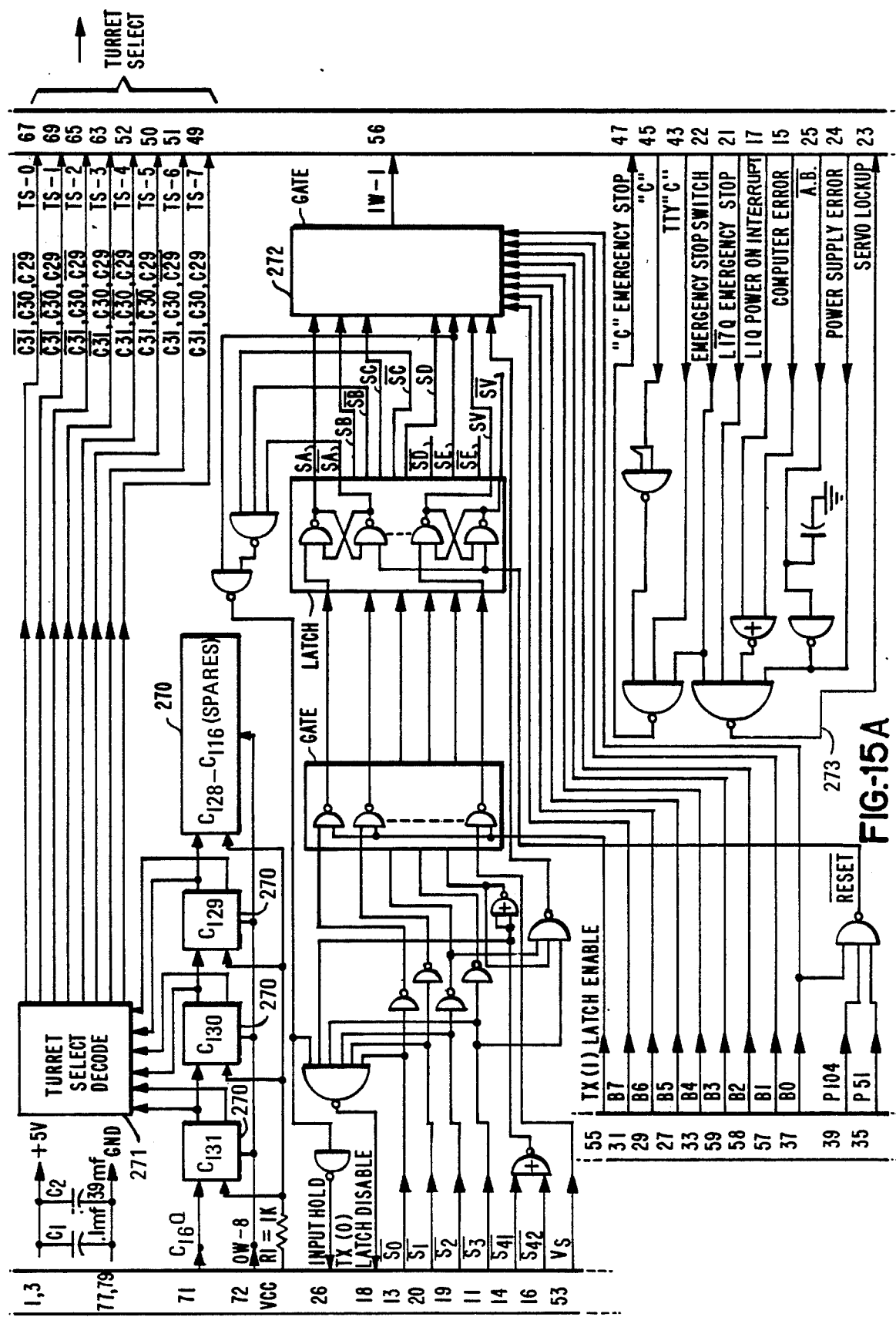
FIG. 15A is a schematic and block diagram representation of the data processor IFA-3 logic and FIG. 15B is a schematic representation of switch debounce logic included in the IFA-3 logic, where
Figure 15B:
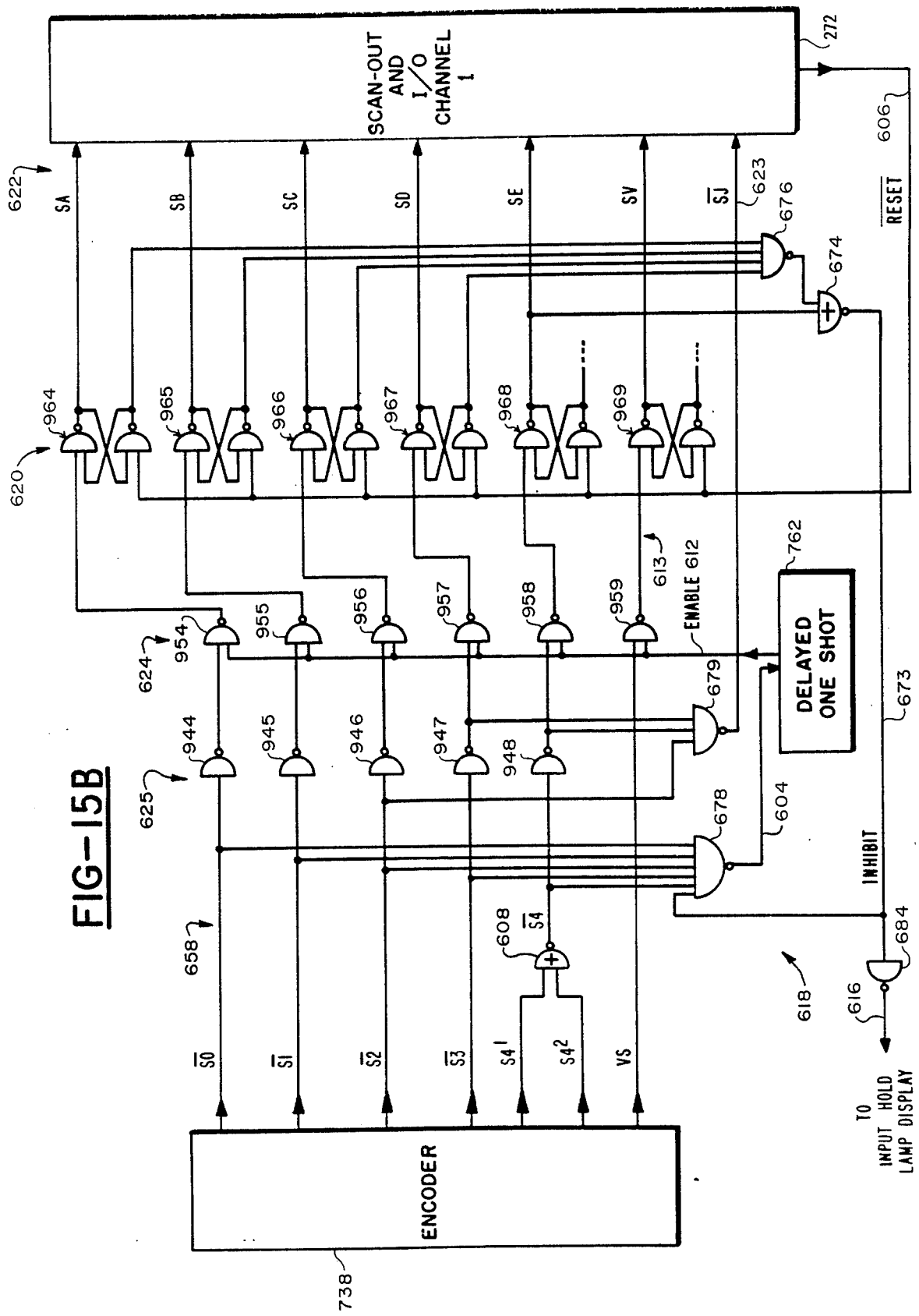

As shown in FIGS. 2C and 15B, the 31 unitary outputs are converted by an encoder 738 to a 5-bit binary coded signal, thereby reducing the number of transfer lines to minimize interconnections and circuitry. The five binary signals are $\overline{S_0}$ through $\overline{S_4}$ with two partial signals $S_4'$ and $S_4^2$ being NORed together to form the total $S_4$ signal. In addition, a sixth signal $V_s$ performs a verify function by indicating depression of either a rapid stop switch 60 or an emergency stop switch 58 (FIG. 2B). The signals $\overline{S_0}$ through $\overline{S_4}$ are connected through inverting logic gates 944–948 to logic gates 954–958 respectively. The signal $V_s$ is connected directly to logic gate 959. The logic gates 954–959 pass the signals $S_0$–$S_4$ and $V_s$ on to latches 964–969 respectively only when an enable signal is received from a delayed one shot 762.

The latches 620 permit the data processor to sample the intermediary binary digital output word represented by the latch outputs at a rate of 10 times each second. This rate is sufficiently high to avoid inconvenience to an operator who may not depress a subsequent momentary switch until the output from a previously depressed momentary switch has been sampled by the data processor which resets the latches 620 with reset signal upon completion of the sampling operation.

A system of lockouts and lockout overrides is used to minimize errors while still permitting the interactive control system to accomplish all necessary functions. An inhibit signal 673 is produced by logic gates 674 and 676 which are connected to latches 620 and produce an inhibit signal 673 whenever any of the latches are set. The latch 969 which latches the $V_s$ stop verify operates independent of the inhibit signal. The inhibit signal is connected to a NAND gate 678 which provides a trigger signal to the delayed one shot 762 as an output. The gate 678 is also connected to binary signals $\overline{S_0}$–$\overline{S_4}$ and produces a trigger signal only when a signal is produced on at least one of the binary outputs $\overline{S_0}$–$\overline{S_4}$ subsequent to a condition in which there is no inhibit signal and no signal on any of the binary outputs $\overline{S_0}$–$\overline{S_4}$. In other words, the output of a subsequent momentary switch cannot be gated and latched until the latches 964–968 have been reset and all previously depressed momentary switches have been released.

The delayed one shot 762 produces a 3 $\mu$S pulse following a 10 ms delay. The 10 ms delay permits transient switching conditions such as switch bounce inherent in all momentary switches to subside before the binary outputs $S_0$–$S_4$ and $V_s$ are gated to the latches. Thus, the lockout arrangement not only prevents errors created by the depression of more than one momentary switch but also prevents errors due to transient switching conditions.

A special signal is provided by NAND gate 679 which produces a signal on output $\overline{S_J}$ whenever the condition $S_4 \cdot S_3 \cdot \overline{S_2}$ exists. The signal $\overline{S_J}$ forms a part of the intermediary binary digital output word but bypasses the gates 954–959 and latches 964–969. The signal $\overline{S_J}$ indicates depression of one of the jog direction switches, left, right, in or out. This permits the data processor to identify if a jog direction switch is maintained in the depressed state for the jog continuous condition.

The inhibit signal 673 inverted by a NAND gate 684 to provide a data hold signal 616. This data hold signal controls a data hold lamp display 220 (FIG. 22) which becomes illuminated to indicate a set condition of one of the latches 964–968. As long as the input hold lamp display is illuminated the operator knows he should not depress another momentary switch. The binary codes for the momentary switches are presented in the following table.

| $V_s$ | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |

-continued

| Vs | S4 | S3 | S2 | S1 | S0 | |
|----|----|----|----|----|----|---|
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Referring now to FIG. 2C, the binary coded outputs from the three selector switches 40, 41, and 42 are combined to form a single intermediary binary digital input word which is shifted into the A-Register 108 of the data processor through Scanout and I/O Channel-0 562. Similarly, the outputs from the momentary switches are used to form an intermediary binary digital output word which is shifted into the A-Register through Scanout and I/O Channel-1 672.

Once an intermediary input word is within the A-Register it is manipulated and interpreted by an arithmetic and control unit 794 operating under control of program instructions stored in a memory 30. After an input word has been interpreted, the data processor generates appropriate system responses.

The control switches of the control panel are not hard wired directly into the control panel lamps and other functions. Instead, the central data processor periodically samples the status of the various switches under program control. The data processor then further acts under program control to operate the various entities of the system in accordance with the status of the control switches. Because the switches are sampled in this way as opposed to being hard wired, the basic numerical control system 10 can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the central processor 12. The six positions of the Mode selector switch are encoded into three binary bits as follows:

| M2 | M1 | M0 | |
|----|----|----|---|
| 0 | 0 | 0 | Spare |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |

-continued

| M2 | M1 | M0 | |
|----|----|----|---|
| 1 | 1 | 0 | Index |
| 1 | 1 | 1 | Spare |

Similarly, the six locations of the Jog selector switch 41 are encoded as follows:

| J2 | J1 | J0 | |
|----|----|----|---|
| 0 | 0 | 0 | Spare |
| 0 | 0 | 1 | Continuous |
| 0 | 1 | 0 | 1.000 inch |
| 0 | 1 | 1 | 0.100 inch |
| 1 | 0 | 0 | 0.010 inch |
| 1 | 0 | 1 | 0.001 inch |
| 1 | 1 | 0 | Increment |
| 1 | 1 | 1 | Spare |

The seven positions of the Parameter selector switch 42 are encoded into four binary bits as follows:

| P3 | P2 | P1 | P0 | |
|----|----|----|----|---|
| 0 | 0 | 0 | 0 | Spare |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Arc Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3 and S4. These five bits can accommodate up to 31 momentary switches. In addition, a sixth bit, $V_s$ provides a verify function for the stop switches.

Figure 14A:
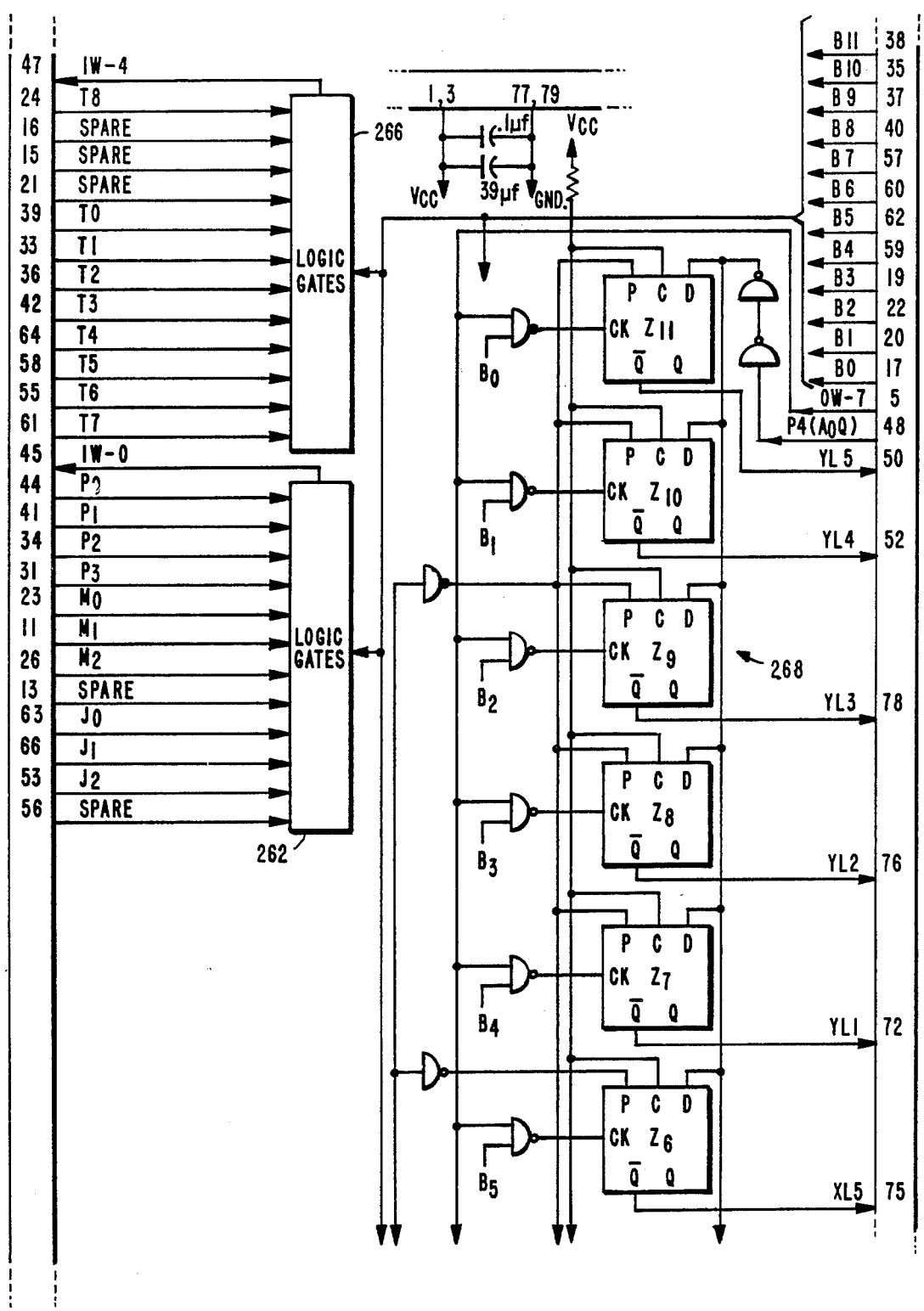
FIGS. 14A and 14B (herein called FIG. 14) illustrate a schematic and block diagram representation of the data processor IFA-2 logic and FIGS. 14C to 14F illustrate a tape reader peripheral, where

The encoded selector switch bits are then combined into a single sixteen bit word having the format of P3, P2, P1, P0, Spare, J2, J1, J0, M2, M1, M0, Spare, and four zero states shown in FIG. 14A with logic gates 262. This word is serially scanned into the central processor 12 with logic gates 262 whenever the selector switches are to be sampled under program control. Similarly, the encoded outputs of the momentary switches make up a separate word which is periodically sampled under program control with logic gates 272 shown in FIG. 15.

Typewriter

Auxiliary I/O channels 28 (FIG. 1) may include a well-known 110 baud auxiliary channel for communication with a typewriter such as a Teletype Corporation Model ASR-33 TELETYPEWRITER. Other peripherals are also compatible with this type of channel including an alpha-numeric CRT, a data link, and a remote large scale computer center. This 110 baud auxiliary channel 28 provides serial data at a rate of approximately 110 bits per second. Eleven bits are required for each word: comprising a start pulse, eight data pulses and two stop pulses. In this invention, the data processor 12 performs the timing, control, sequencing, and buffering operations associated with the signal processing and command signal generation under program control, thereby eliminating the requirement for prior art interface control devices.

For data inputs, a well-known transistor line receiver circuit provides digital integrated circuit signal levels. The data processor 12 periodically samples the input line under program control to detect a start pulse with a Skip-On-Discrete (SD) instruction thru Discrete Input-2 (DI-2) on pin 69 (FIG. 13), which is a Skip On ASR input relating to the Teletype Corporation typewriter Model ASR-33. If a start pulse is not detected, the data processor performs other program operations. If a start pulse is detected, the data processor branches to an input program, performing time delay calculations to determine when to sample each successive input sequential bit. This sample time delay precludes errors due to noise such as switch bounce that occurs at the transition between binary states. The data processor assembles the successive serial bits from this input into a digital word, further processes that word for a parity check and a BCD to binary conversion and stores the data for later use. The data processor treats these input signals as rudimentary signals which have a quasi-digital characteristic rather than as absolute digital signals because these rudimentary signals have non-digital characteristics.

For data outputs, the data processor generates commands by loading a sequence of digital command bits into an interface command flip-flop at approximately that 110 cycle bit rate. The data processor assembles the eight bit data word with a one bit leading start pulse and two bit trailing start pulses in the A-Register 130 (FIG. 6). This word as updated is stored in the data processor for successive output iterations. The data processor fetches this word from storage, then outputs this assembled word to the appropriate auxiliary output channel at a 110 baud rate (approximately 0.009 second intervals), where the appropriate data bit is latched in an interface flip-flop for this period of time inbetween outputs, where this output flip-flop latch excites a well known interface line driver to drive the output device. Two auxiliary output channels will be described for this system, while others will become obvious to those knowledgeable in the art.

The first output channel will be described with reference to FIG. 13. The output word is assembled with the start pulse in the thirteenth bit position of the A-Register ($A_{13}Q$), with the next sequential data bits in descending order in that register. The $C_{f13}$ flip-flop is used as the output flip-flop latch to generate the $C_{f13}Q$ output signal on pin 48 to a line driver and output device. The A-Register word is output under control of the EX-8 input/output instruction, where the A-Register contents are shifted into the $C_I$-Register as AoQ on pin 80, with the EX-8 instruction gated clock provided as OW-8 from gates 252. The most significant bit of that output word is latched up in the $C_{f13}$ flip-flop to provide the $C_{f13}Q$ output signal. Next, the assembled word is loaded into the A-Register and is shifted left to place the next sequential data bit in the thirteenth bit position for the next output iteration, then stored in the data processor for further use.

The second output channel will be described with reference to FIG. 13. The output word is assembled with the start pulse in the least significant position of the A-Register (AoQ), with next sequential data bits in ascending order in that register. An interface flip-flop latch is used to generate the output signal to the line driver and output device, which will be obvious to those knowledgeable in the art. The A-Register least significant bit AoQ on pin 80 is presented to that interface flip-flop, which is then clocked with the DO-1 pulse on pin 71 (which is the ASR Output Set relating to the Teletype Corporation typewriter model ASR-33) generated with a Discrete Output-1, DC-1, instruction. The least significant bit of the A-Register word AoQ is therefore latched up in the interface flip-flop to provide the output signal. The assembled word is loaded into the A-Register and is shifted right to place the next sequential data bit in the least significant position prior to the next output iteration, then stored in the data processor for further use.

The auxiliary I/O channels 28 can accommodate various other I/O devices and various other external devices as will be obvious to those knowledgeable in the art.

Tape Reader

Punched tape readers are used extensively to load programs into digital computers and to program many types of special purpose digital equipment, such as numerical controls for machine tools. In a typical photoelectric punched tape reader, the tape is luminated as it passes by the read head assembly and photosensors on the opposite side of the tape optically detect the holes in the tape. As the tape is moved past the read head assembly, the tape characters are sequentially read into the digital equipment, where each tape character is available in parallel form on a number (e.g. eight) of data lines. A sprocket hole (e.g. mechanical, optical, magnetic) is available on the tape, which is normally used to strobe the tape character into the digital equipment. Thus, data is available from the tape in a bit parallel, character serial form, where the bits pertaining to each tape character are available simultaneously and the tape characters are available sequentially.

Photoelectric tape readers will generate data at rates that range from one thousand to less than one hundred characters per second. These rates are considered high for electromechanical equipment, but represent extremely slow data rates for conventional digital electronic processing systems. Modern digital equipment implemented with high performance integrated circuits can have clock rates exceeding a megacycle, which is a thousand times faster than the highest speed punched tape readers. In addition, high performance computers process digital parameters in parallel form, where the parallel digital parameter may consist of many tape characters. Therefore, it can be seen that communication between the high speed digital equipment and the slower speed electromechanical equipment requires special mechanizations to facilitate compatible communication.

The primary consideration for compatible digital communication is proper synchronization. The data must be transferred from the tape reader to the digital system when it becomes available, but then only when this digital system is prepared to accept the data. Considerations for synchronized data transfers to a digital system are clock frequency, clock phase, clock pulse width, and clock tolerances.

The clock pulse associated with a tape reader shall be defined as the sprocket signal. The sprocket signal characteristics are primarily a function of the electromechanical equipment where:

1. The sprocket signal frequency is determined by the tape reader speed;

2. The sprocket signal phase can be synchronous, where the tape is stepped from character to character, or asynchronous, where the tape is continuously driven at high rates;

3. The sprocket signal pulse width is a function of the dimensions of the sprocket hole, which is standardized but varies with tape wear, and the speed of the tape reader, which can range over an order of magnitude of characteristic speeds;

4. The sprocket signal tolerances are inherently large where the tape reader speed is not accurately controlled and the sprocket hole dimensions have wide tolerances. This consideration will result in very loose tolerances for the sprocket signal frequency, phase and pulse width.

Clock pulses associated with digital systems are precisely controlled with crystal oscillators and have well defined characteristics. However, the sprocket signal frequency is not a precise frequency and does not have well defined characteristics. For example, the EIA standard for punched tape allows the sprocket hole radius to range from 0.0225 inches to 0.024 inches. A high speed tape reader will read 1000 characters per second or, with a standard hole spacing of 0.100 inches, will read 100 inches of tape a second. A relatively slow electronic digital system will have a clock frequency of approximately one million pulses per second. As a result, there will be approximately 10 clock pulses for each one thousandths of an inch of tape that passes the reader, or 15 clock pulses over the permissible tolerance in sprocket hole radius of one and one-half thousandths of an inch. Therefore, precise control of tape speed by the computer clock would still allow the sprocket hole signal to occur at any time during 15 clock pulses, or, more importantly, at any time within a clock pulse. Other considerations such as the punched hole location tolerance and the response time of the electro-optical system will increase the possible band of clock pulses over which the sprocket signal might first occur. Consequently, since the occurance of the sprocket signal with respect to the computer clock cannot be controlled by referencing tape speed to the computer clock, it is common practice to allow the tape reader to operate at a speed independent of the computer clock.

Two of the primary considerations in the design of an electronic digital system such as a digital computer are speed and cost. The speed, and thus the clock frequency, must be sufficiently high to accomplish the required data processing within a permissible time period. Each clock pulse within an electronic digital system initiates a further step in the function of the digital equipment, such as a step in a data processing task or a step in a mathematical computation. Consequently, the electronic system must be sufficiently fast to complete a step commanded by one clock pulse before the next clock pulse occurs. However, since the clock frequency is set reasonably close to the maximum possible operating speed of the electronic system, it will take a substantial part of a clock pulse for the system to perform the logical operation commanded by that pulse. If a sprocket signal level adequate to command the loading of the data into the digital system first occurs toward the end of one clock pulse, various errors could result, including:

1. The digital system could partially or completely load the data presented by the tape reader, but not have time to store the fact that it had read the tape information for that sprocket hole. On the next clock pulse, the system would load the same information into the next memory location, thereby upsetting the desired sequential flow of data and resulting in a gross system error.

2. The digital system could fail to load or partially load the data presented and store the fact that the information for that sprocket hole had been loaded. Here the sequential flow of data is not disturbed but the data for that sprocket hole, as loaded, is in error.

Neither of these conditions can be tolerated, thereby necessitating a phase synchronization mechanization to assure the computer receives a sprocket signal only at the beginning of a clock pulse. Phase synchronization of the tape reader and digital equipment can be accomplished by stepping the tape reader from character to character under control of the digital system in a synchronous mode of operation. However, this technique substantially degrades the tape reader speed.

Sprocket pulse width is in the magnitude of five hundred microseconds for the highest speed tape readers and can range up to five milliseconds for the slower speed units. This pulse period will bracket a large number of digital clock pulses, thereby precluding the possiblity of using the sprocket pulse to directly make the data transfer. Direct use of the sprocket signal could result in a race condition where the long sprocket signal would enable the data transfer operation for many periods of the digital system clock. For instance, even in the highest speed tape reader (1,000 characters per second) and a slow speed digital system (100 kc clock) approximately 50 digital clock pulses are bracketed by a single sprocket pulse.

In addition to the above problems there are also many inherent error mechanisms associated with punched tape readers that are characteristic of electromechanical and optical equipment. These error mechanisms must be compensated to prevent the errors from jeopardizing system operation. Compensation often is accomplished with expensive electromechanical techniques and sophisticated electronics, but it is sometimes completely ignored due to the assumed complexity of the solution. Some of these error mechanisms are discussed below.

Conventional digital systems will be set up to use tape sprocket signals as a command to load the data contained in the tape reader signals. This is commonly referred to as strobing the information into the digital system. Once this is accomplished, the digital system will not again load the tape reader signal information until the sprocket signal drops out, that is, changes back to a level indicating that the sprocket hole photosensor is no longer illuminated, and subsequently reoccurs, that is, changes back to a level indicating that the sprocket hole photosensor is once again illuminated. Normally, this sequence will only be caused by the motion of the tape so as to bring the next row of punched holes to the photosensors. However, as previously pointed out, any one sprocket hole photosensor is illuminated for approximately 50 computer clock pulses (or more). Consequently, it is possible for the sprocket signal indicating the illumination of the sprocket hole photosensor to occur for a few computer clock pulses, to then drop out for a few computer clock pulses due to one or more of the error mechanisms subsequently discussed, and then to reoccur for the remainder of the period of that sprocket hole illumination. This would cause the digital equipment to operate on the reoccurrence of the sprocket signal as if it were a new sprocket signal. This condition would result in the sprocket signal loading the tape character twice in succession, where the original occurrence of the sprocket signal would load the tape character and the reoccurrence of the sprocket signal would load the tape character a second time. This double strobe effect would cause ambiguous data to be generated resulting in a gross system error. For example, a double strobe condition associated with the character 7 in the number 573 would cause the number 5,773 to be loaded into the digital equipment. This error mechanism would be difficult to locate because of its intermittent or transient nature and might be more difficult to correct due to the characteristics of the error mechanisms. Double strobe effects can be caused by:

1. An improperly punched sprocket hole that has a jagged or fuzzy leading edge. This condition could cause the illumination to be obscured intermittently to the extent that it would fluctuate about the electronic threshold level, thereby resulting in sprocket signal dropout.

2. Dust, dirt or lint obscuring the sprocket hole leading edge may cause the same results as an improperly punched sprocket hole.

3. The mechanical vibration imposed upon the mechanical and optical assembly causing relative motion between the illumination source and the photosensors with results similar to those caused by an improperly punched sprocket hole.

4. Tape hysteresis resulting from the dynamic motion of the tape and characterized as a type of snap action. This tape hysteresis may be only a minute physical bi-directional motion but can alternately expose, then obscure the photosensors with the same results as caused by an improperly punched sprocket hole.

5. An improperly focused light source where the illumination for the photosensors generates alternate patterns of high and low light intensity. This condition can generate multiple illuminated spots separated by a sub-threshold illumination along the sprocket hole track with the same results as caused by an improperly punched sprocket hole.

6. Electronic noise induced by the photosensors or analog electronics which could cause the sprocket signal to drop out. This condition could cause the sprocket signal to fluctuate about the electronic threshold level, thereby resulting in sprocket signal dropout.

7. A relatively slow rise time sprocket signal as defined by the motion of the sprocket hole into the illuminated area. This would result in the sprocket signal making a transition through the electronic threshold level very slowly and would result in undue susceptability to sprocket signal dropout caused by the conditions described in Items 1 through 6.

8. A threshold trigger without a sufficient amount of electronic hysteresis would exhibit undue susceptability to sprocket signal dropout caused by the conditions described in Items 1 through 6.

These double strobe occurances are always a potential problem with tape readers. The problem is caused by the sensitivity of the equipment to the transition through a sensitive and critical discontinuity defined as the enabling of the sprocket signal. The double strobe error mechanism can only be partially isolated and cannot be completely eliminated in the electromechanical domain due to the sensitive nature of the transition.

This invention provides the method and the apparatus required to compensate for many of the error sources in tape readers in the digital domain instead of the electromechanical domain. More specifically, a means is provided for loading the digital data into the computer only upon the coincidence of a particular level of a sprocket signal and at least one data bit signal. In addition, further loading of the tape information is prevented until all data bit signals change, at least until the next clock pulse, to a level indicating that the tape is in a position between tape characters, and thereafter at least one data bit signal returns to a level indicating the illumination of a data bit photosensor. In this manner the possiblity of strobing the same tape character into the computer more than once because of a temporary loss of the sprocket signal is eliminated.

Therefore, it is an object of this invention to prevent a faulty sprocket signal from loading a tape character into the digital system more than once.

A further object of this invention is to compensate in the digital domain for many of the inherent error mechanisms associated with tape readers. Such digital compensation substantially reduces the expense and equipment sophistication requirements characteristic of schemes for compensating in the electromechanical domain. In addition, compensation in the digital domain will allow a significant reduction in the requirements and constraints on the apparatus which limits the data acquisition rates, that is, the tape reader.

It is a further object of this invention to make the tape data available to the computer for periods determined by the computer clock frequency, rather than the tape reader frequency, and at the beginning of a clock pulse.

Another object of this invention is to provide a pulse train which is initiated when the tape character is in a position suitable for reading and loading into the computer and which is synchronous with the computer clock. The pulses in this pulse train may be used for such purposes as performance of a parity check, loading the data into the computer or arranging the data bits in serial form.

A further object of this invention is to provide digital circuits for the accomplishment of the above objects.

A still further object of this invention is to provide a method for accomplishing the above objects within a digital computer, either the computer into which the information is being loaded or a separate computer; by performing repetitive operations on the tape reader information to determine the proper time for storage of the tape reader outputs.

Figure 14B:
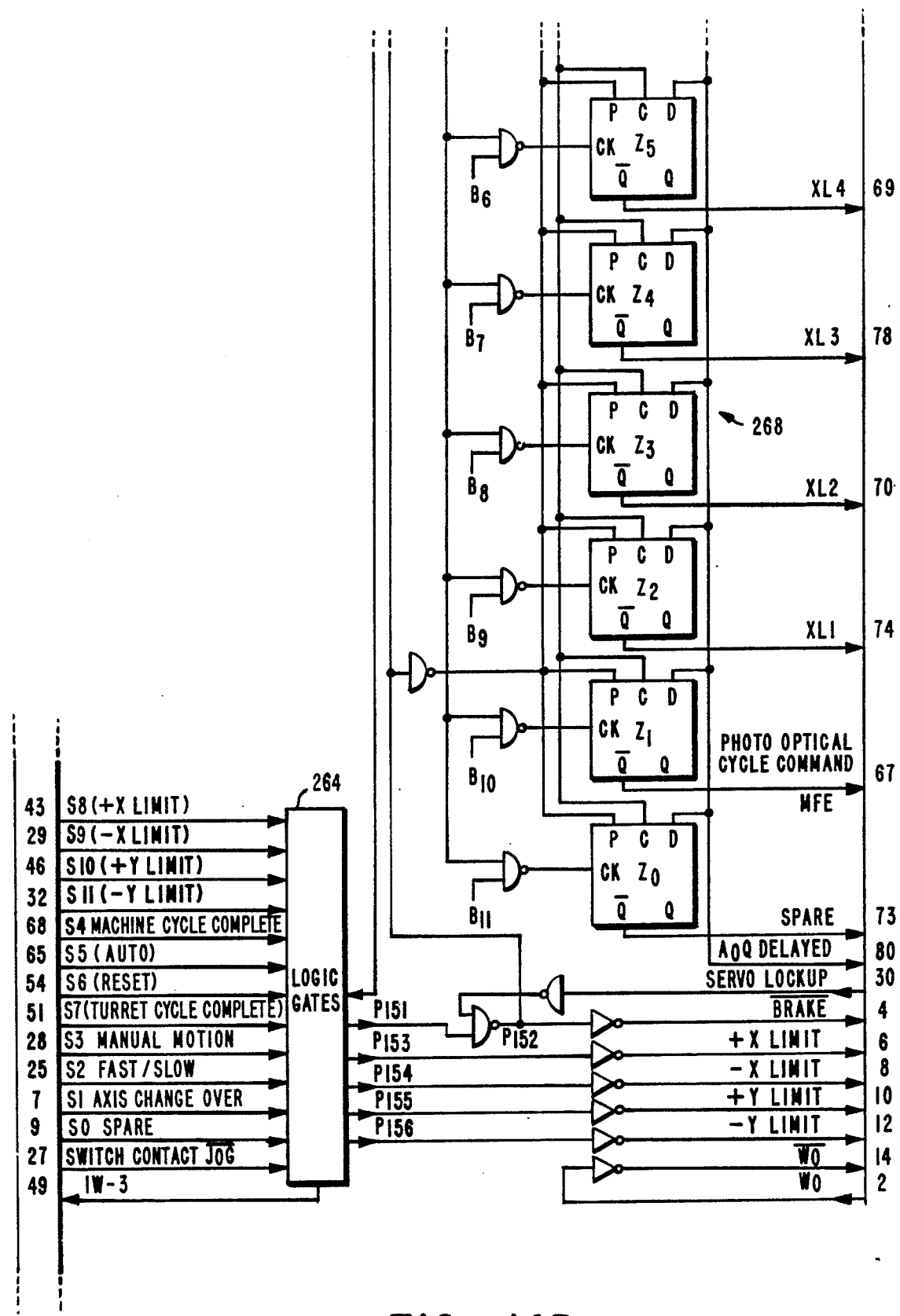
Figure 14C:
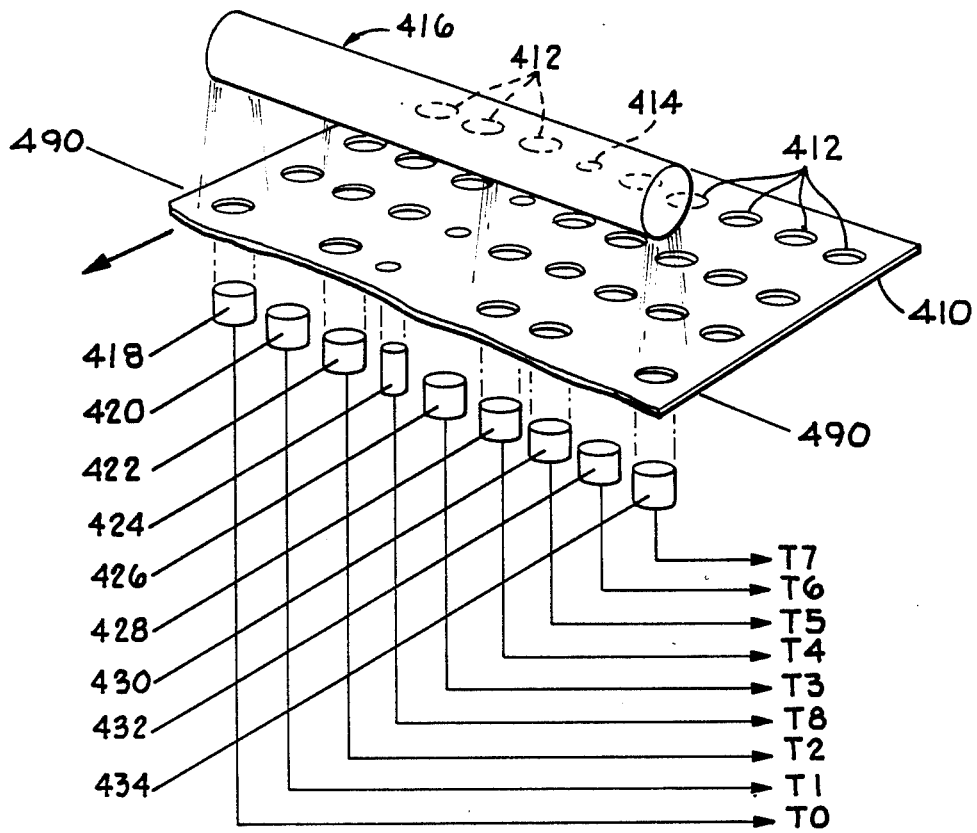

In FIG. 14C, the functional elements of a typical input means, that is, a photoelectric punched tape reader head, are shown schematically. The input media may be a punched tape 410 containing various data bit holes 412 and a continuous series of sprocket holes 414. The tape is physically moved past the reader head in the direction indicated by the arrow. Light source 416 (which may be a single or plurality of light sources) illuminates one side of the tape and the light sensors 418–434 sense this light whenever a hole in the tape is in line with the appropriate sensor. For instance, in the tape position shown, sensors 418, 422, 424, 428, 430 and 434 will sense the light passing through the corresponding tape holes. However, sensors 420, 426, and 432 do not line up with any tape holes and, therefore, create output signals corresponding to the non-illuminated condition.

In this embodiment, each data character may have eight data bit holes 412 and always has associated with it a sprocket hole 414. It can be seen that the sprocket hole 414 is significantly smaller in size than the data bit holes 412. Consequently, the photosensors sensing the data bit holes 412 in the character being read will be illuminated before photosensor 424, which senses the sprocket hole for that character, and the data bit holes 412 will remain illuminated until after the sprocket hole photosensor 424 is no longer substantially illuminated. In the prior art devices a sprocket photosensor signal T8 was used as a command to read and store the data bit photosensor signals. However, as previously discussed, if the sprocket photosensor signal T8 was momentarily lost and then reacquired, it would be interpreted as a command to again store the information, thereby causing a gross system error by commanding the storage of a single character more than once.

The data bit photosensor outputs may be conditioned so that the illumination of a particular photosensor causes its output voltage to go to a low level and that the absence of illumination causes the output to go to a relatively high level. This conditioning may be accomplished in the tape reader or as a simple circuit addition to the mechanization which would operate on the photosensor outputs prior to their use in the logical mechanization. In the alternate embodiment of this invention where the logical operations are performed within the computer being loaded the signal conditioning may be accomplished by suitable programming of the computer itself. In any case, such signal conditioning may be easily achieved or the lack of such signal conditioning easily accounted for by anyone skilled in the art of logical design or computer programming.

Figure 14F:
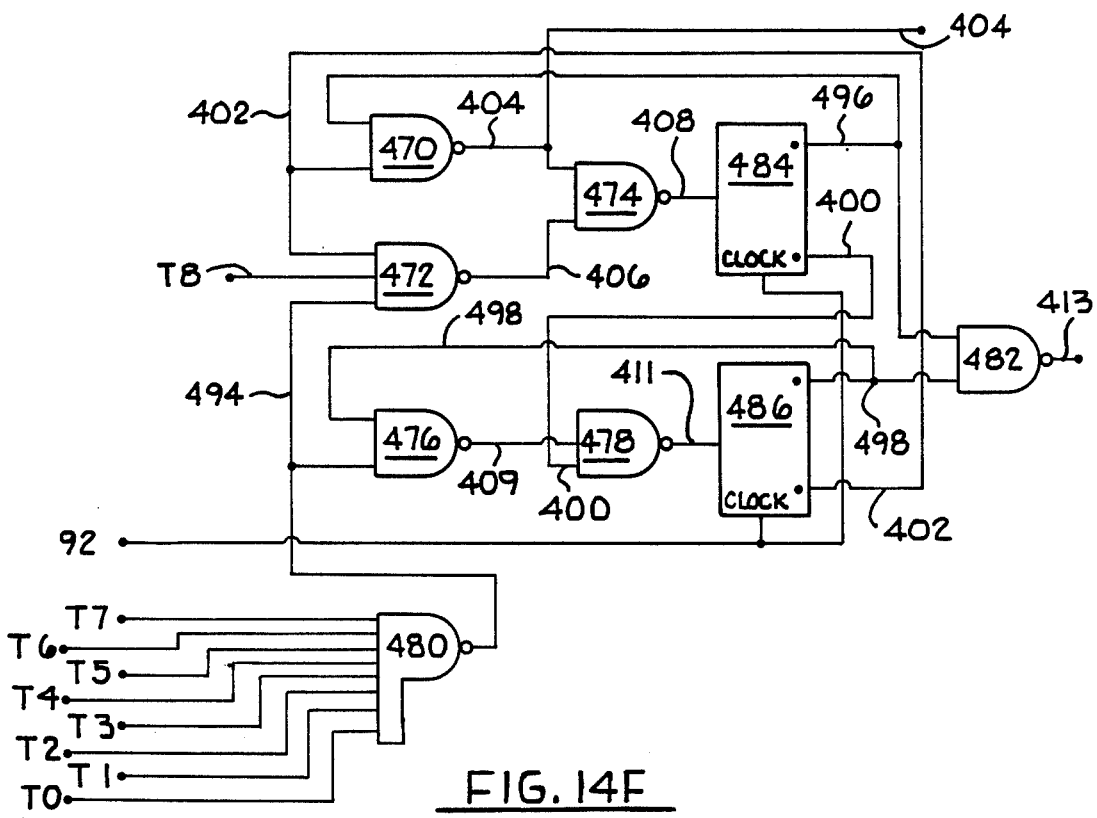
Figure 14D:
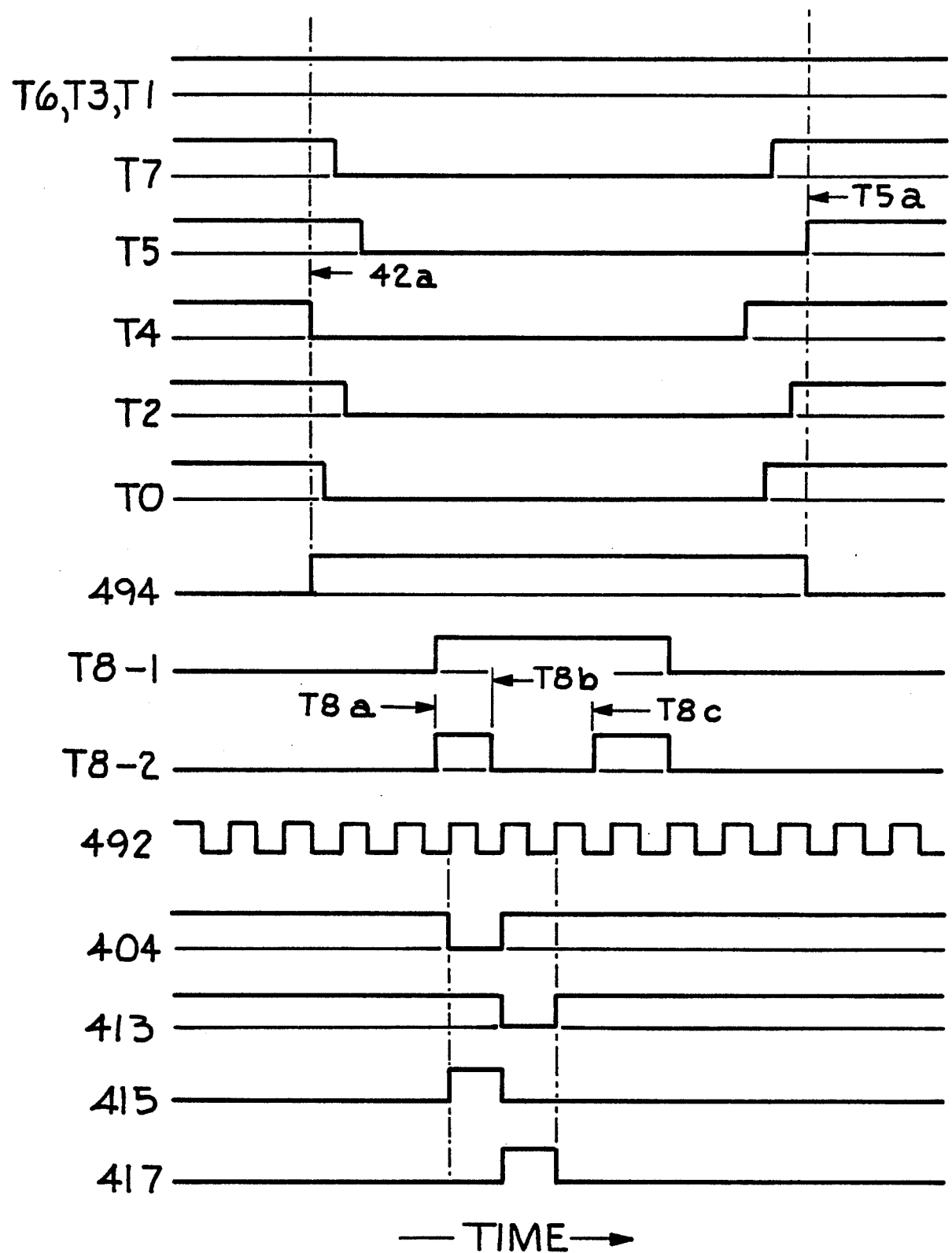

FIG. 14D is a graphical representation of waveforms over the time required for the row of punched holes 490 (FIG. 14C) to move past the photosensors. The photosensor outputs are here presumed to have been conditioned as discussed before so that the high state output of a particular data bit sensor represents the non-illuminated condition and the low state represents the illuminated condition. In row 490 there are no data bit holes corresponding to the photosensors 420, 426, and 432. These photosensors are not illuminated as the tape moves by them and, therefore, the outputs 438, 444, and 448 remain at the high state throughout the time period shown. However, data bit photosensors 418, 422, 428, 430, and 434 are illuminated as the data bit holes move past the photosensors, so that the photosensor outputs T7, T5, T4, T2, and T0 switch to the low states during the period of exposure to the illumination. The exact time of this switching and the switching back to the high state depends on such things as the exact size of the data bit holes and their exact location along the length of the tape as well as the characteristics of the light 416 and the corresponding photosensor.

Waveform T8-1 is an inverted waveform for the sprocket photosensor 424. This waveform has a single change to the high state followed by a single change to the low state in the passing of row 490 over the photosensors (FIG. 14C). However, if for any of the reasons previously discussed, the sprocket signal T8 is momentarily lost, the waveform shown as signal T8-2 in FIG. 14D will be obtained. It can be seen that the momentary dropout at time T8b in waveform T8-2 has a duration that is greater than the digital clock period as shown in waveform 492. This will almost always be the case since the period of the clock frequency is usually less than 2% of the sprocket signal period shown in waveform T8-1 (waveform 492, for purposes of clarity, is shown having a much longer clock period than actually exists). Consequently, prior art methods and devices would interpret the first change of sprocket signal T8-2 to the high state at time T8a as a command signal to load character 490, thereby interpreting the second change of the photosensor sprocket output to the high state at time T8c as another command signal to load character 490, thereby loading the same character information twice. This will result in a gross system error.

The inputs to gate 480 (FIG. 14F) are the outputs T7-T0 of the data bit photosensors 418-434. The output of gate 480 is the general bit signal 494 and has a waveform as shown in FIG. 14D. It can be seen that the general bit signal 494 changes to the high state when the first photosensor output changes to the low state (photosensor output T4 at time T4a for the example shown in FIG. 14D) and remains in the high state until the last photosensor output returns to the high state (photosensor output T5 at time T5a for the example shown in FIG. 14D).

It can be seen from FIG. 14D that when the tape reader approaches a character, the general bit signal 494 changes to the high state when the first data bit is detected as one of data bit signals T7-T0 changing to the low state. At this point, the sprocket signal T8 will not have been detected. The next occurrence is the detecting of the sprocket hole 414 and the change of signal T8 to the high state. Now both signals T8 and 494 are in the high state.

The waveforms for signals 404 and 113 are presented in FIG. 14D. These waveforms can be used as command signals to the computer for such purposes as performing a parity check on the data and to store the data. Also, they can be inverted by methods well known to those skilled in the art to yield waveforms 115 and 117 if the computer requires command signals in this form. In addition, although only command signals 115, 117, 404, and 113 are shown in FIG. 14D, one skilled in the art could readily design a circuit to generate a pulse train of any desired length.

It will be shown that a temporary dropout of the sprocket signal T8, once the operating cycle is initiated by the first clock signal after general bit signal 494 and the sprocket signal T8 both going to the high state, does not effect the operating cycle of the circuit and cannot command the digital system to load the same tape character more than once. Consequently, one of the primary objects of the present invention, that of eliminating the possibility of multiple loadings of one tape character into the digital system because of temporary sprocket signal dropout, has been achieved. In addition, this has been accomplished without putting any constraints on the tape reader such as the requirement that the tape reader step the tape from character to character. Therefore, the tape reader speed is only limited by the characteristics of the tape and the tape reader. Also, the command signals to the digital system being loaded (signals 404 and 113 or signals 115 and 117) are synchronous with the computer clock, regardless of the tape reader speed. Therefore positive data transfer and processing may be accomplished in synchronism with the digital system independent of the tape reader speed.

The logical operations may be performed within a general purpose digital computer. Such an embodiment may be especially useful when the digital computer used for this purpose is also the computer containing the memory means which is to receive and store the tape data. Therefore, for purposes of explanation only, this will be assumed to be the case. However, one computer could be used to perform the logical operations of this invention (and also a parity check or some other conventional operation, if desired) and to provide, as outputs, a command signal or series of command signals such as signals 115 and 117. These could be used as commands for the second computer to store the data bit information. If two computers are used in this manner, they should operate from the same clock signal so that the two computers are synchronized.

Figure 14E:
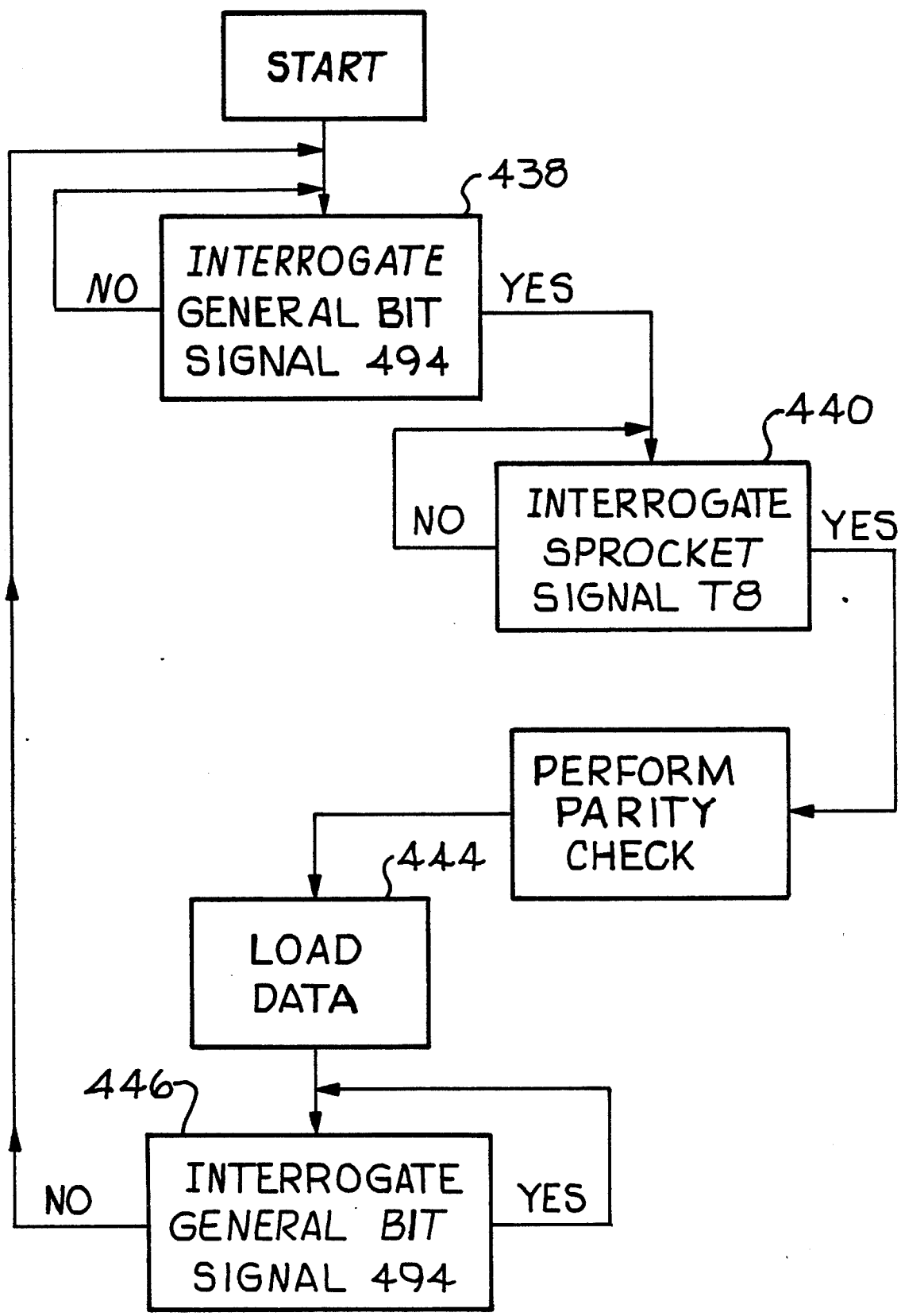

By way of example, the logical operations that could be performed by the computer to achieve the objects of this invention are shown in FIG. 14E. The general bit signal 494 may be generated as described in the explanation of FIG. 14F and may be directly available to the computer. As an alternative embodiment, the computer itself could read the individual data bit signals T7-T0 and create an internal signal equivalent to general bit signal 494 in FIG. 14D whenever any of the data bit signals T7-T0 indicate a data bit photosensor is illuminated. The choice between generating the general bit signal 494 externally or within the computer depends on economic considerations and whether the compute is of sufficient speed to complete logical operations within the time period that the data bit signals T7-T0 and the sprocket signal T8 for an individual tape character are available.

The first logical operation 438 that the computer performs as shown in FIG. 14E is to interrogate the general bit signal 494 to determine whether any of the data bit photosensors T7-T0 are illuminated. If general bit signal 494 indicates no data bit photosensors are illuminated, the computer may do one of two things. If it is a high speed computer and is so programmed, it may operate in a time shared mode, that is, it may branch off and perform other unrelated operations, returning at frequent intervals to repeat the operations of FIG. 14E. If the computer is not so programmed, it may be programmed to immediately repeat the interrogation of the general bit signal 494 in operation 438.

If the interrogation of the general bit signal 494 indicates that at least one of the data bit photosensors 418-434 is illuminated, the computer next interrogates the sprocket signal T8 in operation 440, searching for the illumination of the sprocket photosensor 424 and at least one of the data bit photosensors 418-434. When this occurs, the computer, for the example shown, proceeds first with a parity check in operation 442 and then to load the data bit information available as data bit signals T7-T0 in operation 444. If desired, the computer could easily be programmed to perform other operations at this stage or to provide command signals to a second computer to read and store the tape data.

After the computer has performed the above operations, it then will interrogate the general bit signal 494 in operation 446, searching for an indication that none of the data bit photosensors 418-434 are illuminated, thus indicating that the photosensors are between tape characters. When this occurs, the computer will then return to the first step and start interrogating th general bit signal 494 in operation 438 to determine when the first data bit photosensor becomes illuminated so as to indicate the next tape character is approaching the photosensors 418-434

It can be seen from the above description of one computer implementation of the present invention that once the sprocket signal T8 indicates the sprocket photosensor 424 is illuminated, the computer will proceed to perform a parity check and then load the information as data bit signals T7-T0 and that thereafter, a momentary dropout of sprocket signal T8 cannot cause the computer to repeat this process until the general bit signal 494 has indicated that the next character is approaching the photosensors 418-434. In addition, synchronization with the computer being loaded is automatic, because the command signals ar being produced internally within that computer.

A punched tape reader is one form of input means commonly used as an input device to digital equipment. It should be understood that while the term tape reader may be employed hereinafter, this is for purposes of explanation. The same explanation may be applicable to other input means, comprising, to mention a few, any of the following: punched tape readers, magnetic tape readers, punched card readers, magnetic card readers, general purpose digital computers, differential digital analyzers, stored program digital computers, converters such as synchro to digital or analog to digital, shift registers, latching registers, business machines, typewriters, calculators, communication lines, radar lines, telephone lines, telegraph lines, memory means such as core memories, disk memories, drum memories, or semiconductor memories, keyboards, switches, digitizers, cathode ray tube displays, sensors, pickoffs and encoders. In addition, though the terms sprocket. sprocket hole and sprocket signal are used herein for purposes of explanation, such terms are not meant to be limited in application to punched tape readers, but refer generally to the reference and reference signal of whatever input means is employed.

Referring now to FIG. 1, the tape reader 16 may be a commercially available paper tape puncher and reader such as Model RRS0304RA manufactured by Remex Electronics. However, it has been found that by implementing this tape reader 16 as an Elemental Extremity and using the Intrinsic Signal Form concept and Operative Dispersion concept, significant advantages can be achieved. These advantages are described in detail in copending application, "A Method and Apparatus For Processing the Digital Output of an Input Means," Ser. No. 879,293, filed Nov. 24, 1969, by Gilbert P. Hyatt and incorporated herein by reference. This referenced application is now abandoned in favor of the present application. Generally, the system operates by having the data processor sample the output of the tape reader 16 at a cyclic rate which is much faster than the operation of the tape reader 16 in a manner similar to the sampling of the control panel outputs. Punching and formatting of the paper tape is in accordance with EIA standards RS-274-B, Interchangeable Perforated Tape Variable Block Format for Contouring and Contouring/Positioning Numerically Controlled Machines, incorporated herein by reference.

Now turning to FIG. 14F, a logical circuit mechanization of the present invention may be seen. This mechanization assume that the tape reader data bit signals T7-T0 have been conditioned as discussed above. This embodiment uses NAND gates 470, 472, 474, 476, 478, 480, and 482 and two D flip-flops 484 and 486. From the subsequent explanation of the present invention, one skilled in the art could easily establish alternate logical mechanizations using other devices such as RS flip-flops or T flip-flops to perform the same logical functions as the mechanization presented in FIG. 14F.

The D flip-flops 484 and 486 are identical devices, each requiring two inputs and each providing two outputs. For instance, flip-flop 484 is connected in circuit with signal 408 as the logical signal input and clock signal 492 as the clock signal input. Upon the occurrence of a pulse in a clock signal 492, flip-flop 484 output signal 496 will change to (or remain at) the state of he input signal 408. Thus, the state of signal 408 is used to define the state of the flip-flop 484. If signal 408 is in the high state, the signal 496, after one clock pulse, will be high regardless of it's state before the clock pulse. If signal 408 is in the low state, the signal 496, after one clock pulse, will be low. Changes in state of signal 408, unaccompanied by a subsequent pulse in clock signal 492, will not change the state of signal 496.

The second output of flip-flop 484 is signal 400, which is the logical inverse of signal 496. Then signal 496 is high, signal 400 is low. When signal 496 is low, signal 400 is high.

The NAND gates 470 through 482 are conventional NAND gates well known to the art. Each gate has two, three, or eight inputs and a single output. The output is low only if all inputs are high. If one or more inputs is low, the output is high. For example, if signals 496 and 402 are high, signal 404 (the output of gate 470) is low. If either or both of signals 496 and 402 are low, signal 404 is high. For gate 472, signals 452, 402, and 494 must all be high in order for signal 406 to be low.

Assume that the tape reader is in a position between characters and that the flip-flops 484 and 486 are in their low states, that is, that the flip-flop outputs 496 and 498 are at the low state and that the inverse outputs 400 and 402 are in the high states. Between tape characters, the sprocket signal T8 and the general bit signal 494 are both in the low state. The low signal output 496 will cause the output 404 of gate 470 to be high and the low signals 452 and 494 into gate 472 will cause the output 406 to be high. Consequently, with both signals 404 and 406 being high, the output 408 of gate 474 will be low. Therefore, continued clocking of flip-flop 484 by the computer clock signal 472 will maintain the flip-flop in the low state. Also, the low signals 498 and 494 into gate 476 will cause the output 409 to be high. Consequently, both inputs 400 and 409 into gate 478 are high causing the output 411 to be low. As a result, continued clocking of flip-flop 486 by clock signal 492 will not change the state of flip-flop 486. The low signals 496 and 498 into gate 482 will cause the output of the gate 113 to be high.

It can be seen from FIG. 14D when the tape reader approaches a character, the general bit signal 494 changes to the high state when the first data bit is detected and one of data bit signals T7 through T0 changes to the low state. At this point, the sprocket signal T8 will not have been detected. Therefore, since the sprocket signal T8 is still low, the output 406 of gate 472 will remain high. Also, since the output 498 of flip-flop 486 is low, the output 409 of gate 476 will also remain high. Consequently, the output of gates 474 and 478 will remain low and the flip-flops 484 and 486 will remain in the low state.

The next occurrence is the detecting of the sprocket hole and the change of signal T8 to the high state. Now both signals 452 and 494 are in the high state. Since 402 is also high, the output 406 of gate 472 is low and the output 408 of gate 474 is high. However, this condition must exist until the next computer clock pulse (signal 492) at which time flip-flop 484 will switch to the high state. If either signal 452 or signal 494 returns to the low state before this next clock pulse, the gates will return signal 408 to the low state and flip-flop 484 will not change to the high state.

Once the flip-flop 484 changes to the high state, both inputs to gate 470 are high, thereby causing the output 404 to be low and the output 408 of gate 474 to be high independent of the state of signal 406 and thus independent of sprocket signal T8 and general bit signal 494. Also, the output 400 of flip-flop 484 is now low and therefore, the input 411 into flip-flop 486 is high, independent of the state of signal 409 and thus independent of sprocket signal T8 and general bit signal 494. Therefore, in this condition the input to both flip-flops are independent of the sprocket signal T8 and the general bit signal 494. Consequently, a momentary loss of sprocket signal T8 at this joint will not change the inputs to flip-flops 484 and 486 and will not change the output 404 of gate 470. Therefore, in any even, the next clock pulse (signal 492) will change the state of flip-flop 486 to the high state. Now both signals 496 and 498 into gate 482 are high causing the output 413 to be low. Also, the output 402 has change to the low state, so that the output 404 of gate 470 returns to the high state as does the output 406 of gate 472. Thus, the input 408 for flip-flop 484 changes to the low state, again independent of the state of the sprocket signal T8 or the general bit signal 494.

The next clock pulse (signal 492) will change flip-flop 484 to the low state. Since signal 402 is low, signal 404 remains high, the output 406 of gate 472 is high independent of the sprocket signal T8 and therefore the input 408 of flip-flop 484 remains low. Also, signal 400 is high and the input 411 now depends on the condition of the general bit signal 494. If the general bit signal is still high as it should be when any of the character is still being read within the tape reader, both inputs to gate 476 will be high, causing the output 409 to be low, which in turn causes output 411 of gate 478 to be high. In this condition, signal 404 is high, signal 413 is high since the input 496 to gate 482 is low, and flip-flops 494 and 486 may not change state regardless of the state of the sprocket signal T3 until the general bit signal 494 returns to the low state thus indicating that the character has passed out of the read area in the tape reader.

When the general bit signal 494 does return to the low state, the output 409 of gate 476 will be in the high state and, since the signal 400 is also in the high state, the output 411 of gate 478 will be in the low state. Consequently, on the occurrence of the next computer clock pulse, flip-flop 486 will return to the low state thereby returning the circuit to its original condition in readiness for the reading of the next tape character.

Upon first applying electrical power to the circuit, flip-flops 484 and 486 may initially go into either state. However, it can be seen from the above discussion that flip-flops 484 and 486 take on all possible combinations of states somewhere in the operating cycle. Since the tape reader will normally be between characters, when power is first applied, signal 494 will normally be low and, therefore, the circuit will cycle to the initial start condition with both flip-flops 484 and 486 in the low state rather than hang up with flip-flop 486 in the high state as it does immediately after reading a tape character.

It can be seen from the above explanation of FIG. 14F that upon the first clock pulse after both the sprocket signal T8 and the data bit signal 494 change to the high state, flip-flop 484 changes to the high state and the signal 404 changes from the high state to the low state. On the next clock pulse, flip-flop 486 changes to the high state and signal 404 returns to the high state. Now, for the first time, both flip-flops 484 and 486 are in the high state causing the output 413 of gate 482 to change to the low state. The next clock pulse changes flip-flop 484 to the low state, which returns signal 413 to the high state. Consequently, it can be seen that signal 404 makes a single change to the low state on the first clock pulse after sprocket signal T3 and general bit signal 494 both go to the high state and, on the next clock pulse thereafter, returns to the high state. At this time, signal 413 changes to the low state, and on the next clock pulse returns to the high state.

It should be noted that the conditioning of the photosensor signals T7–T0 so that the low state represents the illuminated condition causes the data bit signal 494 to be the OR combination of the normal tape reader outputs. That is, if the illuminated condition of the photosensors represented the high state and the NAND gate 480 were replaced with an OR gate, data bit signal 494 would have the same logical characteristics as it has for the mechanization shown. However, the NAND gate implementation is preferred because integrated circuit NAND gates are much more readily available than are integrated circuit OR gates.

Servos

Figure 3:
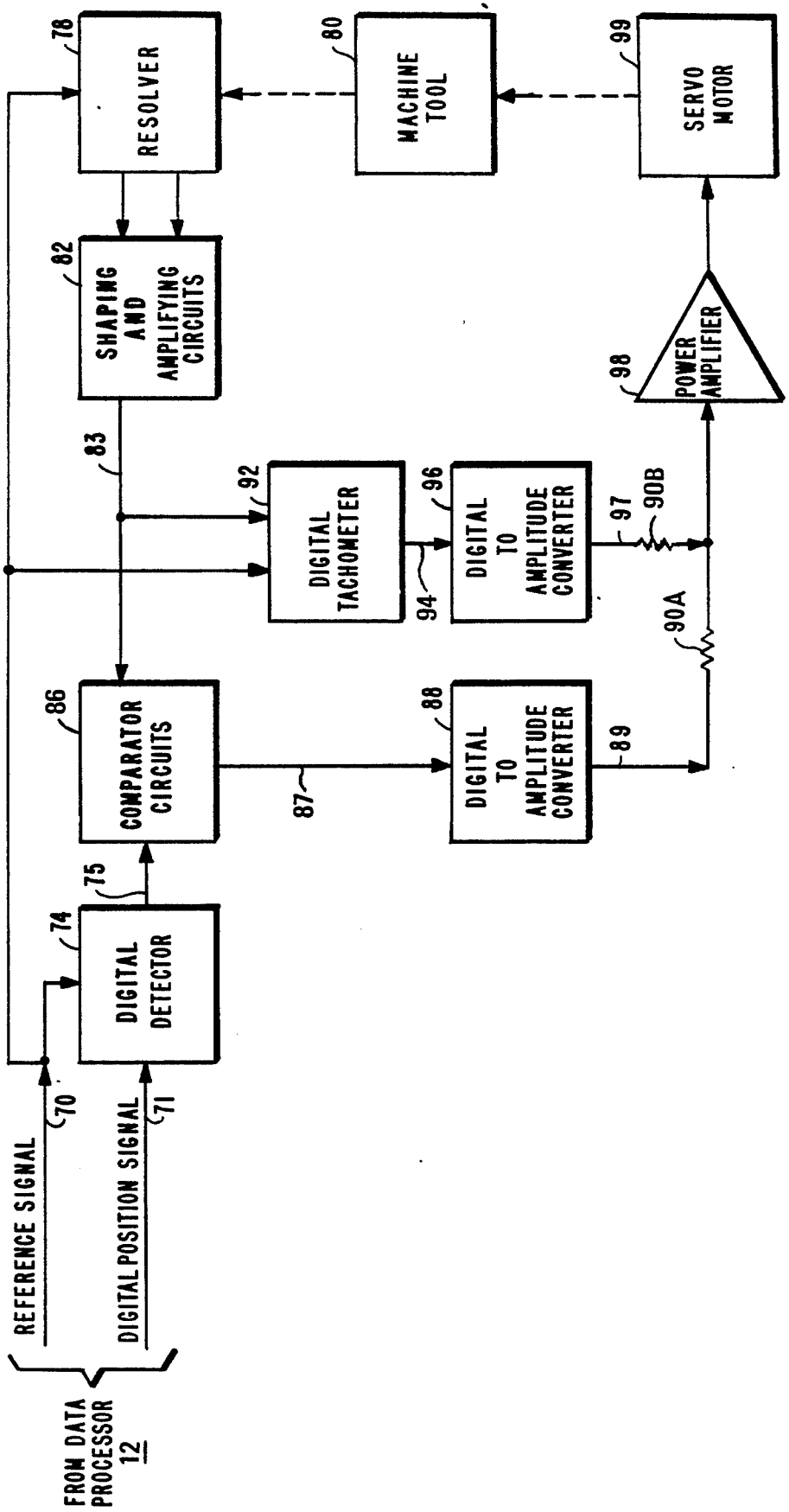
FIG. 3 is a block diagram representation of a servo drive shown in FIG. 1.

The servos 20, 21 and 22 may be identical and are described with reference to the servo 20 only. As shown in block diagram form in FIG. 3 and in schematic form in FIG. 17, the servo 20 is able to attain the accuracy of digital control by operating with squarewave or digital signals. A squarewave reference signal 70 is provided with respect to which the phase of the encoded signals are measured. The data processor produces a digital position signal 71 which indicates a commanded servo position. The signal 71 is a completely digital whole word signal produced under program control and having a characteristic defined as an intrinsic signal form. The reference signal 70 and digital position information signal 71 are applied to a digital detector 74 which produces pulse width position difference command signals 75. The reference signal 70 is applied to a rotor of a resolver 78 which is mechanically linked to a machine tool 80 which is being controlled. The stator of the resolver then produces a signal, the phase of which depends upon the position of the rotor as controlled by the machine tool 80. The stator signal passes to an adding, shaping and amplifying circuit 82 which produces a position defining squarewave feedback signal 83 indicating the actual position of the machine tool 80. The position feedback signal is passed to comparator circuits 86 along with the position command signal 75. The comparator circuits 86 produce plus or minus pulse width squarewave signals 87 with the duration of the positive portion of the signals indicating the difference between the commanded position and the actual position. A digital-to-amplitude converter 88 converts this signal to a servo control error signal 89 which is presented to one side of a summing resistor 90A.

The digital-to-amplitude converters 88 and 96 (FIGS. 3 and 17) accept pulse width modulated signals 87 and 94, respectively, and provide analog voltages 89 and 97, respectively, proportional to the cuty cycle or width of the input pulses. These converters 88 and 96 are well known to those skilled in the art and may be configured with an analog switch controlled by the pulse width input signal to gate charge into a filter network for the time that the signal is true. The filter network averages this signal with respect to time to provide the analog voltage.

By comparing the half cycle period of the position feedback signal 83 with the half cycle period of the reference signal 70, a digital tachometer 92 produces plus or minus squarewave signals 94 with the duration of the positive portion of the signal indicating velocity. This signal passes to a digital-to-amplitude converter 96 which produces a velocity feedback signal 97 which is connected to summing resistor 90B. The junction of the summing resistors 90A and 90B is connected to a power amplifier 98 which drives a servo motor 99 to control the position of the machine tool 80. By using this squarewave technique, the servo 20 incorporates the combined accuracy of digital and analog signals with the simplicity of analog signals and is typical of an Elemental Extremity with Intrinsic Signal Form implementation.

Data Processor

As shown in FIG. 1, the data processor 12 receives data from the various input sources, performs calculations or otherwise manipulates data in accordance with the input information and outputs processed information to control the milling machine 24 through servos 20, 21, and 22 and auxiliary control signals 26. The data processor is built from series SN7400 integrated circuits manufactured by Texas Instruments, Inc. which are located on a series of printed circuit boards. These printed circuit boards plug into a motherboard which provides necessary interconnections between the terminals of the printed circuit boards.

The architecture of the data processor 12 lends itself to a fully integrated circuit computer mainframe where all of the logic may be implemented with integrated circuits in a conventional manner and additionally includes an integrated circuit scratch pad memory (SPM). Further, this data processor 12 has the architecture to use an integrated circuit read-only memory (ROM) in place of or in addition to a core memory such as for the main memory 30 providing a data processor with the digital portion constructed wholly of integrated circuit components.

Figure 4:
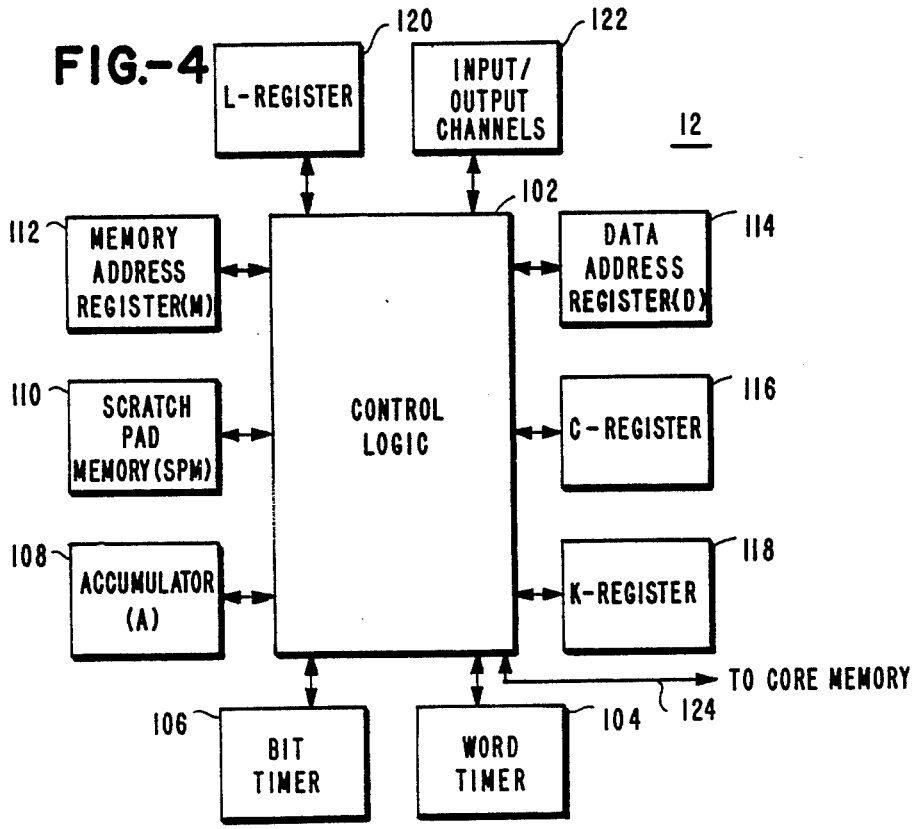
FIG. 4 is a block diagram representation of the data processor shown in FIG. 1.

In a somewhat simplified block diagram, the data processor 12 is shown in FIG. 4 as control logic 102 interconnecting registers, timers and communication channels. Common signal definitions are provided to permit those knowledgeable in the art to identify the various connections between boards.

Figure 7:
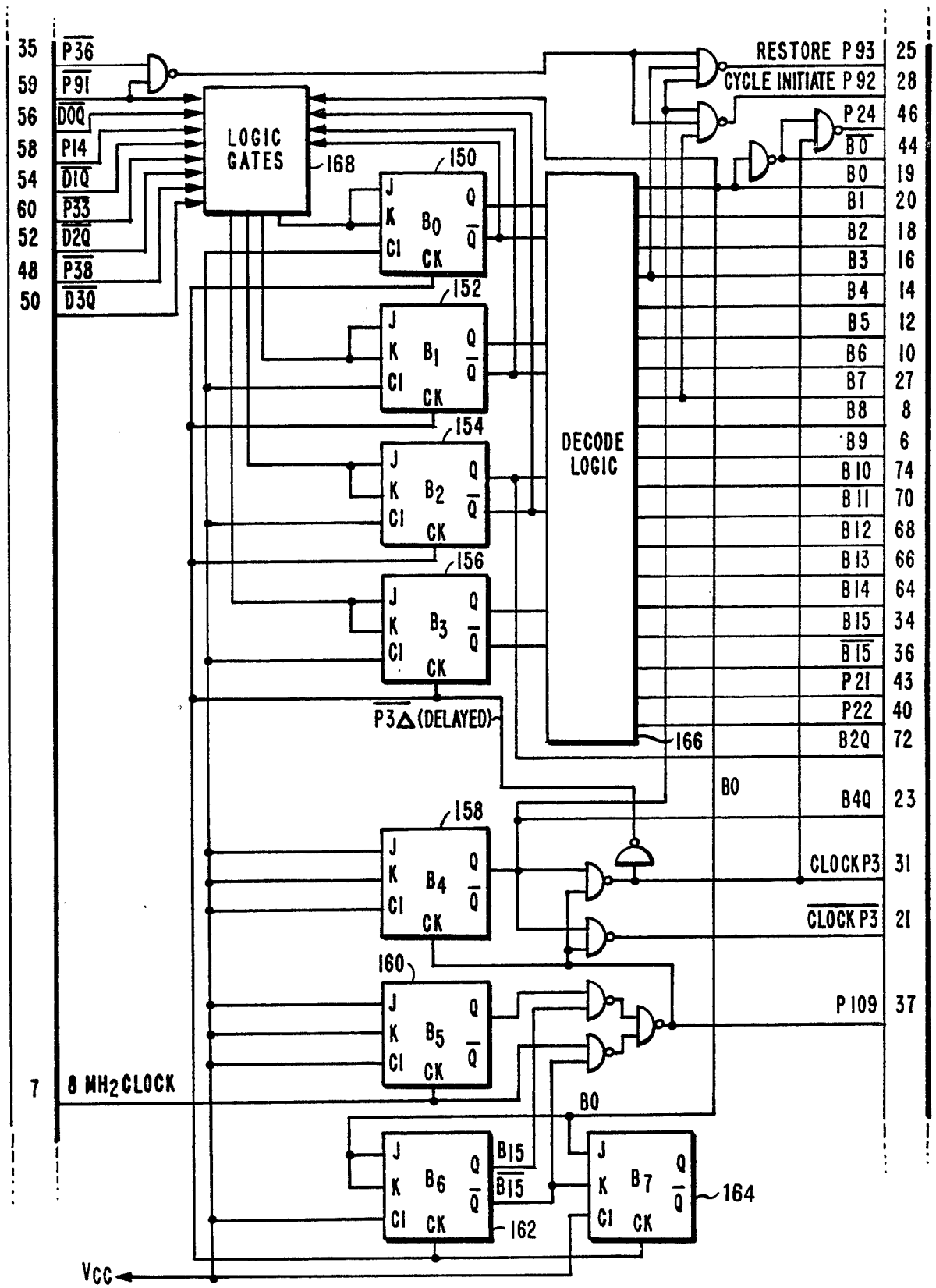
FIG. 7 is a schematic and block diagram representation of the B logic circuit board.
Figure 11:
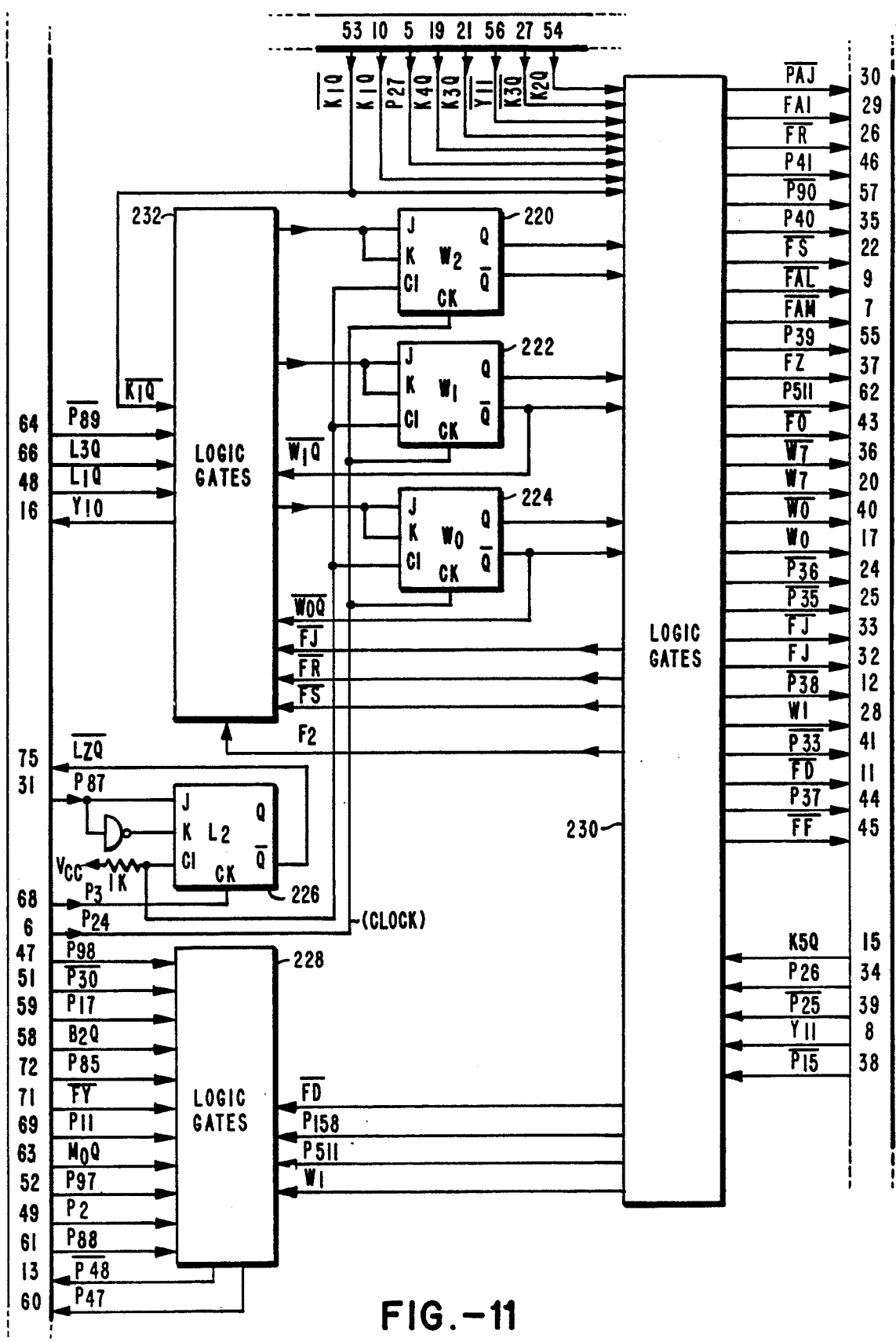
FIG. 11 is a schematic and block diagram representation of the W logic circuit board.

The basic timing functions of the data processor 12 are performed by a word timer 104 (FIG. 4) and $W_0$-$W_2$ (FIG. 11) and a bit timer 106 (FIG. 4) and $B_0$-$B_3$ (FIG. 7). The fundamental synchronization of the central processor 12 is provided by an 8 MHz clock signal (FIG. 7) which is included as part of the control logic 102. The synchronizing clock signal is an asymmetric squarewave, the positive portion of which is designated $P_3$ and the negative portion of which is designated $\bar{P}_3$. The asymmetrical character of the clock signal permits a longer clock period for stabilization of propogation delays without sacrifice of processing speed. The word timer 104 (FIG. 4) and $W_0$-$W_3$ (FIG. 11) is a three-bit counter $W_0$-$W_2$ (FIG. 11) with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104 (FIG. 4) and $W_0$-$W_2$ (FIG. 11). These output signals are used by the control logic 102 (FIG. 4) including logic gates 230 (FIG. 11) for sequencing the data processor through the micro operations associated with an instruction. The bit timer 106 (FIG. 4) and $B_0$-$B_3$ (FIG. 7) is a four-bit binary counter $B_0$-$B_3$ (FIG. 7) with associated decode logic. The bit timer 106 (FIG. 4) and $B_0$-$B_3$ (FIG. 7 counts down from 15 thru 0 and consequently the associated decode logic 166 (FIG. 7) has 16 output lines $B_0$-$B_{15}$ (FIG. 7), each going true during a different one of the 16 possible counts of the bit timer 106 (FIG. 4) and $B_0$-$B_3$ (FIG. 7). The bit timer 106 (FIG. 4) and $B_0$-$B_3$ (FIG. 7) provides sequencing and timing within a given micro operation or word time.

An accumulator (A-register) 108 (FIG. 4) and 130 (FIG. 6A) is the basic arithmetic register and is used as the repository of the results of arithmetic and logical operations. It is also the source and destination of the input/output (I/O) parameters. The A-register 108 (FIG. 4) and 130 (FIG. 6A) is a 16-bit serial in, serial out shift register. Associated with the A-register 108 (FIG. 4) and 130 (FIG. 6A) is a serial full adder 132 (FIG. 6A) which in FIG. 4 is included within the control logic 102.

A scratch pad memory (SPM) 110 (FIGS. 4 and 12) provides storage for intermediate parameters such as computational results, return addresses, indexes and other pertinent information. The SPM 110 (FIGS. 4 and 12) provides rapid internal storage without the need for transferring data to the main memory 30. It is a group of 32 16-bit serial in, serial out registers which are divided into two pages with 16 registers 234 (FIG. 12) on each page. Paging is accomplished by toggling the $I_1$ flip-flop (FIG. 13) which is automatically set to page 0 when the power is turned on. When the SPM 110 (FIGS. 4 and 12) is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is automatically assumed and need not be programmed in conjunction with the TX instruction. The $SPM_2$ register is used for the return address associated with the execution of transfer-type instructions. In addition, the $SPM_2$ register is used as the intermediate register for operands obtained from the constant memory portion of the main memory. The first eight SPM registers can be used for index or TX instructions in addition to scratch pad operations.

Figure 6A:
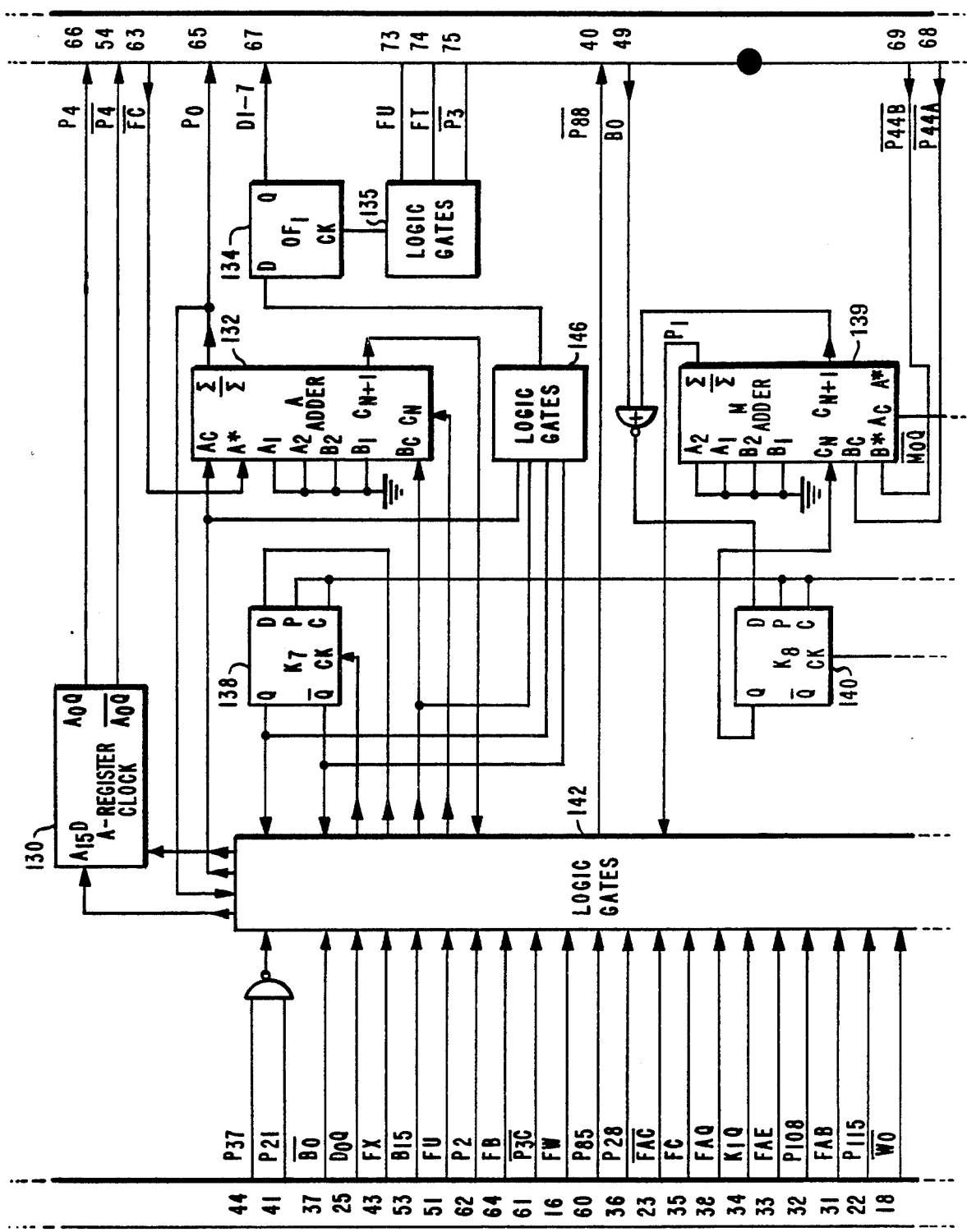
FIGS. 6A and 6B (herein called FIG. 6) is a schematic and block diagram representation of the A logic circuit board.
Figure 6B:
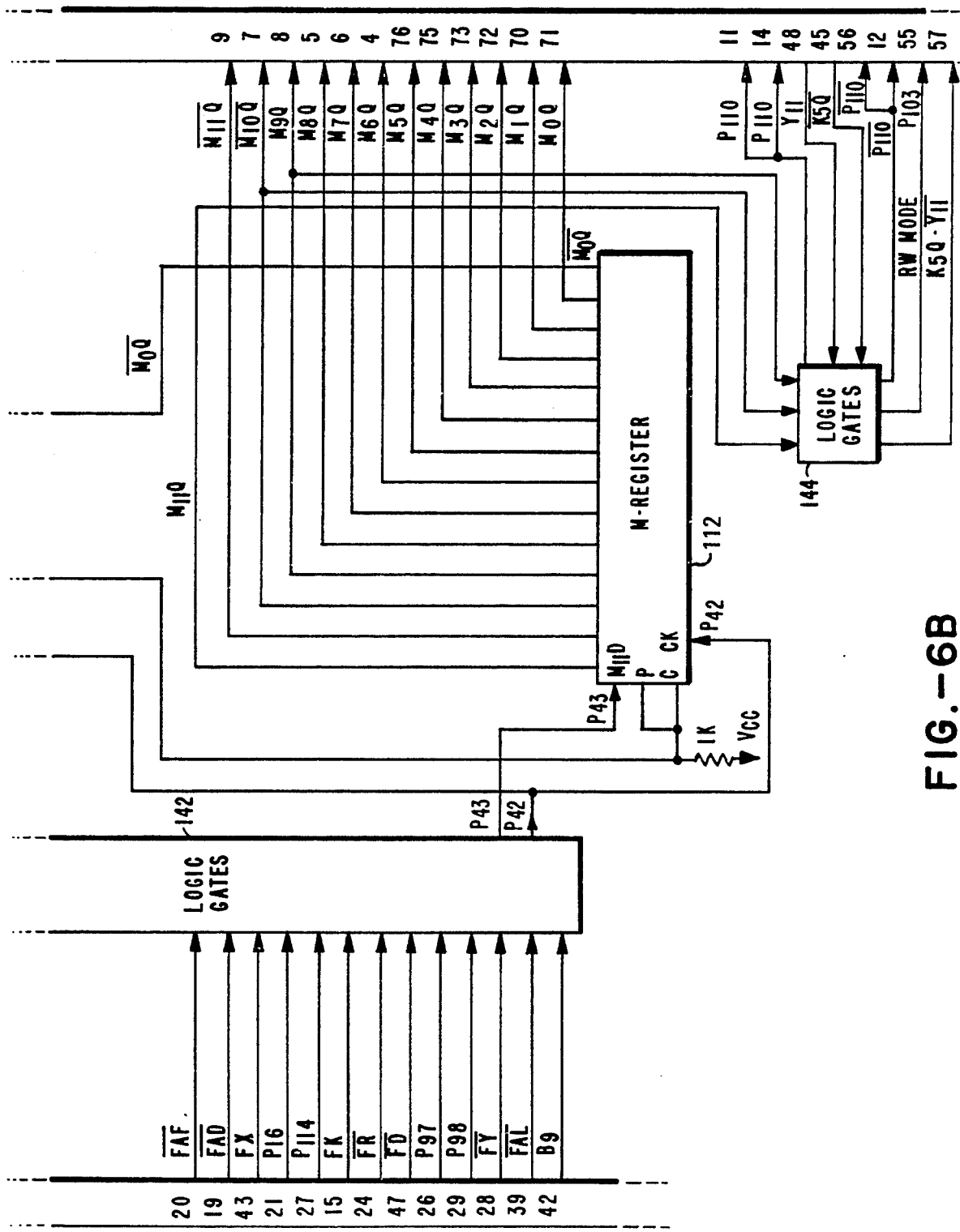

A memory address register (M-register) 112 (FIGS. 4 and 6B) holds the 12-bit address of $M_0Q$-$M_9Q$, $\overline{M_{10}Q}$ and $\overline{M_{11}Q}$ (FIG. 6B) of an eight-bit byte to be accessed from the program memory. The M-register 112 (FIGS. 4 and 6B) is a 12-bit shift register having the capacity to address up to 4,096 different memory locations. It has a serial input $M_{11}D$ (FIG. 6B) and both serial and parallel outputs $M_0Q$-$M_9Q$, $\overline{M_{10}Q}$ and $\overline{M_{11}Q}$ (FIG. 6B). Associated with the M-register 112 (FIGS. 4 and 6B) but represented as being within the control logic 102 is a serial full adder 139 (FIG. 6A) which increments the M-register 112 (FIGS. 4 and 6B) to access sequential instructions or, as applicable, the next two bytes of in-line instructions. The M-register 112 (FIGS. 4 and 6B) is incremented by two for a TX instruction when the condition for that transfer is not met, resulting in a skip of two bytes. The M-register 112 (FIGS. 4 and 6B) is incremented by three for a skip-on-discrete (SD) instruction. The M-register 112 (FIGS. 4 and 6B) is exchanged with the $SPM_2$ register for transfer-type instructions and exchanged with a data address register (D-register) 114 (FIG. 4) and 186 (FIG. 9) to access operands from the main memory. The M-register 112 (FIGS. 4 and 6B) is also exchanged with the $SPM_2$ register at the start of an ST instruction which causes the contents of the A-register 108 (FIG. 4) and 130 (FIG. 6A) to be stored in the main memory when implemented with a core memory.

The data address register (D-register) 114 (FIG. 4) and 186 (FIG. 9) is a 12-bit shift register 186 (FIG. 9) that usually contains an operand address and is used to select: (a) SPM register, (b) I/O channel, and (c) number of shifts, depending upon the type of instruction being executed. The D-register 114 (FIG. 4) and 186 (FIG. 9) has a serial input $D_{11}$ (FIG. 9) and serial output $D_0Q$ (FIG. 9), with the eight least significant bits $D_0Q$-$D_7Q$ (FIG. 9) having parallel outputs in addition.

A C-register 116 (FIG. 4) is composed of six flip-flops designated $C_3$, $C_2$, $C_1$, $C_0$, $K_{11}$, and $K_{10}$ (FIG. 8) which store the six most significant bits of an eight-bit instruction byte obtained from program memory. The flip-flops $C_3$ through $K_{10}$ store the instruction bits designated $I_7$, $I_6$ (included in the P111 signal), $I_5$, $I_4$, $I_3$ and $I_2$, respectively as received from the main memory interface lines (I). These instruction bits are held by the C-register 116 (FIGS. 4 and 8) during the performance of an instruction to control the sequence of micro operations executed during the performance of the instruction.

Figure 8:
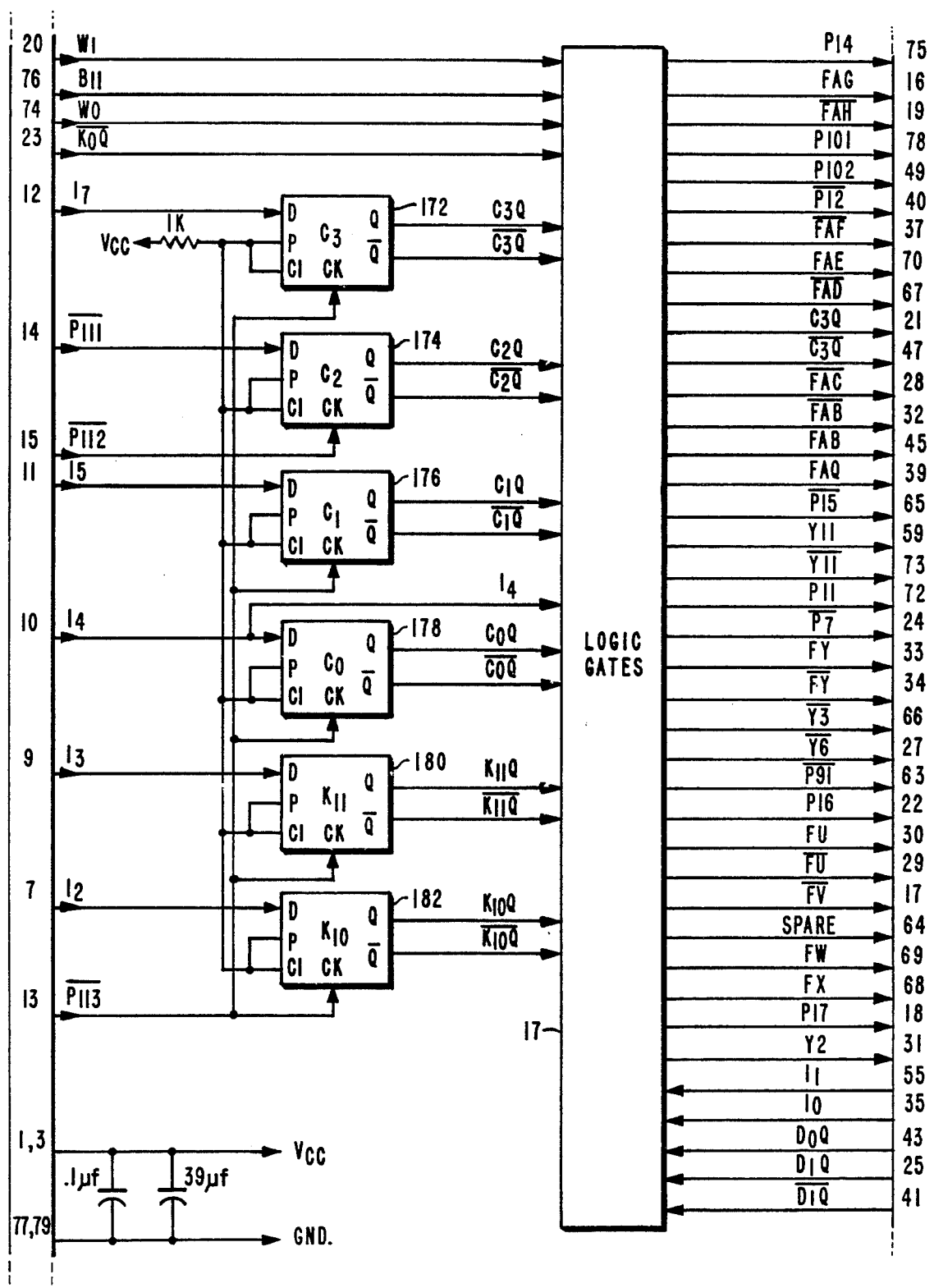
FIG. 8 is a schematic and block diagram representation of the C logic circuit board.

An element designated K-register 118 (FIGS. 4 and 10) is a group of miscellaneous flip-flops for various functions. The $K_0$, $K_1$ and $K_2$ flip-flops (FIG. 10) are used to control sequencing through the micro operations. The $K_1$ flip-flop is also used to store the sign of the operand in the A-register 108 (FIG. 4) and 130 (FIG. 6A) and the sign of a decremented number during a TX instruction. The $K_2$ flip-flop is also used to extend the A-register during a shift left operation where the $K_2$ register acts as the $A_{-1}$ stage of the A-register. The $K_3$, $K_4$, and $K_5$ flip-flops (FIG. 10) may be grouped together and designated the KA-register and may be used to store the address of the index. The KA-register is also used as an extension of the A-register during a shift left operation with $K_3$ as the $A_{-1}$ stage, $K_4$ as the $A_{-3}$ stage, and $K_5$ as the $A_{-4}$ stage of the A-register 108 (FIG. 4) and 130 (FIG. 6A). The K flip-flop 138 (FIG. 6A) is used as a carry flip-flop in conjunction with the A-register 108 (FIG. 4) and 130 (FIG. 6A) full adder 132 (FIG. 6A). It is also used in the FK micro operation in the transfer of the D-register 114 (FIG. 4) and 186 (FIG. 9) contents to the M-register 112 (FIGS. 4 and 6B) as a shift left operation to multiply the D-register word address by two to obtain the M-register byte address. The $K_8$ flip-flop 140 (FIG. 6A) is used as a carry flip-flop in conjunction with the M-register full adder 139 (FIG. 6A). As previously described, the $K_{10}$ and $K_{11}$ flip-flops 182 and 180 (FIG. 8) form the two least significant bits of the C-register 116 (FIGS. 4 and 8).

An element designated L-register 120 (FIG. 4) is, like the K-register 118 (FIGS. 4 and 10), a group of miscellaneous flip-flops performing control functions. The most significant is the $L_1$ flip-flop 210 (FIG. 10) which controls turn-on and turn-off of the data processor.

Input/output (I/O) channels 122 (FIGS. 4 and 13) include whole number and discrete channels. The whole number channels connect the A-register 108 (FIG. 4) and 130 (FIG. 6A) with the various entities and extremities. The whole number I/O channels 122 (FIGS. 4 and 13) are arranged in pairs so that as the output from the least significant bit ($A_0Q$) (FIGS. 6A and 13) of the A-register 108 (FIG. 4) and 130 (FIG. 6A) shifts information to an output channel (OW) with a corresponding input channel (IW) simultaneously shifting information into the A-register 108 (FIG. 4) and 130 (FIG. 6A) through the input to the most significant bit ($A_{15}D$) (FIG. 6A).

A data path 124 provides two-way communication between the data processor and the main memory. This path carries the main memory address stored in the M-register and transfers operands to or from the main memory.

Micro-Operations

Figure 5A:
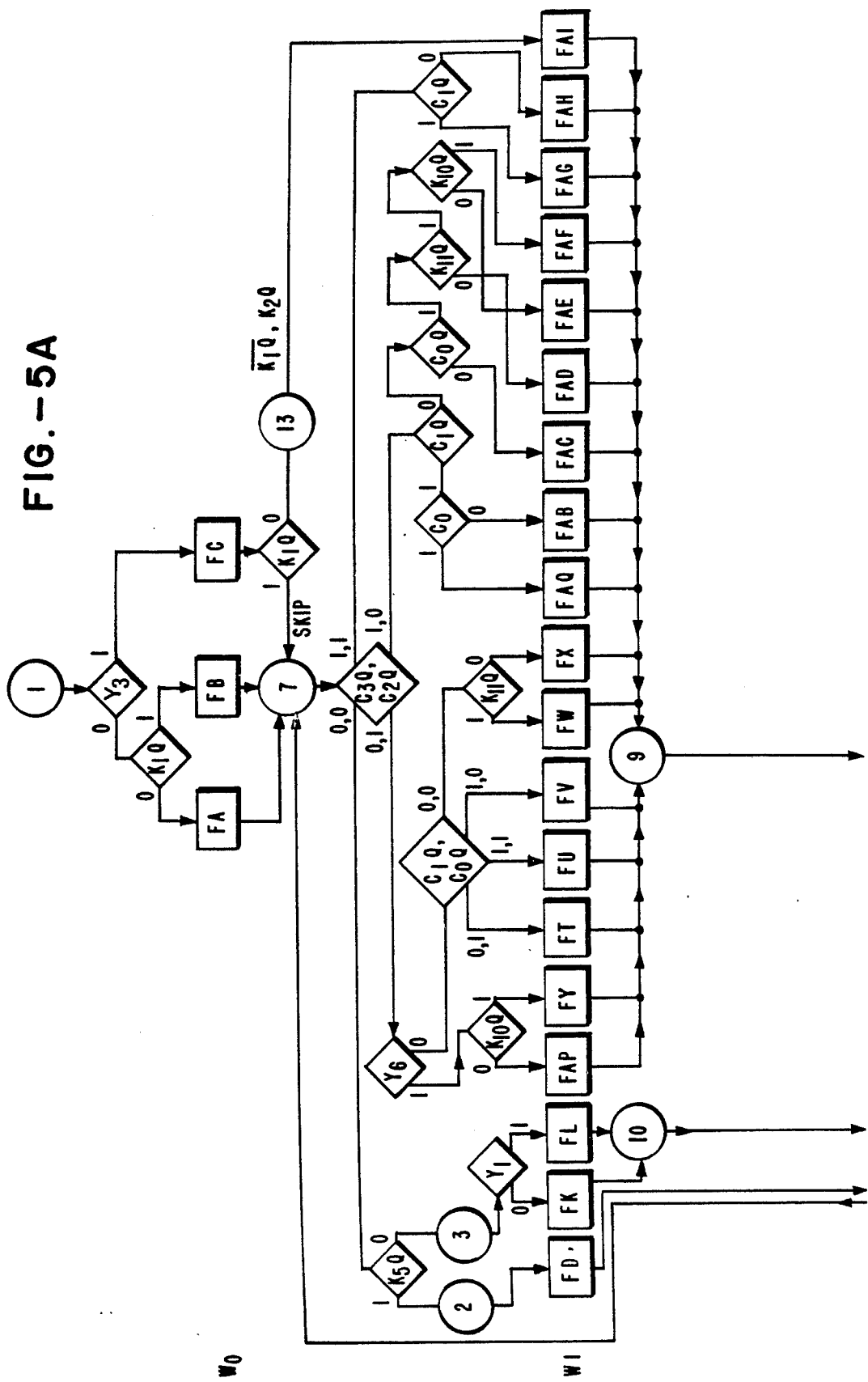
FIGS. 5A and 5B (herein called FIG. 5) illustrates a micro-operation flow chart for the data processor shown in FIG. 4.
Figure 5B:
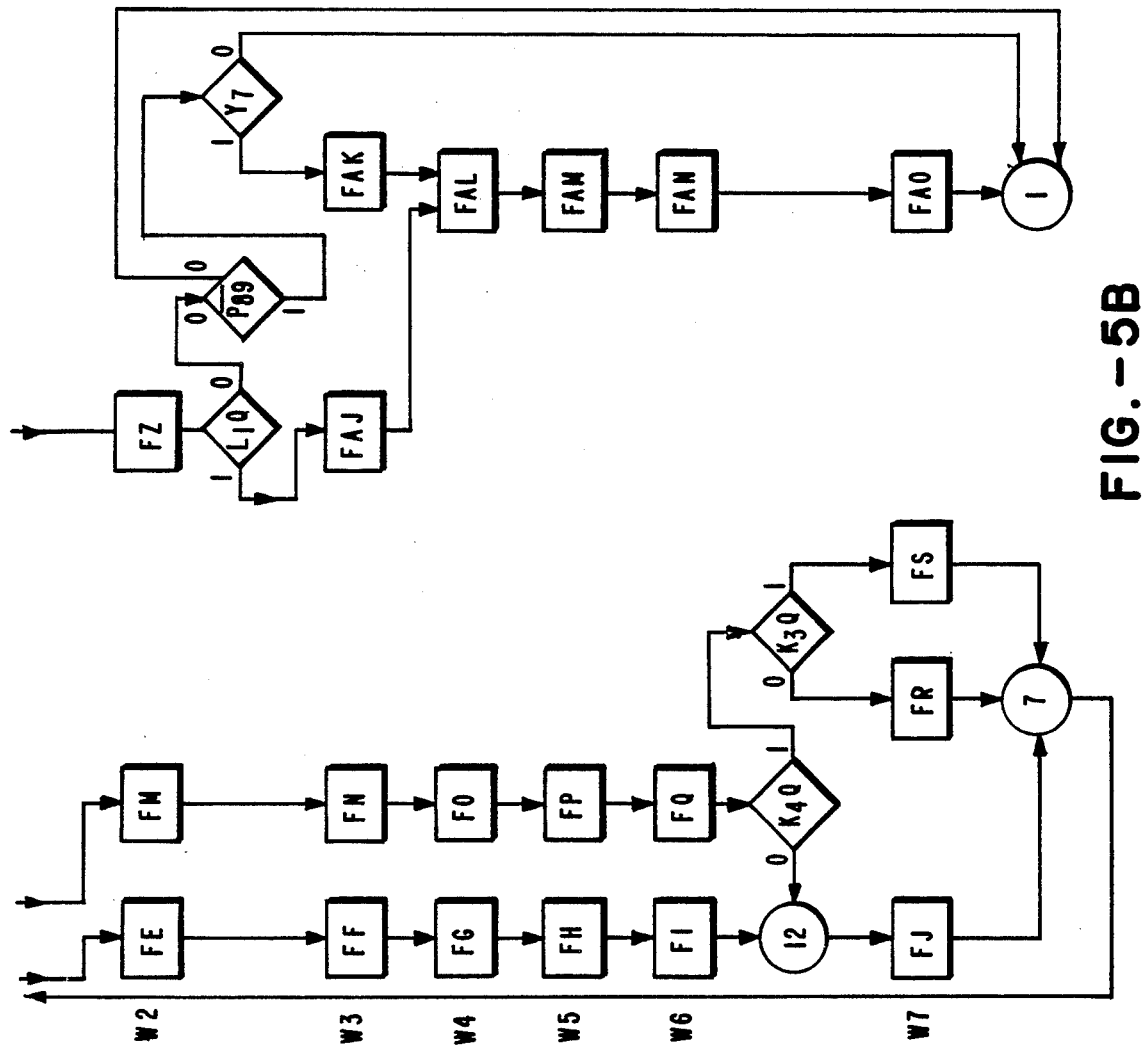

The operation of the data processor in carrying out an instruction can best be understood by examining the micro-operation flow chart shown in FIG. 5. The small rectangles represent micro-operations in accordance with the letter designation therein and the diamonds represent alternative conditions. If the condition or function contained within a diamond is true, the path designated 1 is taken. Otherwise, the path designated 0 is taken. The micro-operations are arranged in parallel rows according to the word time in which they occur. For instance, the FA, FB and FC micro-operations occur in word time W0, while the row of micro-operations beginning with FD and FK occur during the W1 word time. Each micro-operation consists of one or more bit times to define the number of clock pulses used to execute that micro-operation. The word and bit times are presented with the following description of each micro-operation and summarized in Table V. The circled numbers are provided as references for ease of understanding and discussion.

During the execution of a program instruction, the data processor begins at point 1 at the top center of FIG. 5. The first branch condition is $$Y3 = \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0}$$

which represents the operation code for a TX instruction. If this term is true, the FC micro-operation is performed; if not true, a second control condition is tested. If flip-flop $K_1$ is in the 0 state, the FA micro-operation is executed and if it is in the 1 state, the FB micro-operation is executed. In similar fashion, a series of micro-operations are executed in accordance with the programmed instruction until the micro-operation FZ is completed. At this point the power-interrupt flip-flop $L_1$ determines whether or not the execution of programmed instructions continues to reference point 1. If the $L_1$ flip-flop is in the 1 state indicating an interrupt, a series of micro-operations is entered which place the return address in $SPM_2$ and loads the interrupt routine address into the M-register. If the $L_1$ flip-flop is in the 0 state indicating a non-interrupt condition, the processor returns to point 1 and begins the execution of another program instruction unless an X5 signal indicates that there is an external interrupt. If there is an external interrupt, the data processor ignores it, returning to point 1 unless the interrupt override flip-flop $L_3$ is true and the flip-flop $K_1$ is in the false state.

Each micro-operation will now be described in detail including the logical equations (summarized in Table III) which determines whether a micro-operation is true or false, the word time in which it occurs (summarized in Table V), the bit times in each micro-operation (summarized in Table V), a brief written description of the micro-operation, and a shorthand notation of what functional operations are performed by each micro-operation. In describing the micro-operations and throughout this application, a flip-flop or register bit designation followed by a Q indicates an output. If there is no bar over the term, the true or 1 state of the output is indicated; and if there is a bar over the term, the 0 or false state of the output is indicated. Similarly, a flip-flop or register bit designation followed by a D, T. J, or K indicates the input to the designated flip-flop and the flip-flop synchronizing clock pulse input is designated "clock". For instance, the term $L_1T$ indicates the toggle input to the $L_1$ flip-flop while the term $\overline{A_0Q}$ indicates a 0 or false output from the $A_0$ bit of the A-register which is the least significant bit. In addition, the following commonly used symbols will be used throughout this application:

| Symbol | Description of Symbol |
|---|---|
| ( ) | Parentheses denote contents of a register. |
| [ ] | Square brackets denote a portion of a register, the contents of which has a functional dependence upon a register. Thus I[D] means instruction part of the D-Register. Op[D] means operation part of D-Register. Ad[M] means address part of M-Register. Sn[A] and Mg[A] means sign and magnitude parts of A-Register, respectively. |
| M<A> | This symbol denotes a location of a memory word addressed by the A-Register. |
| (M<A>) | This symbol denotes the contents of a memory word addressed by the A-Register. |
| → | Denotes transfer of a word from one register to another. Thus, (A)→M means that the contents of the A-Register is transferred to the M-Register. (A)→PM<M> means that the contents of the A-Register is transferred to the program memory location addressed by the M-Register. |
| + | This symbol represents a logical-OR operation. |
| . | This symbol represents a logical-AND operation. |
| : | Colon following a variable (representing a state or the command) denotes the occurrence of the subsequent statement when the value of the variable is 1. |
| PM | Program (main) memory which may be a core memory or an ROM. |
| SPM | Scratch pad memory. |

A detailed description of each micro-operation follows.

$FA = W0 \cdot \overline{K_1Q} \cdot (\overline{B15 \cdot Y3 + K_2Q})$    The FA micro-operation occurs in the W0 word time and has a length of 16 bit times. It is used for all instructions that are not preceded by an index byte nor are TX (decrement and transfer) instructions. The following operations take place during this micro-operation:

(M)+1→M at B11 thru B0    The address in the M-Register is incremented by 1 in the last 12 bit times to eliminate a race, if a ROM is used, with the scanout of the instruction bits ($I_i$) from the memory instruction register into the D-Register.

Ad[I]→D at B15 thru B11

If dynamic MOS-FET type integrated circuits are used, they are refreshed by recirculation at bit times B15 thru B0.

Sn[A]·$C_3Q$→$K_1$ at B0   The A-Register is recirculated to refresh it if MOS-FET type integrated circuits are used and to make the sign bit, which is the most significant bit, available to $K_1$ in case $C_3Q$ is true.

0→$K_3,K_4,K_5$ at B0

0→$K_8$ at B0   This is the M carry flip-flop which is used to increment the address in the M-Register during this micro-operation and it is reset at B0.

$FB = W0 \cdot K_1Q \cdot (\overline{B15 \cdot Y3} + K_2Q)$   The FB micro-operation occurs during the W0 word time and has a duration of 16 bit times. It is used for all instructions preceded by an index byte with the exception of the TX (decrement and transfer) instruction. The following operations take place during this micro-operation:

(M)+1→M at B11 thru B0   The address stored in the M-Register is incremented during the last 12 bit times to eliminate a race, if a ROM is used, with the scanout of the contents of the memory instruction register (I) into the D-Register.

Ad[I]+(SPM<$K_3,K_4,K_5$>)→D at B15 thru B0   This operation clocks the index which was stored in the designated SPM-Register, causing it to be added to the instruction operand address. The sum is loaded into the D-Register.

$C_3Q$: Sn[A]→$K_1$ at B0   The A-Register is recirculated to refresh if dynamic MOS-FET type integrated circuits are used and to clock the sign bit of the A-Register, which is the most significant bit, into the $K_1$ flip-flop.

0→$K_3,K_4$ at B0

Y2→$K_5$ at B0   The $K_3$, $K_4$ and $K_5$ flip-flops hold the address of the selected SPM-Register during this micro-operation and are reset at the end. The Y terms are defined in Table II.

0→$K_7$ at B0   This is the A carry flip-flop which is not used during this micro-operation.

0→$K_8$ tp B0   This is the M carry flip-flop which is used to increment the address stored in the M-Register and is reset at B0.

$FC = W0 \cdot (\overline{B15 \cdot C_3Q \cdot C_2Q} \cdot C_1Q \cdot \overline{C_0Q \cdot K_{11}Q} \cdot K_{10}Q \cdot I_1 \overline{I_0} + K_2Q)$   The FC micro-operation occurs during the W0 word time and has a duration of 16 bit times. It is used for all TX (decrement and transfer) instructions. The operations executed during this micro-operation are as follows:

(M)+1→M at B11 thru B0   The address in the M-Register is incremented in the last 12 bit times to eliminate a race, if a ROM is used, with the scanout of the instruction bits ($I_i$) from the memory instruction register into the D-Register.

Ad[I]→D at B15 thru B11   The address portion of the memory instruction register (I) is scanned into the D-Register during the last six bit times.

The SPM-Registers are circulated to refresh them if dynamic MOS-FET type integrated circuits are used.

0→$K_3,K_4,K_5$ at B0   These flip-flops hold the address of the index register during this micro-operation and are reset at B0.

0→$K_7$ at B0   This is the A-Register carry flip-flop and is reset at B0.

0→$K_8$ at B0   This is the M-Register carry flip-flop and is reset at B0.

$FD = \overline{C_3Q} \cdot \overline{C_2Q} \cdot K_5Q \cdot W1$   The FD micro-operation occurs at word time 1 and has a duration of 12 bit times. It is used for a core memory ST (store) instruction. The operations executed during this micro-operation are as follows:

(SPM<2>)$_{lsb}$→M at B11 thru B0   The 12 least significant bits of the SPM-2 Register are clocked into the M-Register as these two registers are interchanged.

(M)→SPM<2> at B11 thru B0   The contents of the M-Register is clocked into the 12 most significant bit positions of the SPM-2 Register as part of the interchange of these two registers.

(A)$_{lsh}$→$A_{msh}$ at B11 thru B4

(A)$_{lsh}$→$D_{msb}$ at B11 thru B4

(A)$_{msh}$→$A_{lsh}$ at B11 thru B4   During the first eight bit times the A-Register is half circulated, moving the most significant half (msh) to the least significant half (lsh) and the least significant half to the most significant half. At the same time, the contents of the least significant half of the A-Register are transferred to the eight most significant bit positions (msb) of the D-Register.

0,0,0,0→D at B3 thru B0   During the last four bit times, the operand stored in the most significant bit positions of the D-Register are shifted into the least significant bit positions and four zeros are shifted into the D-Register.

$FE = \overline{C_3Q} \cdot \overline{C_2Q} \cdot K_5Q \cdot W2$   The FE micro-operation occurs during the W2 word time and has a duration of eight bit times. It is used for a core memory ST (store) instruction. The operations executed within this micro-operation are as follows:

(D)$_{lsb}$→PM<M> at B7 thru B0

Write Strobe at B7   This write strobe at the beginning of the micro-operation permits the eight least significant bits of the D-Register to be clocked into the memory as they are clocked out of the D-Register.

0→SPM<2> at B7 thru B4   The contents of the M-Register transferred to the most significant bit positions during the FD micro-operation are shifted into the 12 least significant bit positions.

$FF = \overline{C_3Q} \cdot \overline{C_2Q} \cdot K_5Q \cdot W3$   The FF micro-operation occurs during the W3 word time and has a duration of 1 bit time. It is used to fill out the word times and no operations take place during this micro-operation.

$FG = \overline{C_3Q} \cdot \overline{C_2Q} \cdot K_5W \cdot W4$   The FG micro-operation occurs during the W4 word time and has a duration of 12 bit times. It is used with a core memory ST (store) instruction and loads the second operand byte into the D-Register while incrementing the M-Register to address the main memory location where the second byte is to be stored. The operations performed within this micro-operation are as follows:

(M)+1→M at B11 thru B0

(A)$_{lsh}$→$A_{msh}$ at B11 thru B4   This completes the recirculation of the A-Register begun in the FD micro-operation.

(A)$_{lsh}$→$D_{msb}$ at B11 thru B4   As recirculation of the A-Register is completed, the second byte of the operand is recirculated and shifted into the most significant bit positions of the D-Register.

0→D at B3 thru B0   The second byte of the operand is shifted into the eight least significant bit positions and zeros are shifted into the most significant bit positions of the D-Register.

$0 \rightarrow K_8$ at B0   This is the M carry flip-flop which is reset after the M-Register is incremented.

$FH = \overline{C_3Q} \cdot \overline{C_2Q} \cdot K_5Q \cdot W5$   The FH micro-operation occurs during the W5 word time and has a duration of eight bit times. It is a continuation of a core memory ST (store) instruction and places the second byte of the operand into core memory. The operations executed during this micro-operation are as follows:

Write Strobe at B7

$(D)_{lsb} \rightarrow PM<M>$ at B7 thru B0   Following a Write Strobe, the second byte of the operand is shifted from the D-Register into the location in core memory addressed by the M-Register.

$FI = \overline{C_3Q} \cdot \overline{C_2Q} \cdot K_5Q \cdot W6$   The FI micro-operation occurs during the W6 word time and has a duration of eight bit times. It is used to fill out the eight word times of a core memory ST (store) instruction cycle and no functions are executed.

$FJ = \overline{C_3Q} \cdot \overline{C_2Q} \cdot (\overline{K_4Q} + K_5Q) \cdot W7$   The FJ micro-operation occurs during the W7 word time and has a duration of 12 bit times. This micro-operation sets the necessary control flip-flops to cause the FY or FAP micro-operations to be executed next. The functions executed are:

$0001 \rightarrow D_3D_2D_1D_0$ at B12 thru B0   This makes Y6 true so that the proper branch will be followed after point 7 on the micro-operation flow chart, FIG. 5.

$1 \rightarrow C_2$ at B0   This sets the $C_3$, $C_2$ flip-flops to the 0, 1 state causing the proper micro-operation flow path to be followed after point 7 of the micro-operation flow chart, FIG. 5.

$0 \rightarrow K_1, K_2, K_3, K_4, K_5$ at B0

$0,0,1 \rightarrow W_2, W_1, W_0$ at B0   The word timer is set to word time 1 to cause the next micro-operations executed to be the FAP and FY micro-operations which follow.

$FK = \overline{C_3Q} \cdot \overline{C_2Q} \cdot K_5Q \cdot \overline{(B11 \cdot Y1 + K_3Q)} \cdot \overline{FAI}$.   The FK micro-operation occurs in the W1 word time and has a duration of 12 bit times. It is used exclusively for the instructions that obtain the operand or transfer address from program memory. This micro-operation is used during the DP, BP, XP, and AP instructions that obtain the operand from the constant memory portion of the program memory. This micro-operation is used to place the operand word address, multiplied by two to provide the operand byte address, in the M-Register and to preserve the next instruction-address in the D-Register. The operations which are executed are as follows:

$(D) \rightarrow K_7$ at B11 thru B0

$(K_7) \rightarrow M$ at B11 thru B0

$(M) \rightarrow D$ at B11 thru B7   The effect of these three transfers is to exchange the contents of the D- and M-Registers. By shifting the contents of the D-Register indirectly through the $K_7$ flip-flop to the M-Register, the contents of the M-Register is shifted 1 bit to the left (multiplied by 2) and the most significant bit is stored in the K flip-flop at the end of this micro-operation. This multiplication by 2 converts a word address to a byte address.

$FL = \overline{C_3Q} \cdot \overline{C_2Q} \cdot K_5Q \cdot (B11 \cdot Y1 + K_3Q( \cdot W1$   The FL micro-operation occurs in word time 1 and has a duration of 1 bit time. It sets selected flip-flops to control subsequent micro-operations. The operations executed are:

$0 \rightarrow K_1$ at B0

$1 \rightarrow K_3$ at B0

$Yr \rightarrow K_4$ at B0

$FM = \overline{C_3Q} \cdot \overline{C_2Q} \cdot \overline{K_5Q} \cdot \overline{K_1Q} \cdot W2$   The FM micro-operation occurs at word time 2 and has a duration of 8 bit times. It is used to access a first of the two bytes for the instructions that use the FK or FL micro-operations. The operations executed are as follows:

Read Strobe at B7

$(PM<M>) \rightarrow I$

Restore Strobe at B3

$FN = \overline{C_3Q} \cdot \overline{C_2Q} \cdot \overline{K_5Q} \cdot K_1Q \cdot W3$   The FN micro-operation occurs at word time 3 and has a duration of eight bit times. It causes an eight-bit byte accessed from the program memory in the FM micro-operation to be scanned out of the memory data lines (I) into the SPM-2 Register. The operations executed are as follows:

$(I) = \rightarrow SPM<2>_{msh}$ at B7 thru B0

$(SPM<2>_{msh}) \rightarrow SPM<2>_{lsh}$ at B7 thru B0   These steps scan the contents of the I lines into the most significant half of the SPM-2 Register and the most significant half of the SPM-2 Register into the least significant half of the SPM-2 Register.

$FO = \overline{C_3Q} \cdot \overline{C_2Q} \cdot \overline{K_5Q} \cdot \overline{K_1Q} \cdot W4$   The FO micro-operation occurs in word time 4 and has a duration of 12 bit times. It is used to increment the M-Register to permit the second of the two bytes to be accessed from program memory. This operation can be executed simultaneously with the FN micro operation if a core memory is used, but is performed after the FN micro-operation to permit a ROM to be used in place of a core memory. The operations executed are as follows:

$(M) + 1 \rightarrow M$ at B11 thru B0

$0 \rightarrow K_8$ at B0   The M carry flip-flop is used to increment the M-Register and then reset at the end of this micro-operation.

$FP = \overline{C_3Q} \cdot \overline{C_2Q} \cdot \overline{K_5Q} \cdot \overline{K_1Q} \cdot W5$   The FP micro-operation in word time 5 and has a duration of eight bit times. It is used to access the second byte from program memory. The operations executed are as follows:

Read Strobe at B7

$(PM<M>) \rightarrow I$

Restore Strobe at B3   This micro-operation transfers the second byte into the memory data lines (I) and then restores the information to the memory.

$FQ = \overline{C_3Q} \cdot \overline{C_2Q} \cdot \overline{K_5Q} \cdot K_1Q \cdot W6$   This micro-operation occurs in word time 6 and has a duration of eight bit times. The second byte is scanned out of the I lines and into the SPM-2 Register. The operations executed are as follows:

$(I) \rightarrow SPM<2>_{msh}$ at B7 thru B0

$(SPM<2>_{msh}) \rightarrow SPM<2>_{lsh}$ at B7 thru B0   These operations complete the transfer of the two bytes from memory into the SPM-2 Register.

$FR = \overline{C_3Q} \cdot \overline{C_2Q} \cdot \overline{K_5Q} \cdot K_4Q \cdot \overline{K_3Q} \cdot \overline{K_1Q} \cdot W7$   The FR micro-operation occurs in word time 7 and has a duration of 12 bit times. It is used to set the proper flip-flops to guide the data processor through subsequent micro-operations in executing the instruction. This operation could be executed simultaneously with the FQ micro-operation if a core memory is used, but is performed after the FQ micro-operation to permit a ROM to be used in place of a core memory. The operations executed are as follows:

$0,0,1,0 \rightarrow D$ at B11 thru B0   A binary 2 is shifted into the least significant bit positions of the D-Register to address the SPM-2 Register which contains the two operand bytes being processed.

$1 \rightarrow C_2$ at B0

$0,0 \rightarrow K_2, K_1$ at B0
$0,0,0 \rightarrow K_5, K_4, K_3$ at B0

$FS = C_3Q \cdot C_2Q \cdot K_5Q \cdot K_4Q \cdot K_3Q \cdot K_1Q \cdot W7$  The FS micro-operation occurs in word time 7 and has a duration of twelve bit times. It is used to set the proper flip-flop to guide the data processor through subsequent micro-operations in executing the instructions.

$0,0,1,0 \rightarrow D$ at B11 thru B0   A binary 2 is shifted into the least significant bit of the D-Register to address the SPM-2 Registers which store the two operand bytes.

$1 \rightarrow C_2$ at B0
$0,0 \rightarrow K_2, K_1$ at B0
$0,0,0 \rightarrow K_5, K_4, K_3$ at B0

$FT = " \cdot C_1Q \cdot C_0Q$   The FT micro-operation occurs in word time 1 and has a duration of 16 bit times. It is used to add the contents of the A-Register to the contents of an SPM-Register addressed by the D-Register which contains an operand and stores the sum in the A-Register. The contents of the SPM-Register are preserved. The executed operations are as follows:

$(A) + (SPM<D>) \rightarrow A$ at B16 thru B0
$(SPM<D>) \rightarrow SPM<D>$ at B16 thru B0
$(B0 \cdot C_{n+1}) \rightarrow K_0$ at B0   Any overflow from the addition operation is stored in the $K_0$ flip-flop.
$0 \rightarrow K$ at B0   The A adder carry flip-flop is used during this micro-operation and reset at B0.

$FU = Y38 \cdot C_1Q \cdot C_0Q$   The FU micro-operation occurs at word time 1 and has a duration of 16 bit times. It is used to subtract an operand stored in the SPM-Register from the contents of the A-Register and stores the difference in the A-Register. The contents of the SPM-Register are preserved. Subtraction is implemented by adding the contents of the A-Register to the ones complement of the operand in the SPM-Register and also adding a least significant bit to convert the ones complement to a twos complement number. The executed operations are as follows:

$(A) + \overline{(SPM<D>)} + (1 \times 2^{-n}) \rightarrow A$ at B16 thru B0
$(B0 \cdot C_{n+1}) \rightarrow K_0$ at B0   Store overflow.
$0 \rightarrow K_7$ at B0   The A adder carry flip-flop is used during this micro-operation and reset upon its completion.
$(C_n + 1) \rightarrow K_8$ at B0   The final carry term is stored in the carry flip-flop for the M adder $FV = Y38 \cdot C_1Q \cdot \overline{C_0Q}$   The FV micro-operation occurs in word time 1 and has a duration of 16 bit times. It is used for index instructions to transfer the address of the SPM-Register containing the operand from the D-Register to the $K_5$, $K_4$, and $K_3$ flip-flops. This makes the D-Register available for the operand address of the next instruction. The executed micro-operations are as follows:

$1 \rightarrow K_1$ at B0   The $K_1$ flip-flop is one set to identify an index byte. This will insure that the next instruction will be processed through the FB micro operation, which adds the contents of the selected SPM-Register (identified by the contents of the $K_5$, $K_4$, and $K_3$ flip-flops) to the operand address and stores the sum into the D-Register.

$(D_2, D_1, D_0) \rightarrow K_5, K_4, K_3$ at B0

$FW = Y38 \cdot \overline{C_1Q} \cdot \overline{C_0Q} \cdot K_{11}Q$   The FW micro-operation occurs in word time 1 and has a duration of 16 bit times. It is used to perform the logical AND operation between the contents of the A-Register and an operand stored in an addressed SPM-Register. The executed operations are as follows:

$(A) \cdot (SPM<D>) \rightarrow A$ at B15 thru B0
$(SPM<D>) \rightarrow SPM<D>$ at B15 thru B0

$FX = Y38 \cdot \overline{C_1Q} \cdot \overline{C_0Q} \cdot \overline{K_{11}Q}$   The FX micro-operation occurs in word time 1 and has a duration of 16 bit times. It is used to EXCLUSIVE-OR the contents of the A-Register and an operand stored in an addressed SPM-Register and store the results in the A-Register. The contents of the addressed SPM-Register are preserved.

$(A) \oplus (SPM<D>) \rightarrow A$
$(SPM<D>) \rightarrow SPM<D>$ $FY = C_3\overline{Q} \cdot C_2Q \cdot C_1Q \cdot C_0Q \cdot K_{11}Q \cdot K_{10}Q \cdot D_0Q \cdot W1$ The FY micro-operation occurs in word time 1 and has a duration of 16 bit times. It is used during transfer type instructions. The next instruction address, contained in the SPM-2 Register, is exchanged with the return address from the M-Register. Thus, the next instruction address for the transfer is placed in the M-Register and the return address is placed in the SPM-2 Register. The executed operations are as follows:

$(SPM<2>)_{lsh} \rightarrow M$ at B15 thru B4
$(M) \rightarrow SPM<2>_{lsb}$ at B15 thru B4
$0 \rightarrow SPM<2>_{msb}$ at B3 thru B0

$FZ = (C_3Q + C_2Q) \cdot W2$   The FZ micro-operation occurs in word time 2 and has a duration of eight bit times. It is used to access the next program instruction from the memory. The executed operations are as follows:

Read Strobe at B7
Restore Strobe at B3
$Op[I] \rightarrow C$ at B0
$C_3Q \cdot L_1Q \cdot \overline{(K_1Q + \text{interrupt})} : 0 \rightarrow K_1$ at B0
$L_1Q + K_1Q \cdot \text{interrupt} : 1 \rightarrow K_1$ at B0
$0 \rightarrow K_2$ at B0
$C_3Q : 0,0,0 \rightarrow K_5, K_4, K_3$ at B0
$I_3, I_2 \rightarrow K_{11}, K_{10}$ at B0

$FAB = C_3Q \, \overline{C_2Q} \, C_1Q \, \overline{C_0Q} \, W1$   The FAB micro-operation occurs in word time 1 and has a duration of 16 bit times. The contents of the A-Register are shifted to a selected output channel while the contents of a selected input channel are simultaneously shifted into the A-Register. Executed operations are as follows:

$(A) \rightarrow I/O<D>$ at B15 thru B0
$(I/O<D>) \rightarrow A$ at B15 thru B0

$FAC = C_3Q \cdot \overline{C_2Q} \cdot \overline{C_1Q} \cdot \overline{C_0Q} \cdot W1$   The FAC micro-operation occurs at word time 1 and has a duration of 16 bit times. It is used to store the contents of the A-Register in an addressed SPM-Register. The executed operations are as follows:

$(A) \rightarrow SPM<D>$ at B15 thru B0
$(A) \rightarrow A$ at B15 thru B0   The A-Register is recirculated.
$Sn[A] \rightarrow K_1$ at B0   The sign of the operand stored in the A-Register, which is the most significant bit, is placed in the $K_1$ flip-flop but not used.

$FAD = C_3Q \cdot \overline{C_2Q} \cdot \overline{C_1Q} \cdot C_0Q \cdot \overline{K_{11}Q} \cdot W1$   The FAC micro-operation occurs in word time 1 and has a duration of 16 bit times. It is used for a shift lift operation on the A-Register and is implemented by extending the least significant portion of the A-Register with flip-flops $K_2$, $K_3$, $K_4$ and $K_5$. The A-Register is then shifted right for 16 bit times through these extra four flip-flops. The number of shifts left is selected and implemented by recirculating the output from a selected K flip-flop back to the input of the A-Register. This effectively increases the recirculation path by the required number of bit time delays thereby implementing a left shift after the 16 clock pulses. For instance, if the output of the second flip-flop ($K_3Q$) is selected, the contents will be shifted left two positions, and if the third flip-flop ($K_4$) is selected, the output will be shifted left three positions. For the left shift, the sign bit is shifted into the least significant bit of the A-Register by preloading the $K_2$-$K_5$ flip-flops with the sign bit contained in the $K_1$ flip flop. The executed operations are as follows:

($K_1Q$)→$K_2$-$K_5$ at B15
($A_i$)→$A_i$−1 at B15 thru B0
($A_0Q$)→$K_2$ at B15 thru B0
($K_2Q$)→$K_3$ at B15 thru B0
($K_3Q$)→$K_4$ at B15 thru B0
($K_4Q$)→$K_5$ at B15 thru B0
$\overline{D_1Q},\overline{D_0Q}$:($K_2Q$)→A at B15 thru B0
$\overline{D_1Q},D_0Q$:($K_3Q$)→A at B15 thru B0
$D_1Q,\overline{D_0Q}$:($K_4Q$)→A at B15 thru B0
$D_1Q,D_0Q$:($K_5Q$)→A at B15 thru B0

FAE = $C_3Q \cdot \overline{C_2Q} \cdot \overline{C_1Q} \cdot C_0Q \cdot K_{11}Q \cdot \overline{K_{10}Q} \cdot W1$   The FAE micro-operation occurs in word time 1 and has a variable duration ranging from 1 to 16 bit times. It is used for a right shift and is implemented by preloading the bit counter with the contents of the D-Register. The bit counter 1 then clocks the A-Register for the selected number of shifts. For the right shift, the sign bit is shifted into the most significant portion of the accumulator. Executed operations are as follows:

($A_i$)→$A_i$−1 at B<$D_3,D_2,D_1,D_0$> thru B0
($K_1$)→$A_{15}$ at B>$D_3,D_2,D_1,D_0$> thru B0   The sign bit is loaded into the A-Register.

FAF = $\overline{C_3Q} \cdot \overline{C_2Q} \cdot \overline{C_1Q} \cdot C_0Q \cdot K_{11}Q \cdot K_{10}Q \cdot W1$   The FAF micro-operation occurs in word time 1 and has a variable duration from 1 to 16 bit times. It is used for end around shift. The D-Register is used to set the bit timer to the selected number of end around shifts. The bit timer then clocks the A-Register as it counts down. The sign bit is placed in the most significant bit position of the A-Register at B0. The executed operations are as follows:

($A_i$)→$A_i$−1 at B<$D_3,D_2,D_1,D_0$> thru B0
($A_0$)→$A_{15}$ at B<$D_3,D_2,D_1,D_0$> thru B0

FAG = $C_3Q$ $C_2Q \cdot C_1Q$ W1   The FAG micro-operation occurs in word time 1 and has a duration of 12 bit times. It is used for the skip on discrete instruction. If the selected discrete is true, the M-Register is clocked and incremented by three. If the selected discrete is false, the M-Register is not clocked and is therefore not incremented. The executed instructions are as follows:

DSI<D>:(M)+3→M at B11 thru B0
0→$K_8$ at B0   The M carry flip-flop is used to increment the M-Register and reset at the end of the micro-operation.

FAH = $C_3Q \cdot C_2Q \cdot \overline{C_1Q} \cdot W1$   The FAH micro-operation occurs in word time 1 and has a duration of 12 bit times. It is used to implement the discrete output instruction. The operation executed is as follows:

1→DSO<D> at B11 thru B0

FAI = $C_3Q \cdot \overline{C_2Q} \cdot K_2Q \cdot \overline{K_1Q} \cdot W1$   The FAI micro-operation occurs in word time 1 and has a duration of 12 bit times. It is used during the decrement and transfer instruction when the contents of a selected index register has been decremented to a negative number. It should be noted that an alternate path is taken when the contents of the selected index register remain positive. This alternate path is through the FL micro-operation as with other transfer type instructions. The executed operations are as follows:

(M)+2→M at B11 thru B0
1→$C_2$ at B0

0→$K_8$ at B0   The M-carry register is used to increment the M-Register and reset to zero at the end of the micro-operation.

FAH = $L_1Q$ W3   The FAJ micro-operation occurs in word time 3 and has a duration of 16 bit times. It is entered for a turn-on interrupt (identified by the $L_1Q$ signal) and is, effectively, a no operation. The operations executed are:

0→$L_1$ at B0

FAK = $\overline{L_1Q} \cdot \overline{P89} \cdot Y7 \cdot W3$   The FAK micro-operation occurs in word time 3 and has a duration of 16 bit times. It is used for external interrupts and is entered if there is an external interrupt, $\overline{P89}$, and there is no interrupt disable, $L_3Q$, or there is a preceding index instruction identified by $K_1Q$. It acts as a spacer for the word counter and no operations take place.

FAL = $K_1Q \cdot W4$   The FAL micro-operation occurs in word time 4 and has a duration of 16 bit times. It is used for the start of the interrupt routine, preloading the M-Register with memory address $040_{16}$ and storing the return address in the SPM-2 Register. Operations executed are as follows:

$040_{16}$→M at B15 thru B0
(M)→SPM<2>$_{lsb}$ at B15 thru B0

FAM = $K_1Q \cdot W5$   The FAM micro-operation occurs in word time 5 and has a duration of eight bit times. It is used to access the contents of the program memory portion of the memory at location $040_{16}$, which is the start of the interrupt routine. Operations executed are as follows:

Read Strobe at B7
Restore Strobe at B3
(PM<M=64>)→I at B7
Op[I]→$C_3,C_2,C_1,C_0,K_{11},K_{10}$ at B0
0→$L_3$ at B0   The interrupt disable flip-flop is cleared.

FAN = $K_1Q \cdot W6$   FAN is a no-op.
FA0 = $K_1Q \cdot W7$   The FA0 micro-operation occurs in word time 7 and has a duration of 12 bit times. It is effectively a no op, merely setting the control flip-flops for a new word time cycle. Operations executed are:

0→$W_2,W_1,W_0$ at B0   The word counter is reset.
0→$K_5,K_4,K_3,K_2,K_1$, at B0
FAP = $\overline{C_3Q} \cdot C_2Q \cdot Y6 \cdot \overline{K_{10}Q} \cdot W1$   FAP is a no-op.
FAQ = $C_1Q \cdot C_0Q \cdot Y39$   The FAQ micro-operation occurs in word time 1 and has a duration of 16 bit times. The contents of the selected SPM Register is preserved by recirculation and also transfer to the A Register.
(SPM<D>)→SPM D   at B15 thru B0
(SPM<D>)→A   at B15 thru B0

Initialization

During initialization of the data processor 12, the following operations are executed:

1. $L_1$ is in the true state due to the power turn-on condition.
2. FAJ is always automatically entered for start-up to initialize the following functions:
   A. The M-Register is preset to the PM address $040_{16}$ in FAL.
   B. All SPM Registers are cleared under program control.
   C. The D-Register is loaded from PM<M> = $040_{16}$.
   D. The C-Register ($C_3,C_2,C_1,C_0,K_{11},K_{10}$) is loaded from PM<M> = 040.
   E. The PM Read and Restore Strobes are generated in FAM.

F. The A-Register is cleared under program control.
G. The $K_1$ flip-flop is cleared in FAO.
H. The $K_2$ flip-flop is cleared in FAO.
I. Flip-flops $K_5,K_4,K_3$ are cleared in FAO.
J. Flip-flops $K_8,K_7$, the M-Register and A-Register carry flip-flops are reset at every B0.

Discrete Outputs

The data processor 12 can generate discrete outputs (DO) to meet specific requirements under program control. The DO assignments are:

DO-0: Set interrupt enable.
DO-1: Provide clock pulses to ASR-33 (TELETYPE-WRITER).
DO-2: Provides a clock to set the power turn-on interrupt, $L_1$ A DO-2 instruction (1100–0010) will be contained in program memory location $40_{16}$ to reset $L_1$ during power turn-on.
DO-3: Iteration timer reset.
DO-4: Trigger to $I_2$ latch, the discrete input 4 (DI-4) toggle. The $I_2$ flip-flop is automatically zero set during the power on sequence.
DO-5: Trigger to $I_3$ latch, the discrete input-5 (DI-5) toggle. The $I_3$ flip-flop is automatically zero set during the power turn-on sequence.
DO-6: Trigger to the $I_4$ latch, the discrete input-6 (DI-6) toggle. The $I_4$ flip-flop is automatically zero set during the power turn-on sequence.
DO-7: Intensity control.
DO-8: Toggles the $I_1$ flip-flop causing scratch pad memory paging.
DO-9: Main memory paging.
DO-10: Spare.
DO-11: Servo set.

Discrete Inputs

The data processor 12 can operate on a discrete input (DI) with a skip-on-discrete instruction under program control. The discrete inputs are various low frequency digital signals. The purpose of the discrete inputs is to define a status or condition. The DI assignments are:

DI-0: Spare
DI-1: Skip unconditional.
DI-2: Skip on ASR-33 (TELETYPEWRITER).
DI-3: Skip on the sign of (A).
DI-4: Skip on $I_2Q$ latch (DO-4 trigger).
DI-5: Skip on $I_3Q$ latch (DO-5 trigger).
DI-6: Skip on $I_4Q$ latch (DO-6 trigger).
DI-7: Skip on logical overflow in A-Register.
DI-8: Used for troubleshooting.
DI-9: Skip on arithmetic carry from A-Register.
DI-10: Skip on positive.
DI-11: Skip on servo ready.

Interrupts

Interrupts may be added virtually without limit. All interrupts are logically ORed together (X5) to transfer operation of the data processor 12 to an interrupt subroutine starting in memory location $040_{16}$. The return address is preserved in SPM-2. The interrupt subroutine will scan the discrete interrupt inputs and operate on each interrupt.

The interrupt enable flip-flop ($L_3$) will automatically disable interrupts within interrupts, but may be set with a D0-0 after the return address in SPM-2 has been stored elsewhere under program control, thereby permitting interrupts within interrupts. The end of the interrupt subroutine requires the transfer to the return address, the setting of the interrupt enable flip-flop ($L_3$) if required, and the transfer indirect (TI) to the return address contained in SPM-2.

The interrupt enable flip-flop ($L_3$) may be used to preserve the contents of SPM-2 against the contingency of an interrupt to permit time shared use of SPM-2.

Data-Save

The power supply generates a C signal which indicates the power supply is out of tolerance limits and requests the data processor 12 to generate a data-save signal in the event of a power dropout. Following a delay of sufficient duration to insure the completion of a memory cycle, the data processor generates a data-save signal ($\overline{L_2Q}$) in response to the C signal generated by the power supply. The delay will range from 20 nanoseconds to 35 microseconds and will have an average duration of 7 microseconds. The data-save operation constitutes the power turn-off interrupt, where the C signal will always initiate a data-save function which will terminate normal computer operation.

Adaptive Memory Control

The data processor 12 incorporates an adaptive memory control that adds additional memory protection to insure that the power turn-on condition does not cause detrimental system operation and provide protection from loss of program. In the data processor, this power condition is detected and used to initiate a power interrupt ($L_1Q$); which forces the data processor to look at a specific memory address (040 HEXADECIMAL) by preloading this address into the M-Register. The data processor will continue to access this address until the power interrupt condition is alleviated. In prior art systems, the power interrupt is eliminated when the voltages come within tolerance. In this invention, adaptive techniques are used that insures that not only are the voltages back into tolerance levels, but memory can be properly accessed. This technique is implemented with a memory access interlock implemented by requiring that an instruction that generates a discrete output (DO-2) be located in the first location of the power interrupt program in memory. This discrete output (DO-2) instruction provides the adaptive interlock to insure that memory cannot be accessed before the power interrupt is exited.

Memory Protect

A memory protect scheme greatly reduces problems with loss of program and protects against the program wiping out part of the program. This is accomplished by logically processing the memory address register outputs to produce a signal P110 (Table II) disabling the write mode (associated with the memory read-write logic) when the M-Register is addressing protected parts of the memory. This technique effectively permits an electrically alterable (core type) memory to be configured as a read-only memory in selected locations for additional protection of the program stored in that memory.

Instruction Repertoire

The program instructions for the numerical control system 10 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (in line).

Functional Modifier

The program instructions follow a functional modifier concept which yields a high degree of flexibility and economy. This concept permits conservation of memory by the use of short instructions without sacrifice of flexibility or capability. As an example, extensive indexing capability is available when required even though an index field is not required in an instruction. This indexing capability is implemented by programming an index functional modifier prior to an instruction to be indexed. This functional modifier indicates that the following instruction is to be indexed and identifies the location of the index. A functional modifier may also be used to make available double precision shifting capability. The short instruction word length which is configured for efficient use of memory permits only enough instructions for single precision shifting operations. A double precision shift capability is implemented by preceding the shift instructions with a functional modifier to indicate that the subsequent shift instruction is a double precision shift. Thus, both single and double precision shifting capability may be implemented without use of excessively long instruction words.

Detailed Description Of Instructions

For convenience of discussion, the instructions are divided into four categories A, B, C, and D. During the execution of Group A instructions, operands are obtained from the constant memory portion of the main memory with SPM-2 used as an intermediate working register. Therefore, SPM-2 contents must be expendable when using Group A instructions. The operand address pertains to the corresponding locations in the constant memory portion of the main memory, and are defined as double byte locations 0 through 15, but are indexable through many additional pages of double byte locations. Double byte operands are used because two 8-bit bytes are used for each 16 bit operand, each memory location storing one byte. Therefore operand word address 0 defines memory byte address locations 0 and 1 operand word address 1 defines memory byte address locations 2 and 3. Thus, twice the operand word address defines the first of the two operand byte address locations. Certain operand addresses pertain to the two bytes following the instruction. Constants and parameters can be stored in the main memory with the least significant half (msh) of a word in the second byte. The constant memory portion of the main memory is composed of many 16 word pages where each word is composed of two 8-bit bytes. The Group A instructions can be indexed to select required constants or parameters.

The Group A instructions are as follows:
1. LS (load SPM-2 with next two bytes) 0010–0001.

This is a three-byte instruction having the above operation code contained in the zero byte. It causes the subsequent byte 1 and byte 2 containing the least significant half and most significant half, respectively, of an in line operand to be loaded into SPM-2. This instruction is not indexable, it uses micro-operations FA, FL, FM, FN, FO, FP, FQ, FJ, FAP, and FZ.

2. ST (store (A) in PM) 0010–0101.

This is a one byte instruction having the above operation code. It causes a two-byte operand previously stored in the A-Register to be stored in a main memory location whose address is stored in the 12 least significant bits of the SPM-2 register. The first byte (lsh) of the operand is loaded into the memory location addressed by SPM-2 and the second byte (msh) of the operand is loaded into the memory location following the first byte. The operand is also preserved in A. The operand address is incremented twice, identifying the memory location following the second byte, and returned to SPM-2 where it is preserved. This permits a second operand to be loaded into the A-Register and then transferred to the next-in-line memory location with a second ST instruction. The next instruction address is also preserved and can be used to access the next instruction. The micro-operations used during this instruction are FA, FD, FE, FG, FF, FH, FI, FJ, FY, and FZ.

3. TX (decrement and transfer on non-negative)

This may be either a three or a four-byte instruction. The first byte is an optional index byte and defines an index register. The absence of an index byte defines the SPM-0 Register. The second byte contains the above operation code and the third and fourth bytes define a transfer address. A non-negative decremented number will cause the next instruction to be accessed from the transfer address location defined by the last two bytes of this instruction. The return address is stored in the SPM-2 Register.

A negative decremented number will cause the next instruction to be accessed from the byte following the last byte (address byte 2). The transfer address (which is not used) is preserved in SPM-2.

This instruction is used to guide the data processor through a loop one or more times. The desired number of transfers, less one, is initially loaded into the appropriate index register. This number will then be decremented through zero to a negative number before the loop is exited.

As long as the decremented number is non-negative, the TX instruction goes through micro-operations FC, FL, FM, FN, FO, FP, FQ, FJ, FY and FZ.

As soon as the decremented number becomes negative, the TX instruction goes through micro-operations FC, FAI, and FZ.

4. TR (unconditional transfer) 0010–0111.

This is a three-byte instruction in which the above operation code is contained in the first byte and a transfer address defined by the second and third bytes. This instruction will cause the next instruction to be accessed from the transfer address location defined by the second and third bytes. The return address is preserved in SPM-2. This instruction goes through micro-operations FA, FL, FM, FN, FO, FP, FQ, FJ, FY and FZ.

5. IP (index) 0010–1$I_2I_1I_0$

This is a one-byte indexable functional modifier containing the operation code in the five most significant bits and an operand address in the three least significant bits. A first index (IP or IS) instruction preceding a second index (IP or IS) instruction will cause the operand address of the second index (IP or IS) instruction to be indexed by the operand of the first index (IP or IS). Thus, multilevel indexing is permissible without limit and index parameters can be obtained from locations throughout the memory.

This instruction goes through micro-operations FA, FK, FM, FN, FO, FP, FQ, FR, FV, and FZ.

6. IP-7 (index) 0010–1111

When an index instruction identifies address location 111 it becomes a three-byte non-indexable instruction wherein an operand is contained in the second and third bytes. The operand is transferred to the SPM-2 Register. This instruction goes through micro-operations FA, FL, FM, FN, FO, FP, FQ, FS, FV and FZ.

7. DP (Add) 0001-$I_3I_2I_1I_0$

This is a one-byte indexable instruction wherein the operation code is stored in the first four bits and an operand address is stored in the last four bits. This instruction causes the contents of an SPM-Register identified by the address portion to be added to the contents of the A-Register and the results stored in the A-Register. This instruction goes through micro-operations FA, FK, FM, FN, FO, FP, FQ, FR, FT and FZ.

8. DP-15 (Add) 0001–1111

When a DP instruction identifies address location 1111 it becomes a three-byte non-indexable instruction with the second and third bytes containing an operand. This operand is added to the contents of the A-Register and the results stored in the A-Register. This instruction goes through micro-operations FA, FL, FM, FN, FO, FP, FQ, FS, FT, and FZ.

9. BP (subtract) 0011-$I_3I_2I_1I_0$

This is a one-byte indexable instruction wherein the operation code is contained within the first four bits and an operand address is identified by the second four bits. It causes an operand stored in an SPM-Register defined by the operand address to be subtracted from the contents of the A-Register and the results stored in the A-Register. This instruction goes through micro-operations FA, FK, FM, FN, FO, FP, FQ, FR, FU, and FZ.

10. BP-15 (subtract) 0011–1111

When the operand address defined by a BP instruction is 1111 it becomes a three-byte non-indexable instruction. The second and third bytes contain an operand which is subtracted from the contents of the A-Register and the difference stored in the A-Register. This instruction goes through micro-operations FA, FL, FM, FN, FO, FP, FQ, FS, FU and FZ.

11. XP (exclusive-OR) 0000-$0I_2I_1I_0$

This is a one-byte indexable instruction in which the operation code is contained in the five most significant bits and an SPM-Register containing an operand is defined by the three least significant bits. The operand is exclusive-ORed with the contents of the A-Register and the result is stored in the A-Register. This instruction goes through micro-operations FA, FK, FM, FN, FO, FP, FQ, FR, FX and FZ.

12. XP-7 (exclusive-OR) 0000–0111

When an XP instruction defines operand address 111, it becomes a three-byte non-indexable instruction containing an operand in the second and third bytes. This operand is exclusive-ORed with the contents of the A-Register and the result is stored in the A-Register. This instruction goes through micro-operations FA, FL, FM, FN, FO, FP, FQ, FR, FX and FZ.

13. AP (logical AND) 0000-$1I_2I_1I_0$

This is a one-byte indexable instruction wherein the operation code is contained in the five most significant bits and an SPM-Register address containing an operand is defined by the three least significant bits. The operand contained in the addressed SPM-Register is logical ANDed with the contents of the A-Register and the result is stored in the A-Register. A logical AND with a 0 operand is used to clear the A-Register. This instruction goes through micro-operations FA, FK, FM, FN, FO, FP, FQ, FR, FW, and FZ.

14. AP-7 (logical AND) 0000–1111

When the address defined by an AP instruction is 111, it becomes a three-byte non-indexable instruction having an operand contained in the second and third bytes. The operand is logical ANDed with the contents of the A-Register and the result is stored in the A-Register. This instruction goes through micro-operations FA, FL, FM, FN, FO, FP, FQ, FS, FW and FZ.

Group B instructions obtain all operands from the scratch pad memory. Each SPM page consists of 16 registers with indexing permitted between the two SPM pages. Caution is required when using SPM-2 because an interrupt will replace the contents of SPM-2 with a return address. This can be circumvented with the use of an interrupt disable discrete. In addition, the use of a Group A instruction will replace the contents of the SPM-2 Register with either data or a return address, requiring the transfer of SPM-2 data to another SPM-Register before a Group A instruction is used if the data is to be preserved.

15. TI (transfer indirect) 0110–0111

This is a one-byte non-indexable instruction having the above operation code. It causes the address of the next instruction to be obtained from SPM-2 and the return address stored in SPM-2. It goes through micro-operations FA, FY and FZ.

16. IS (index) 0110-$1I_2I_1I_0$

This is a one-byte indexable functional modifier having the operation code contained in the five most significant bits and an address defining an SPM-Register containing an operand contained in the three least significant bits. A first index (IP or IS) instruction following a second index (IP or IS) instruction will cause the operand address of the second index (IP or IS) instruction to be indexed by the operand of the first index (IP or IS) instruction. Multilevel indexing is thus permissible without limit. Only SPM-Registers 0 through 7 of each SPM page may be used as index registers. This is a single byte functional modifier programmed immediately prior to an instruction to be indexed. This instruction goes through micro-operations FA, FV and FZ.

17. DS (Add) 0101-$I_3I_2I_1I_0$

This is a one-byte indexable instruction wherein the four most significant bits define the operation code and the four least significant bits define an SPM-Register address containing an operand. The operand in the addressed SPM-Register is added to the contents of the A-Register and the sum is stored in the A-Register. This introduction goes through micro-operations FA, FT and FZ.

18. BS (subtract) 0111-$I_3I_2I_1I_0$

This is a one-byte indexable instruction wherein the four most significant bits define the operation code and the four least significant bits define a scratch pad memory address containing an operand. The addressed operand is subtracted from the contents of the A-Register and the difference is stored in the A-Register. This introduction goes through micro-operations FA, FU and FZ.

19. XS (exclusive-OR) 0100-$0I_2I_1I_0$

This is a one-byte indexable instruction wherein the five most significant bits define the operation code and the three least significant bits define an SPM address containing an operand. The operand is exclusive-ORed with the contents of the A-Register and the result is stored in the A-Register. This instruction goes through micro-operations FA, FX and FZ.

20. AS (logical AND) 0100-1$I_2I_1I_0$

This is a one-byte indexable instruction wherein the five most significant bits define the operation code and the three least significant bits define an SPM address containing an operand. The addressed operand is logical ANDed with the contents of the A-Register and the result is stored in the A-Register. This instruction goes through micro-operations FA, FW and FZ.

The following Group C type instructions relate to operations generally involving the A-Register.

21. SS (store (A) in SPM) 1000-$I_3I_2I_1I_0$

This is a one-byte indexable instruction wherein the four most significant bits identify the operation code and the four least significant bits define an SPM address. The contents of the A-Register are placed in the addressed SPM-Register and also preserved in the A-Register. This instruction uses micro-operations FA, FAC and FZ.

22. SL (shift left) 1001-00$I_1I_0$

This is a one-byte non-indexable instruction wherein the six most significant bits define the operation code and the two least significant bits define the number of shifts. The contents of the A-Register are shifted left by the binary number defined by $(I_1I_0)+1$. In other words, $\overline{I_1},\overline{I_0}=1$ shift, $\overline{I_1}I_0=2$ shifts, $I_1\overline{I_0}=3$ shifts, and $I_1I_0=4$ shifts. 0's are shifted into the vacated least significant bits of the A-Register. This instruction goes through micro-operations FA, FAD and FZ.

23. SE (shift end around) 1001-11$I_1I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted by the binary number represented by $(I_1I_0)+1$. That is, $\overline{I_1},\overline{I_0}=1$ shift, $\overline{I_1}I_0=2$ shifts, $I_1\overline{I_0}=3$ shifts, and $I_1I_0=4$ shifts. Additional shifts are accomplished by indexing. The end around shift is effectively a right shift where the least significant bit is shifted out of the A-Register and recirculated into the most significant bit position of the A-Register. This instruction goes through micro-operations FA, FAF and FZ.

24. SR (shift right) 1001-10$I_1I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted right as indexed or by a number of bits equal to the binary number defined by $(I_1I_0)+1$. That is, $I_1, I_0=1$ shift, $I_1I_0=2$ shifts, $I_1I_0=3$ shifts, and $I_1I_0=4$ shifts. The sign bit of the A-Register is continuously shifted into the most significant bit position. This instruction goes through micro-operations FA, FAE and FZ.

25. EX (input/output word) 1010-$I_3I_2I_1I_0$

This is a one-byte indexable instruction wherein the four most significant bits identify the operation code and the four least significant bits identify an I/O channel address. The contents of the A-Register are output to the addressed channel while the contents of the addressed channel are simultaneously loaded into the A-Register. A shift enable signal is output to gate 16 clock pulses to the selected channel. This instruction goes through micro-operations FA, FAB, and FZ.

26. EX-15 (input/output word) 1010-1111

This instruction clears the A-Register by shifting in the contents of a non-existent input channel which are all zeros. This instruction goes through micro-operations FA, FAB and FZ.

27. LD (load accumulator) 1011-$3I_2I_1I_0$

This is a one-byte indexable instruction wherein the four most significant bits identify the operation code and the four least significant bits identify an SPM address containing an operand. The operand in the addressed SPM-Register is loaded into the A-Register. This instruction goes through micro-operations FA, FAQ and FZ.

Group D instructions relate to the discretes.

28. DC (discrete output) 110$I_4$-$I_3I_2I_1I_0$

This is a one-byte indexable instruction wherein the three most significant bits define the operation code and the five least significant bits define an output channel address. A discrete output signal, an inverted 3 microsecond pulse is generated on the addressed output channel. This instruction goes through micro-operations FA, FH and FZ.

29. SK (skip on discrete) 111$I_4$-$I_3I_2I_1I_0$

This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction. This instruction goes through micro-operations FA, FAG and FZ.

Two rules create exceptions to the above micro operation flow paths.

1. When an interrupt occurs during the execution of an instruction, the instruction will not terminate with the FZ micro-operation but instead will continue through the FAK, FAL, FAM, FAN, FAO micro-operations.

2. Whenever an instruction normally going through the FA micro-operation is preceded by an index functional modifier (IS or IP) it will go through FB in lieu of FA.

Schematic Diagrams

As previously noted the data processor is physically layed out on a series of printed circuit boards interconnected by a Mother board. The schematic drawings in FIGS. 6–17 show columns of numbers and letters representing plug interconnections and common signal connections, which are summarized in Table IV. The registers and logic gates are implemented with SN 7400 series integrated circuits. The registers and flip flops are shown in detail in FIGS. 6–17 and the various logical equations such as the inputs to these elements are defined in Table I and Table II. Although the illustrated registers and flip flops, combined with the equations in Table I, Table II, and Table III are sufficient to completely define the operation of the data processor 12 (FIG. 1), groups of logical functions have been shown on the printed circuit boards on which they are actually implemented. It should be understood, however, that the location of gates developing logical signals is largely determined by availability of space and primary or intermediary subsignals and may or may not be related to the ultimate use of a particular logical signal.

The numerous computer signals are defined with both, letters and numbers. The signal definitions in FIGS. 6 thru 17 correspond with the signal definitions in the logical equations and with the micro-operation designations. Each logic card shown in FIGS. 6 thru 17 have pin designations that correspond to the signals on that logic card, with those pin designations repeated for each card. The signals for each logic card and the pin designation that corresponds to that signal on that card are shown in Table IV. The pin designations are listed in the left hand column, while the signals corresponding to those pin designations are listed in columns under the card designations (such as cards A, B, C, etc) and the Figure references (such as FIGS. 6, 7, 8, etc).

As shown in FIG. 6 the A-Logic printed circuit board includes the A-Register 130, its associated full adder 132 and the A carry flip-flop $K_7$ 138. Also shown is the M-Register 112, its associated full adder 139, and the carry flip-flop 140. The A-Register overflow detector flip-flop $OF_1$ 134 and logic dates 135 are also located on the A-Logic board.

As shown in FIG. 7 the B-Logic printed circuit board includes the bit counter, flip-flop $B_0$ 150, $B_1$ 152, $B_2$ 154 and $B_3$ 156. Flip-flops $B_4$ 158, $B_5$ 160, $B_6$ 162 and $B_7$ 164 produce the asymmetric main clock signal P3. Also included on this board is the bit time decode logic 166, logic gates 168 and various other logic gates.

As shown in FIG. 8 the C-Logic printed circuit board includes various logic gates 17 as well as the C-Register which includes flip-flops $C_3$ 172, $C_2$ 174, $C_1$ 176, $C_0$ 178, $K_{11}$ 180 and $K_{10}$ 182.

Figure 9:
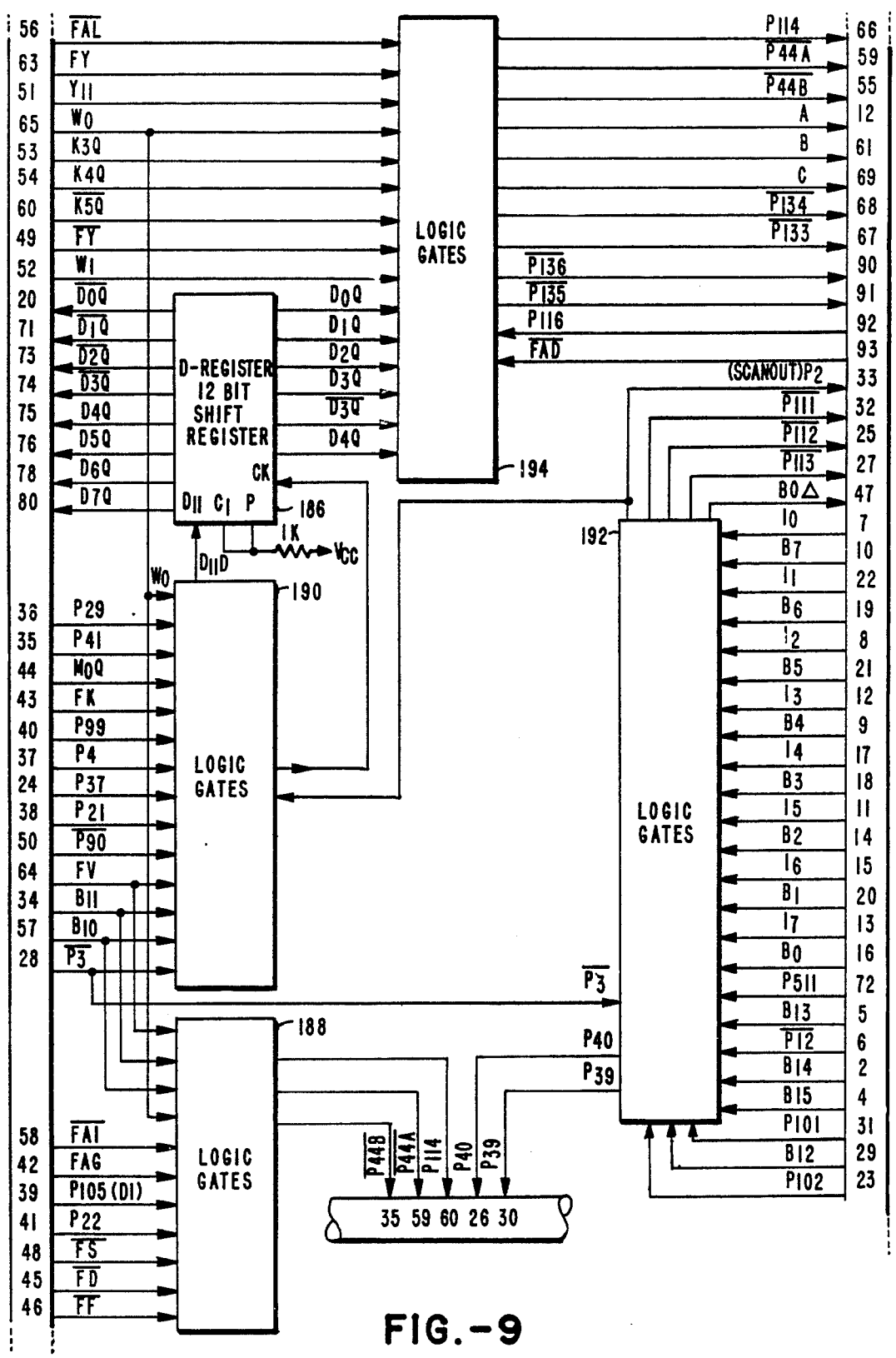
FIG. 9 is a schematic and block diagram representation of the D logic circuit board.

As shown in FIG. 9 the D-Logic printed circuit board includes the D-Register 186 as well as various logic gates 188, 190, 192 and 194.

Figure 10:
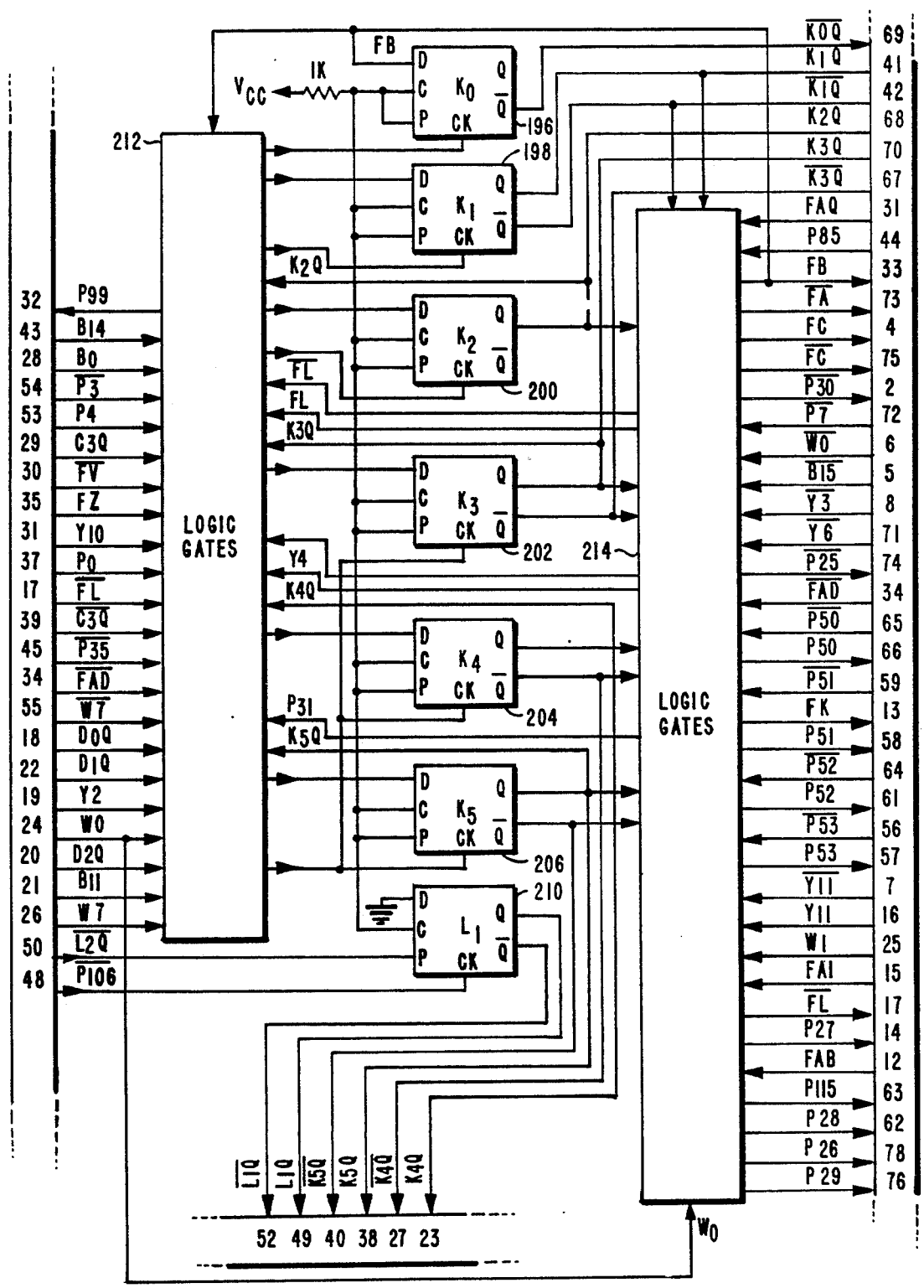
FIG. 10 is a schematic and block diagram representation of the K logic circuit board.

As shown in FIG. 10 the K-Logic printed circuit board includes flip-flops $K_0$ 196, $K_1$ 198, $K_2$ 200, $K_3$ 202, $K_4$ 204, $K_5$ 206, and $L_1$ 210. Also included are various logic gates 212 and 214.

As shown in FIG. 11 the W-Logic printed circuit board includes the word counter composed of flip-flops $W_2$ 220, $W_1$ 222 and $W_0$ 224 as well as the flip-flop $L_2$ 226. Also included are various logic gates 228, 230 and 232.

Figure 12:
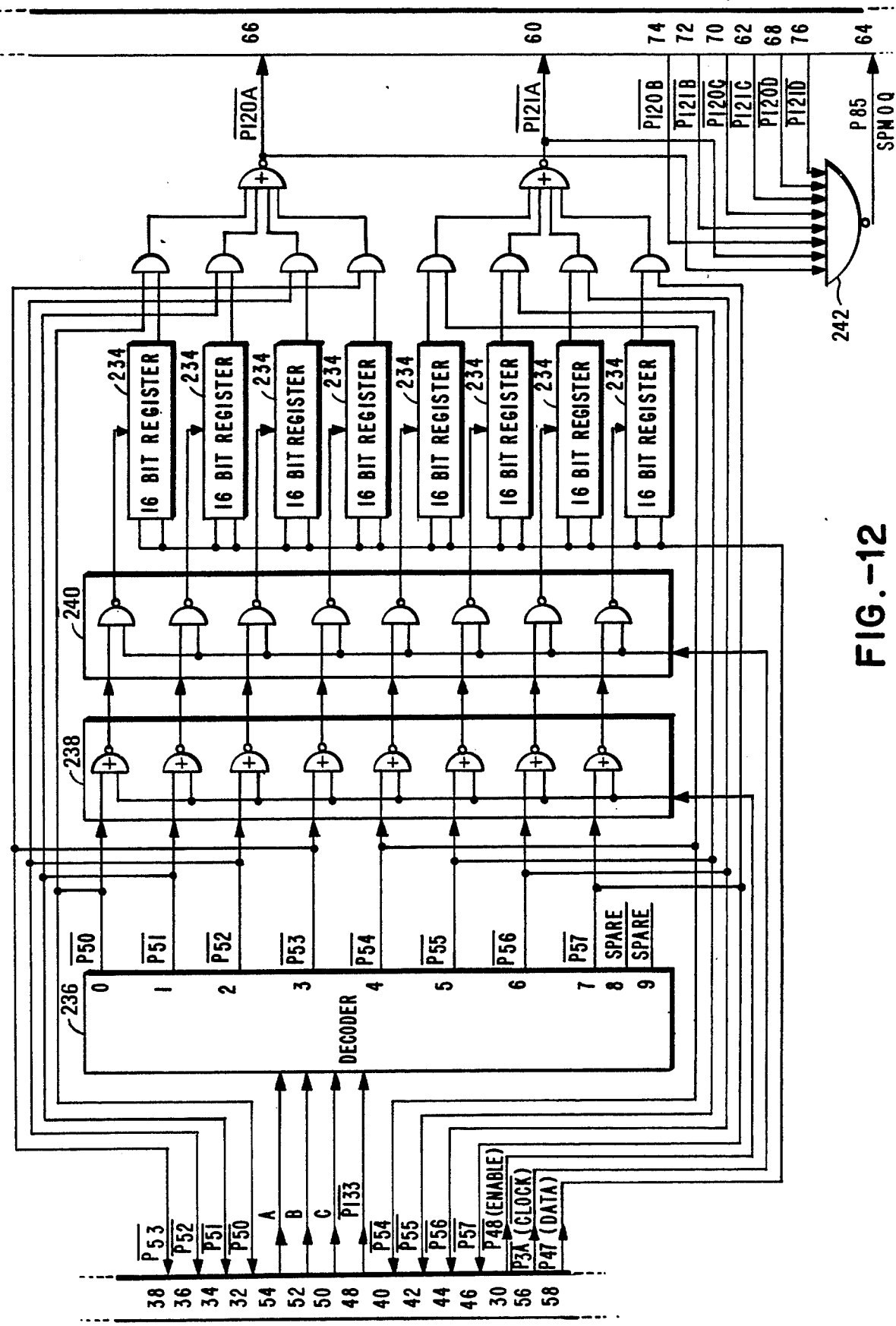
FIG. 12 is a schematic and block diagram representation of the SPM circuit board.

As shown in FIG. 12 an A section Scratch Pad Memory printed circuit board includes eight pairs of integrated circuit shift registers 234. A binary coded decimal to decimal decoder 236 generates memory select signals $\overline{P50}$ through $\overline{P57}$ which is gated through a first series of gates 238. This first gated signal in turn gates a clock signal $\overline{P3A}$ through a second series of gates 240 to clock a selected one of the registers. The outputs from the registers 234 are multiplexed into signals $\overline{P120A}$ and $\overline{P121A}$, each carrying outputs from four of the registers. Three additional scratch pad memory sections B, C and D, identical with A shown in FIG. 12 provide corresponding output signals $\overline{P120B}$, $\overline{121B}$, $\overline{120C}$, $\overline{121C}$, $\overline{120D}$ and $\overline{121D}$. These in turn are multiplexed by NAND gate 242 into a single output signal P85. The signals in the B, C and D sections correspond to those of the A section and are defined according to terminal numbers as follows:

| Terminal No. | A | B | C | D |
|---|---|---|---|---|
| 30 | $\overline{P48}$ | $\overline{P48}$ | $\overline{P48}$ | $\overline{P48}$ |
| 32 | $\overline{P50}$ | $\overline{P58}$ | $\overline{P66}$ | $\overline{P74}$ |
| 34 | $\overline{P51}$ | $\overline{P59}$ | $\overline{P67}$ | $\overline{P75}$ |
| 36 | $\overline{P52}$ | $\overline{P60}$ | $\overline{P68}$ | $\overline{P76}$ |
| 38 | $\overline{P53}$ | $\overline{P61}$ | $\overline{P69}$ | $\overline{P77}$ |
| 40 | $\overline{P54}$ | $\overline{P62}$ | $\overline{P70}$ | $\overline{P78}$ |
| 42 | $\overline{P55}$ | $\overline{P63}$ | $\overline{P71}$ | $\overline{P79}$ |
| 44 | $\overline{P56}$ | $\overline{P64}$ | $\overline{P72}$ | $\overline{P80}$ |
| 46 | $\overline{P57}$ | $\overline{P65}$ | $\overline{P73}$ | $\overline{P81}$ |
| 48 | $\overline{P133}$ | $\overline{P134}$ | $\overline{P135}$ | $\overline{P136}$ |
| 50 | C | C | C | C |
| 52 | B | B | B | B |
| 54 | A | A | A | A |
| 56 | $\overline{P3A}$ | $\overline{P3B}$ | $\overline{P3C}$ | $\overline{P3D}$ |
| 58 | P47 | P47 | P47 | P47 |
| 60 | $\overline{P121A}$ | $\overline{P121B}$ | $\overline{P121C}$ | $\overline{P121D}$ |
| 62 | $\overline{P121C}$ | | | |
| 64 | P85 | | | |
| 66 | $\overline{P120A}$ | $\overline{P120B}$ | $\overline{P120C}$ | $\overline{120D}$ |
| 68 | $\overline{P120D}$ | | | |
| 70 | $\overline{P120C}$ | | | |
| 72 | $\overline{P121B}$ | | | |
| 74 | $\overline{P120B}$ | | | |
| 76 | $\overline{P121D}$ | | | |

Figure 13:
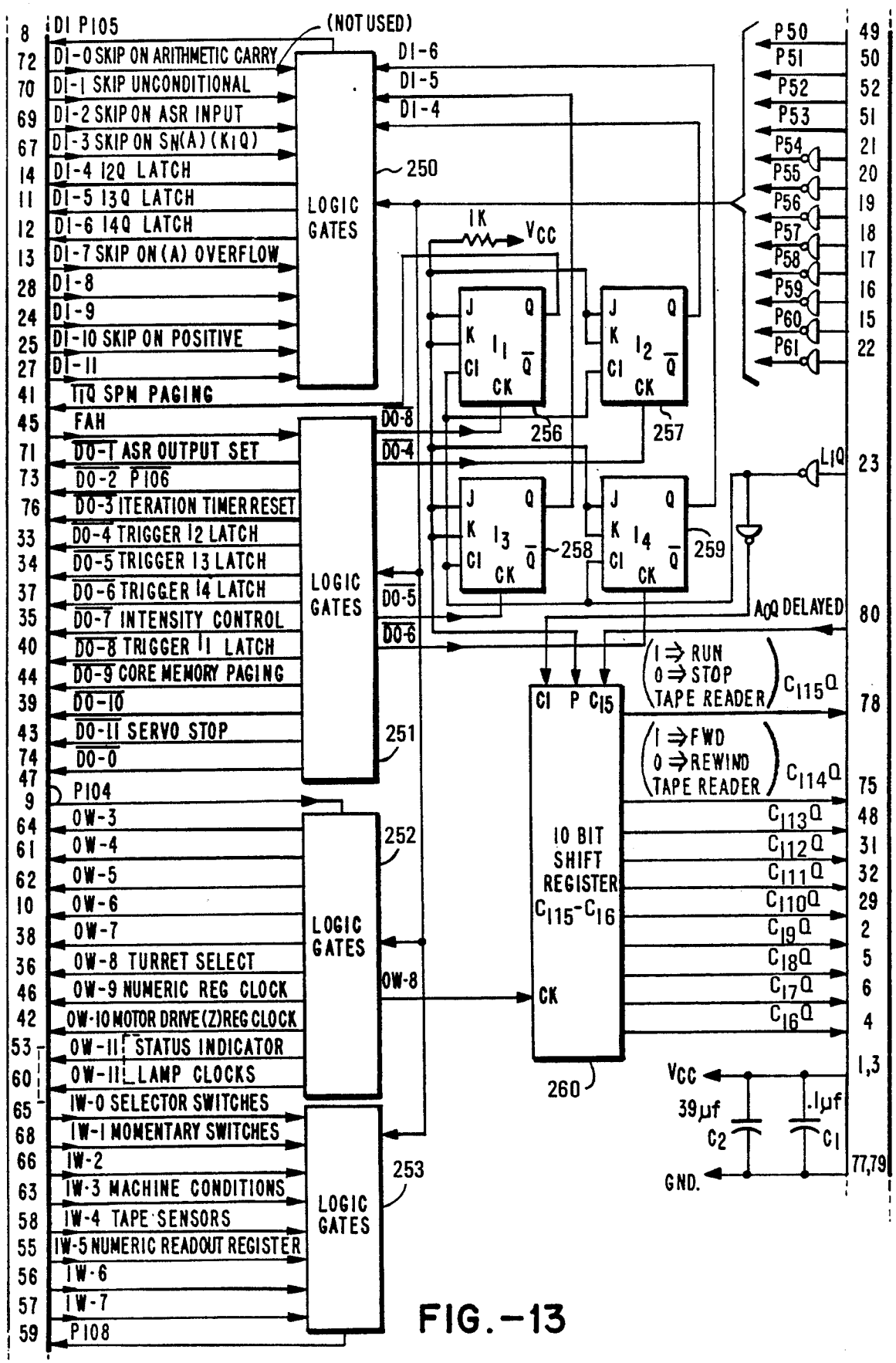
FIG. 13 is a schematic and block diagram representation of the IFA-1 circuit board.

As shown in FIG. 13 the IFA-1 printed circuit board contains logic gates 250, 251, 252 and 253 providing input/output functions. The IFA-1 board accepts input and output type instruction micro-operation signals as well as address signals to encode or decode the various inputs and outputs. The input and output words are exchanged with the A-Register in the data processor 12 (FIG. 4). The input words (IW) are multiplexed by logic gates 253 into signal P108 which is input to the A-Register. Information is output from the A-Register to the various entities by connecting the entities to $A_0Q$ and clocking a selected entity with a gated clock P104 as determined by logic gates 252, shown as output word (OW) signals. Discrete input signals are multiplexed into signal P105 by logic gates 250. Discrete output signals (DO) are decoded and gated by logic gates 251. Micro-operation FAH provides the gating signal. The discrete input signals are accessed with skip on discrete decision instructions, and each discrete output signal (DO) provides a short negative going pulse when selected with a discrete output instruction. The I-Register flip-flops 256, 257, 258 and 259 perform the function of latches toggled or set with the discrete outputs. The $I_1$ flip-flop 256 is used to directly provide a Scratch Pad Memory paging function. Outputs from the flip flops $I_2$ 257, $I_3$ 258 and $I_4$ 259 become discrete inputs. A $C_I$-Register 260 is loaded with output word 8 and used for general system functions. This interface C-Register shown in FIGS. 13 and 15 will be referred to as the $C_I$-Register hereafter to distinguish it from the data processor C-Register shown in FIG. 8. The signals P50-P61 are decoded operand addresses from the data processor.

As shown in FIG. 13, the $C_I$-Register 260 contains a plurality of discrete commands $C_{I15}Q$-$C_{I6}Q$, where the command conditions are packed together in the data processor A-Register using well known programming methods. This packed word is then output to the $C_I$ register 260 with an EX-8 instruction generating the OW-8 gated clock from logic gates 252 to the clock input CK of the $C_I$ register 260. The contents of the A-Register are shifted into the $C_{I15}$ input to the $C_I$ register 260 as the $A_0Q$ signal on pin 80. The data processor packs a tape reader run/stop bit into the most significant bit position corresponding to the $C_{I15}Q$ bit shown on pin 78, where a logical one commands the tape reader 16 to run and a logical zero commands the tape reader 16 to stop. The data processor packs a tape reader forward/rewind bit in the next most significant bit position corresponding to the $C_{I14}Q$ bit shown on pin 75, where a logical one commands the tape reader 16 to run forward and a logical zero commands the tape reader 16 to rewind under control of the tape reader run/stop command $C_{I15}Q$ on pin 78. These tape reader controls are described in detail in the technical manual for the Remex tape reader previously referenced herein. Other discrete commands from the data processor are shown as signals $C_{I13}Q$-$C_{I6}Q$ on pins 75, 48, 31, 32, 29, 2, 5, 6 and 4 respectively and are used for controlling other system operations such as shown in FIG. 1 as machine auxiliary control signals 26 for direct control of various machine operations as described previously.

As shown in FIGS. 14A and 14B, the IFA-2 printed circuit board provides for the scan-in of input words "zero", "three", and "four" to convert the parallel input lines to a serial input that can be processed with the input word multiplexer on the IFA-1 card. Logic gates 262 scan control panel selector switch signals into input word $-0$, logic gates 264 scan non-system adapted machine auxiliary control signals 26 (FIG. 1) into input word -3 and logic gates 266 scan rudimentary intrinsic tape reader input signals into input word $-4$.

These machine auxiliary control signals are scanned into the data processor A-Register with logic gates 264 as serial word IW-3 shown on pin 49 upon execution of an EX-3 instruction. Machine limit switch signals S8-S11 shown on pins 43, 29, 46, and 32 respectively are received for examination by the data processor to interlock motion. Machine Cycle Complete signal S4 shown on pin 68 is received for use by the data processor to determine if a machine command such as a discrete command has been executed to interlock machine operations. Turret Cycle Complete signal S7 shown on pin 51 is received by the data processor to determine if a turret command such as described herein has been executed to interlock machine operations. Operator control signals such as the Switch Contact Jog signal shown on pin 27 is received from machine mounted operator control devices and is used in parallel with operator control devices on the panel 14 such as Jog switches 41 and 52 (FIG. 2A) through interpretation by the data processor under program control as discussed previously for the switches mounted on the control panel 14 (FIG. 1). Other machine auxiliary control signals such as signals S5, S6, S3, S2, S1, and S0 shown on pins 65, 54, 28, 25, 7, and 9 respectively are examined by the data processor to determine machine conditions.

The Z-Register 268 includes flip-flops $Z_{11}$ through $Z_0$ and is a static register loaded with output word -7 to set system discrete conditions such as for machine control. It should be noted that this register does not have ambiguous outputs during the shift frame due to selective clocking of the flip-flops in this register. The Z-Register 268 contains a plurality of discrete commands shown as YL5-YL1, XL5-XL1, MFE and $\overline{Z_0Q}$ which are packed together in the data processor A-Register using well known programming methods. The packed word is then output to the Z-Register 268 with an EX-7 instruction generating the OW-7 gated clock shown on pin 5 from logic gates 252 (FIG. 13) to clock flip-flops $Z_{11}$-$Z_0$ as selected with bit time signals shown as $B_0$-$B_{11}$ respectively to the two-input NAND gates with outputs shown connected to the clock inputs CK of the Z-Register flip-flops. Discrete commands from the data processor are shown as signals YL5-YL1, XL5-XL1, MFE, and $\overline{Z_0Q}$ to pins 50, 52, 78, 76, 72, 75, 69, 78, 70, 74, 67, and 73 respectively and are used for controlling various system operations such as shown in FIG. 1 as machine auxiliary control signals 26 for direct control of various machine operations as described previously. For example, a Photo Optical Cycle Command signal MFE is shown on pin 67 to control a photo machine operation.

As shown in FIG. 15, the IFA-3 printed circuit board provides an extension 270 ($C_{I31}$ through $C_{I16}$) to the C-Register on IFA-1 (FIG. 13) and performs the auxiliary function of decoding some of the discrete conditions for machine turret select 271. The data processor packs a turret select code into the word output to the $C_I$-Register in positions corresponding to the $C_{I31}$, $C_{I30}$, and $C_{I29}$ stages of $C_I$-Register extension 270 to excite the Turret Select Decode for generating turret select signals TS-0 through TS-7. Turret change can be enabled with discrete command signals such as previously described. The data processor can monitor the Turret Cycle Complete signal S7 on pin 51 (FIG. 14B) to determine when the turret has been properly repositioned for interlocking system operations. Logic gates 272 provide the input gating, latching and logical functions associated with the momentary switch logic inputs from the control panel and multiplex them into input word -1. In addition, special gating for computer interrupts is provided and the servo lockup signal 273 is used to disable the machine drives when a detrimental condition is sensed.

The interface assembly (IFA-1, IFA-2 and IFA-3) is not an interface in the conventional sense but constitutes a distributed group of functions that are normally associated with the data processor or the various system entitles. The interface assembly also performs the function of signal distribution between the data processor and various system extremities.

Figure 16A:
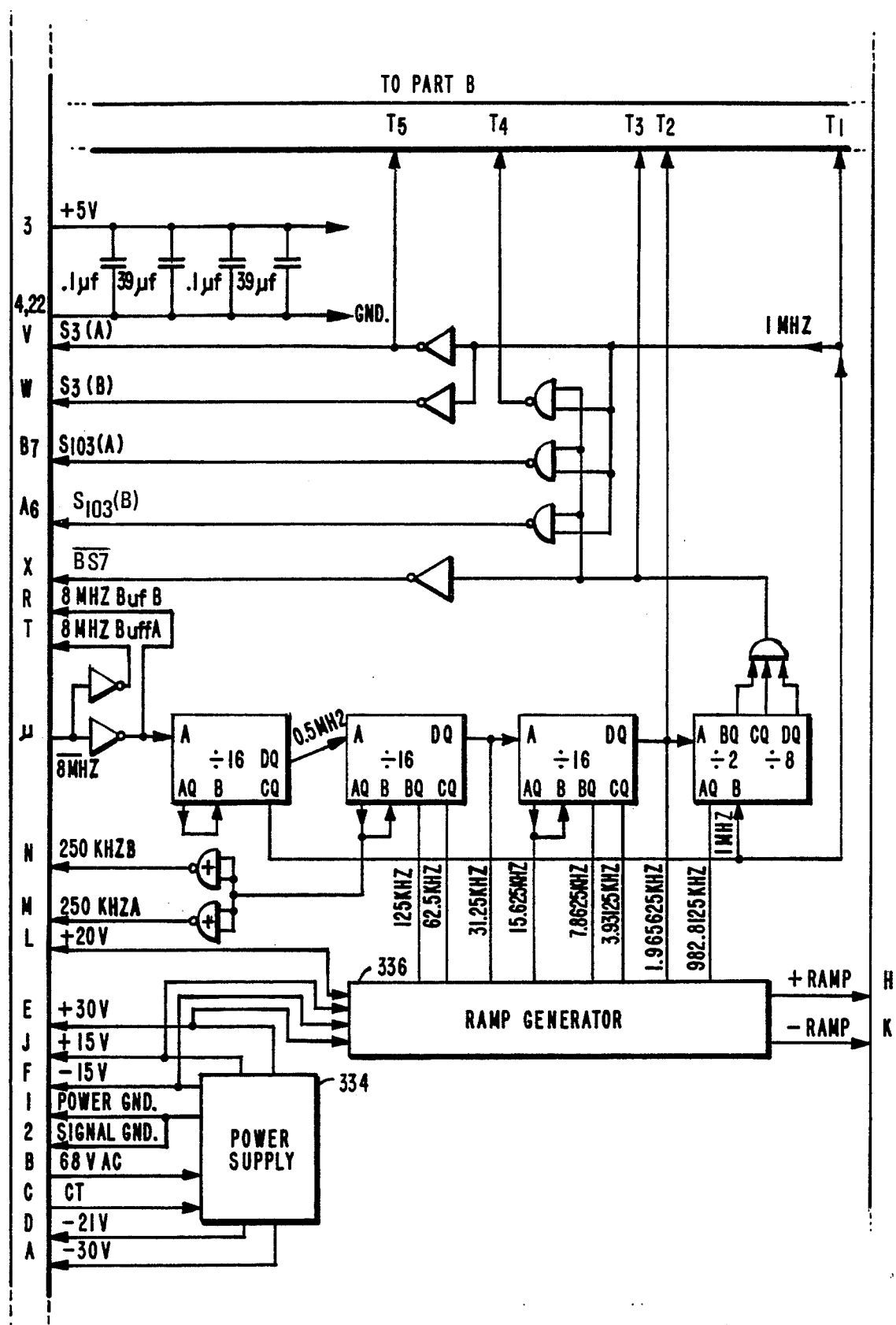
FIGS. 16A and 16B (herein called FIG. 16) is a schematic and block diagram representation of a machine control interface to a data processor.
Figure 16B:
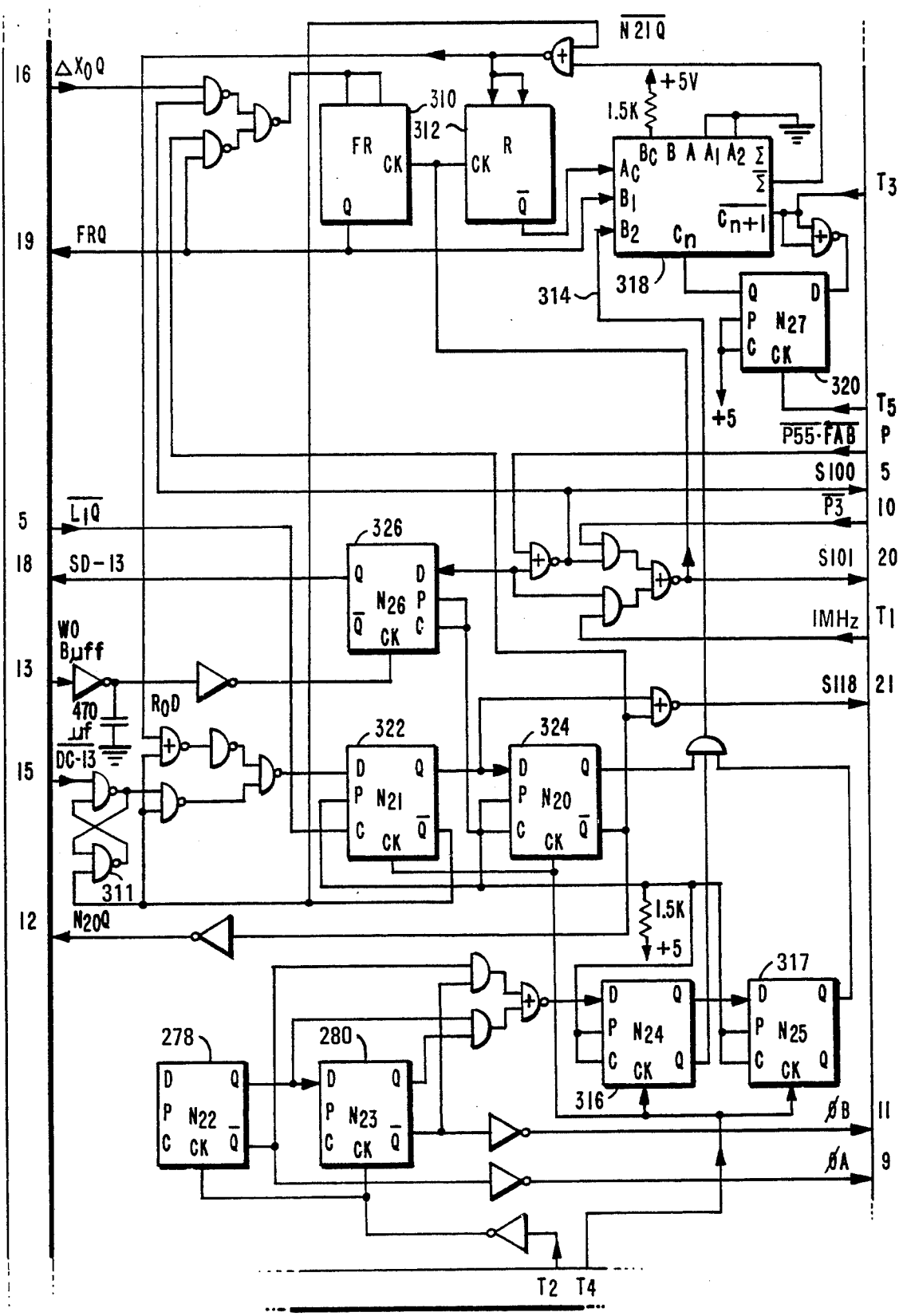
Figure 17A:
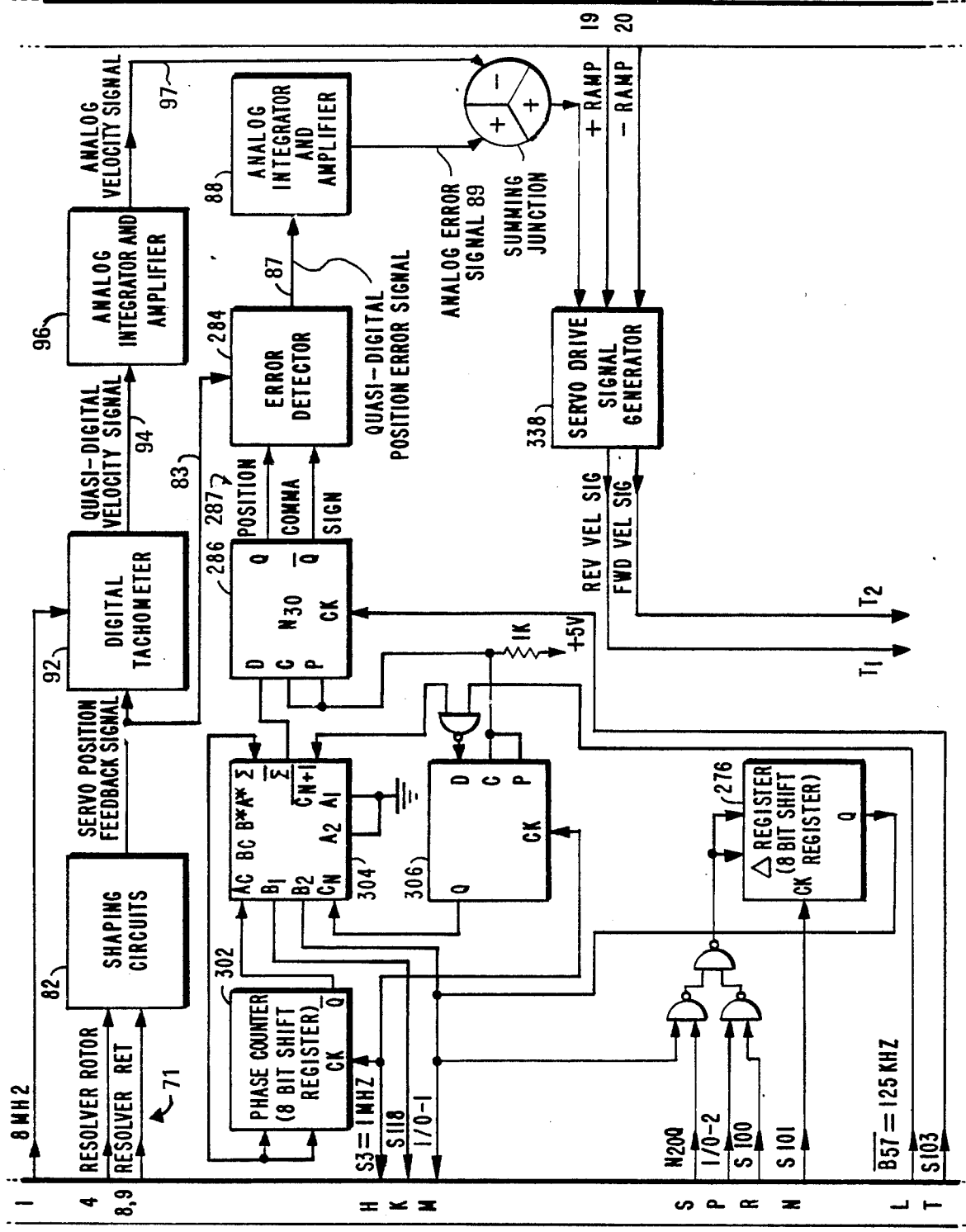
FIGS. 17A and 17B (herein called FIG. 17) is a schematic and block diagram representation of machine servos and drives.
Figure 17B:
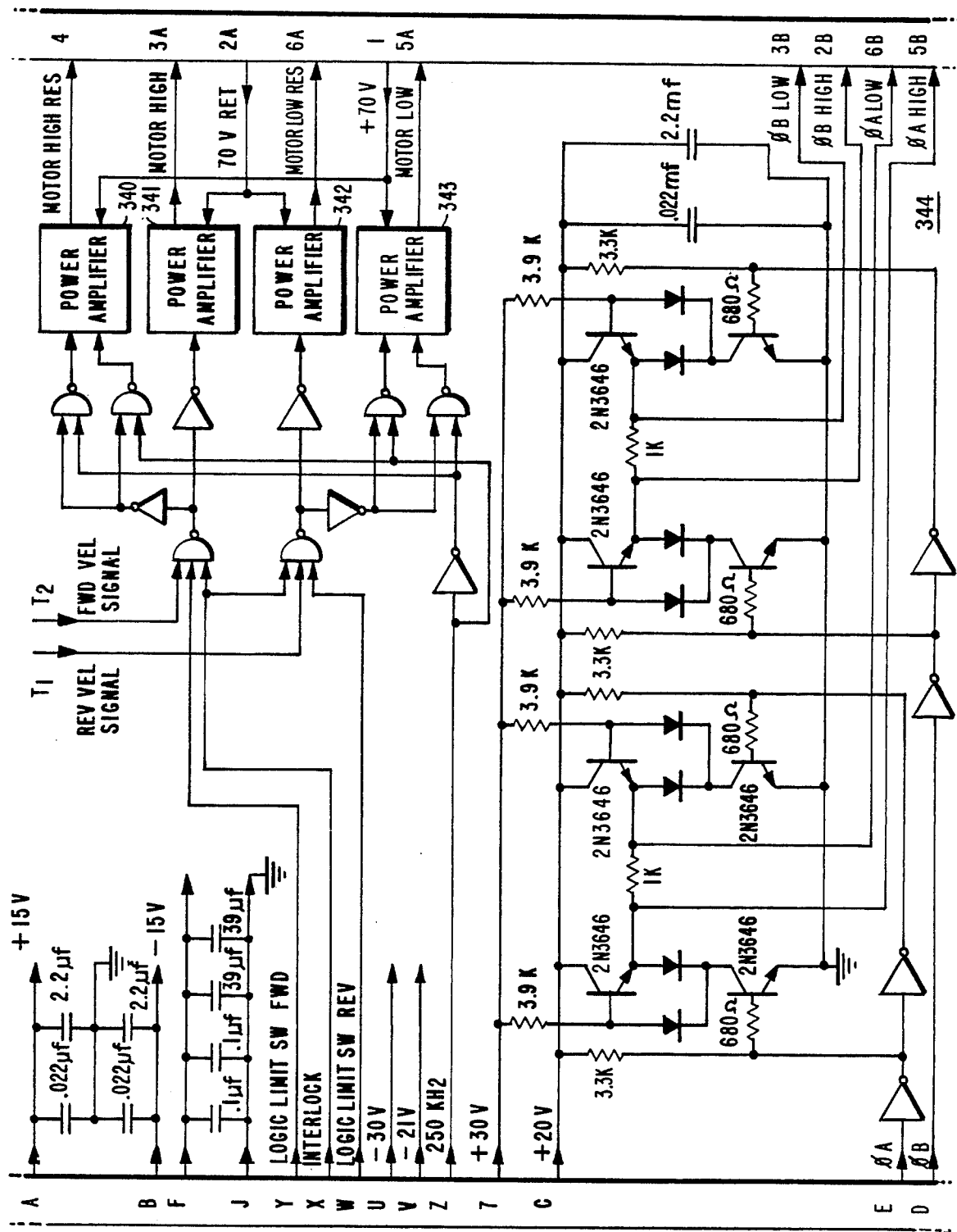

As shown in FIGS. 16A and 16B the servo common board provides control signals for servo operation and updating. The three servos 20, 21 and 22 (FIG. 1) are identical in this embodiment of the invention and exemplified by the X-axis servo 20 as shown in FIGS. 17A and 17B. The three servo channel boards, the servo common board and the A-Register are serially connected in a loop. Data passes from the A-Register and is input to a Δ-Register 276 (FIG. 17A) on the X-axis servo board via I/O channel-2. Data then passes from the X-axis channel board via I/O channel-1 to the I/O channel-2 of the Y-axis servo board (not shown). Similarly, data passes out of the Y-axis servo board into the Z-axis servo board (not shown) and out of the Z-axis servo board to the common board F-Register 312 and back to the A-Register. Thus, communication is provided between the data processor, the three servo channel boards and the servo common board.

Figure 18:
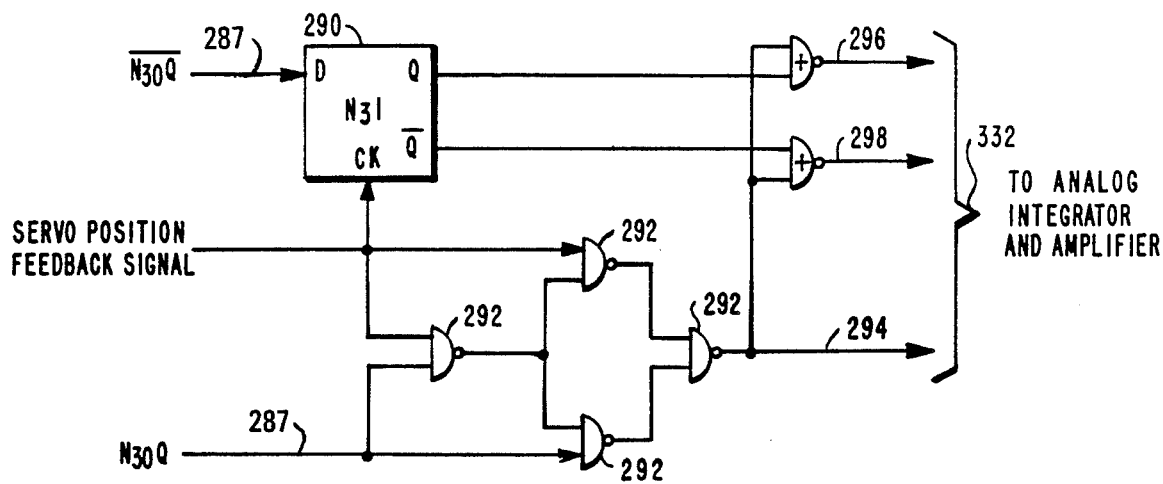
FIGS. 18 and 19 are schematic representations of a machine control interface to a data processor.

The servo drives generate control signals to position the servo motors in response to these commands transferred from the data processor. A resolver 78 (FIG. 3) is used to provide a closed servo feedback loop. Resolvers are excited with digital square waves generated on the common board by a flip flop counter, $N_{22}$ 278 and $N_{23}$ 280. The resolver output signal is a square wave that is processed on the servo board with shaping circuits 82 and applied to an error detector 284 which also receives command signals from a flip-flop $N_{30}$ 286. A quasidigital position error signal 87 from the error detector 284 is connected to an analog error signal by an analog integrator and amplifier 88. The command signal, which is a square wave, is generated by the phase counter 302, which is continually incremented to form a square wave, where the phase of that square wave is changed by a number in the $\Delta$-Register 276 with a full adder 304 and carry flip-flop 306. The command signal 287 is a square wave with a phase that is advanced or retarded with a positive or negative $\Delta$ command number. The phase counter sign bit $N_{30}$ 286 provides a command square wave which is compared with the resolver feedback square wave 83 in the error detector 284 to generate an error signal. As shown in FIG. 18 this error signal has a polarity defined by the $N_{31}$ flip-flop 290 which defines whether the feedback signal leads or lags the command signal. NAND gates 292 provide an exclusive or function defining the out-of-phase condition of the feedback and command square waves with an output pulse 294 having a width that is proportional to the magnitude of the error. The error signal is actually a two wire ternary signal, wherein the line 296 or 298 that contains the pulse defines the polarity and the width of the pulse defines the magnitude.

The contour commands are provided to the servos 20, 21, and 22 by the data processor 12 under program control. They are generated successively in real time at an elemental device determined rate and consist of whole number delta commands for each of the servos to command intermediate path defining points along the contour, known to those skilled in the art as interpolation commands. These commands are provided in real time under data processor program control, wherein real time is herein intended to mean having a time characteristic associated with the time related response of the elemental extremity.

Figure 19:
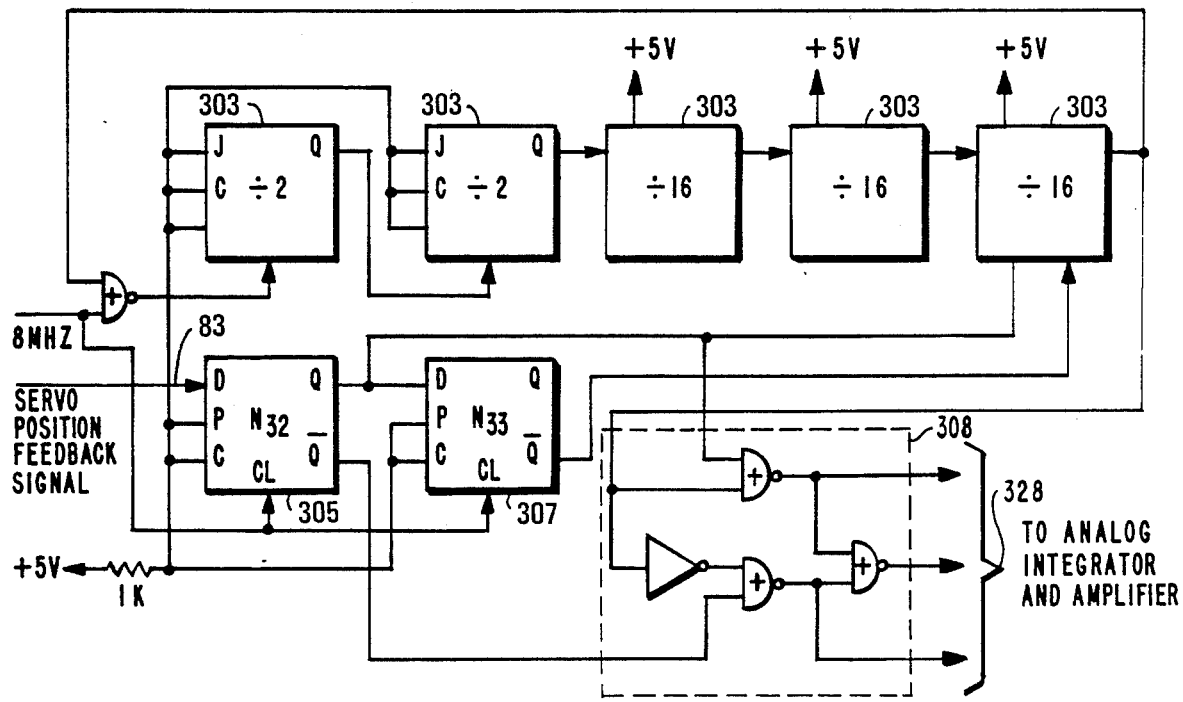

As shown in FIG. 17 and more particularly in FIG. 19 the feedback signal is processed with a digital tachometer 92 which compares the input square wave 83 from the resolver 78 with a reference square wave generated in the tachometer 92. Flip flops $N_{32}$ 305 and $N_{33}$ 307 synchronize the reference square wave counter 303 with the feedback signal 83, while the output gates 308 detect the pulse width difference between the reference and feedback square waves as indicative of velocity. The polarity of this velocity is defined by whether the reference square wave is of a greater or lesser period than the feedback square wave.

The calculations for the commands which are loaded into the $\Delta$ register 276 (FIG. 17) are performed in the data processor under program control. This capability eliminates the need for the digital differential analyzer computational elements typically used for contouring. The relative magnitudes of the $\Delta$ parameters loaded into the plurality of channel card $\Delta$ registers define the relative position commands or, as a function of time, the relative velocity commands of the plurality of servo channels. As these commands are executed, the three servo axes are driven relative to each other to provide fully synchronized operation controlled through the computations in the data processor.

As shown in FIG. 16, the data processor also controls the speed at which the $\Delta$ parameters increment the phase counter. The data processor loads a number into the FR-Register 310, and this number is added to the R-Register 312 every half cycle, as controlled by the signal 314 from the excitation counter composed of flip-flops $N_{25}$ 317 and $N_{24}$ 316. When the R-Register 312 overflows, an update is commanded causing adder 318 and associated carry flip-flop $N_{27}$ 320 to add the contents of the $\Delta$-Register 276 to the phase counter 302 (FIG. 17) to execute the contour command. The mode control flip flops $N_{21}$ 322 and $N_{20}$ 324 are reset to request additional contour information from the data processor through the $N_{26}$ flip flop 326 and its SD 13 output signal. It should be noted that this SD-13 (hexadecimal) is the same as the previously described SD-11 (decimal), where hexadecimal and decimal numbers may in general be interchanged herein. After loading new contour commands, the data processor will generate the $\overline{DC13}$ signal to initiate another contour step.

An alternate technique would replace the $N_{30}$ flip-flop 286 (FIG. 17) with a toggle flip flop which would be clocked by a data processor discrete output command at appropriate times thereby generating an output square wave with the timing of that discrete output command controlling the phase and thereby defining the whole number position command. This controlled square wave is an intrinsic signal form which is used directly by the servos in the error detector 284 (FIG. 17) as the command input. It is generated directly by the data processor with a precisely timed discrete output under program control as defined by the contouring computations.

The data processor can operate interactively in conjunction with the servo intrinsic signal forms where the square wave servo has parameters such as velocity 94, position 83, and position error 87 available in square wave form. The data processor can interrogate these square wave signals as discrete inputs with the skip on discrete instructions and derive the parameter from the pulse width or phase of the square waves.

As shown in FIG. 16 the common board further includes a power supply 334, a ramp generator 336 generating ramp functions used by a servo drive signal generator 338 (FIG. 17), and counters generating signals used by the ramp generator 336.

As shown in FIG. 17, the channel board further includes motor drive power amplifiers 340, 341, 342 and 343 as well as resolver excitation 344.

TABLE I

| A-Register |
|---|
| $A_{15}D = FAD \cdot [(K_2Q \cdot P50) + (K_3Q \cdot P51) + (K_4Q \, P52) +$ |
| $(K_5Q \, P53)] + (FAQ \cdot SPM_0Q) + (FAB \cdot P108) + (FAE \cdot K_1Q) +$ |
| $A_0Q \, FW \cdot SPM_0Q + A_0Q[FAC + FAF + WG + (FD + FG) \cdot$ |
| $(B_3Q + B_2Q)] + (FT + FU + FX) \, (\Sigma A)$ |

TABLE I-continued $\overline{A_N \text{ Clock}} = \overline{P_3} \cdot [\text{FAQ} + \text{FAB} +$ $\text{FAE} + \text{FW} + \text{FAC} + \text{FAD} + \text{FAF} + \text{WO} + \text{FT} + \text{FU} + \text{FX} +$ $(\text{FD} + \text{FG}) \cdot (\text{B}_3\text{Q} + \text{B}_2\text{Q})]$

A-Adder $\Sigma A = [(P2 \cdot FB) + (FT + FU + FX) \cdot A_0Q +$ $FC] \oplus [FU \oplus SPM_0Q] \oplus [K_7Q + FU \cdot B15]$ $\overline{A_C} = A_0Q \cdot P18 + FB \cdot P2$ $A^* = \overline{FC}$ $A_1 = A_2 = B_1 = B_2 = \text{Ground}$ $\overline{B_C} = ]P85 + FU$ $C_N = K_7Q + FU \cdot B15$ $C_{N+1}A = [(P2 \cdot FB) + (FT + FU + FX) \cdot A0Q + FC] \cdot$ $[FU \oplus SPM_0Q] + (P2 \cdot FB) + (FT + FU + FX) \cdot A0Q +$ $FC] \cdot [K_7Q + FU \cdot B15] + [FU \oplus SPM_0Q] \cdot [K_7Q + FU \cdot B15]$

B Flip Flops $B_0T = B0[\overline{D_0Q} \cdot (C_3Q \cdot \overline{C_2Q} \cdot \overline{C_1Q} \cdot C_0Q \cdot K_{11}Q \cdot W0) +$ $\overline{Y6} \cdot W1 \cdot \overline{C_3Q} \cdot C_2Q + FAB + FAC + FAD + FAH]$ $B_0 \text{ Clock} = \overline{P3\Delta}$ $B_1T = B_0Q + B0 \cdot [\overline{D_1Q} \cdot (C_3Q \cdot \overline{C_2Q} \cdot \overline{C_1Q} \cdot C_0Q \cdot K_{11}Q \cdot W0) +$ $\overline{Y6} \cdot W1 \cdot \overline{C_3Q} \cdot C_2Q + FAB + FAC + FAD + FAH]$ $B_1 \text{ Clock} = \overline{P3\Delta}$ $B_2T = B_0Q + B_1Q + B0 \cdot [\overline{D_1Q} \cdot (C_3Q \cdot \overline{C_2Q} \cdot \overline{C_1Q} \cdot C_0Q \cdot K_{11}Q \cdot W0) +$ $\overline{Y6} \cdot W1 \cdot \overline{C_3Q} \cdot C_2Q + FAB + FAC + FAD + FAH +$ $W3 \cdot \overline{YLL} + C_2Q \cdot C_3Q \cdot W0 + K_2Q \cdot \overline{K_1Q} \cdot W0 + \overline{Y11} \cdot W0 + W6]$ $B_2 \text{ Clock} = \overline{P3\Delta}$ $B_3T = B_0Q + B_1Q + B_2Q + B0 \cdot [\overline{D_3Q} \cdot (C_3Q \cdot \overline{C_2Q} \cdot \overline{C_1Q} \cdot$ $C_0Q \cdot K_{11}Q \cdot W0) + \overline{Y6} \cdot W1 \cdot \overline{C_3Q} \cdot C_2Q + FAB + FAC +$ $FAD + FAH + W1 + W4 + W5 + FE + FM]$ $B_1 \text{ Clock} = \overline{P3\Delta}$

C-Register $C_D = I4$ $\overline{C_0 \text{ Clock}} = \overline{P3} \cdot B0 \cdot (FAM + FZ)$ $C_1D = I5$ $\overline{C_1 \text{ Clock}} = \overline{P3} \cdot B0 \cdot (FAM + FZ)$ $C_2D = \overline{I6} \cdot (FAM + FZ)$ $\overline{C_2 \text{ Clock}} = \overline{P3} \cdot B0 \cdot (FR + FS + FAI + FJ + FAM + FZ)$ $C_3D = I7$ $\overline{C_3 \text{ Clock}} = \overline{P3} \cdot B0 \cdot (FAM + FZ)$

D-Register $D_{11}D = P2 \cdot (FA + FC) + B11 \cdot FJ + B10 \cdot (FR + FS) + M_0Q \cdot FK +$ $\Sigma A \cdot FB + (FD + FG)(B_3Q + B_2Q) \cdot A_0Q$ $\overline{D_N \text{ Clock}} = \overline{P3} [FJ + FK + FR + FS + FD + FG \cdot (B_3Q + B_2Q) \cdot W0]$

M-Register $M_{11}D = P43 = B9 \cdot FAL + (FD + FY) \cdot SPM_0Q + D_0Q \cdot FR + FK \cdot$ $K_7Q + (\Sigma M \cdot B10) \cdot (FAI + FAG \cdot P105) + (\Sigma M \cdot B11) \cdot$ $[FAG \cdot P105 + (\overline{B_3Q} + \overline{B_2Q}) \cdot W0 + FS + FO + FG + FJ]$ $\overline{M_N \text{ Clock}} = \overline{P42} = \overline{P3} \cdot [(B_3Q + B2Q) \cdot$ $(FAL + FY) + FK + FR + FD + FAI + FAG \cdot P105 +$ $(\overline{B_3Q} + \overline{B_2Q}) \cdot W0 + FS + FO + FG + FJ]$

M-Adder $\Sigma M = M_0Q \oplus K_8Q \oplus P44$ $A_1 = A_2 = B_1 = B_2 = \text{Ground}$ $C_N = K_8Q$ $C_{N+1}M = (M_0Q \cdot K_8Q) + (M_0Q \cdot P_{43}) + (K_8Q \cdot P43)$ $\overline{A_C} = M_0Q$ $\overline{B_C} = P_{44}A$ $\overline{B^*} = P_{44}B$

W Flip Flops $W_0T = FR + FS + FJ + [FZ \cdot \overline{L_1Q} \cdot (\overline{\text{interrupt}} + K1Q)]$ $W_0 \text{ Clock} = P3 \cdot B0$ $W_1T = W_0Q + FZ \cdot Y10$ $W_1 \text{ Clock} = P3 \cdot B0$ $W_2T = W_0Q \cdot W_1Q$ $W_2 \text{ Clock} = P3 \cdot B0$

Z-Register $Z_ND = A_0Q \text{ (Delayed)}$ $\overline{Z_N \text{ Clock}} = \text{OW-7-Bi, where } i = 11-N$

$C_{15-6}$-Register $C_{15}D = A_0Q \text{ (Delayed)}$ $C_N \text{ Clock} = \text{OW-8 (Turret Select)}$

K-Register $K_0D = FB$ $\overline{K_0 \text{ Clock}} = \overline{P3} \cdot B14$ $K_1D = (FA + FB) C_3Q \cdot A_0Q + FV + \overline{Y10} \cdot FZ + FC \cdot \Sigma A$ $\overline{K_1 \text{ Clock}} = \overline{P3} \cdot B0 \cdot [FV + FL + W0 + W7 + (\overline{Y10} + C_3Q) \cdot FZ]$ $K_2D = FAD \cdot A_2Q + FC$ $\overline{K_2 \text{ Clock}} = \overline{P3} \cdot (FZ + FAD + W7 + FC)$ $K_3D = FAD \cdot K_2Q + FL + FV \cdot D_0Q$ $\overline{K_3 \text{ Clock}} = \overline{P3} \cdot [C_3Q \cdot FZ + FL \cdot B11 + B0 \cdot W0 + B0 \cdot W7 + FV + FAD]$ $K_4D = FL \cdot Y4 + FV \cdot D_1Q + FAD \cdot K_3Q$ $\overline{K_4 \text{ Clock}} = \overline{P3} \cdot [C_3Q \cdot FZ + FL \cdot B11 + B0 \cdot W0 + B0 \cdot W7 + FV + FAD]$ $K_5D = Y2 \cdot W0 + FV \cdot D_4Q + FAD \cdot K_5Q + FL \text{ K Q}$ $\overline{K_5 \text{ Clock}} = \overline{P3} \cdot [C_3Q \cdot FZ + FL \cdot B11 + B0 \cdot W0 + B0 \cdot W7 + FV + FAD]$ $\overline{K_7D} = [C_{N+1}A \cdot \overline{B0} \cdot \overline{FK} \cdot \overline{KX} + FK \cdot F_0Q]$ $\overline{K_7 \text{ Clock}} = \overline{P3} \cdot [FK + FAQ + FAB + FAE + FW + FAC +$ $FAF + FAD + FT + FU + FX + W0 + (FD + FG) (B Q + B2Q)]$ $K_8D = C_{N+1}M \cdot \overline{B0}$ $\overline{K_8 \text{ Clock}} = \overline{P3} \cdot (B_3Q + B_2Q) \cdot (FAL + FY) + FK + FR + FD +$

TABLE I-continued $$FAI+FAG \cdot P105+(B_3Q+B_2Q) \cdot W0+FS+FO+FG+FJ]$$

$K_{10}D = I2$ $\overline{K_{10} \text{ Clock}} = \overline{P3} \cdot B0 \cdot (FAM+FZ)$ $K_{11}D = I3$ $\overline{K_{11} \text{ Clock}} = \overline{P3} \cdot (FAM+FZ)$

I Flip-Flops (FIG. 13)

$I_1T = V_{CC}$ $\overline{I_1 \text{ Clock}} = D0\text{-}8$ $I_2T = V_{CC}$ $\overline{I_2 \text{ Clock}} = D0\text{-}4$ $I_3T = V_{CC}$ $\overline{I_3 \text{ Clock}} = D0\text{-}5$ $I_4T = V_{CC}$ $\overline{I_4 \text{ Clock}} = D0\text{-}6$

L-Register $L_1D = 0$ $L_1P = \overline{L_2Q}$ (Power Supply Active Signal)

$L_1 \text{ Clock} = \overline{P106}$ = Discrete Output 2

$L_2D = P87$ $L_2 \text{ Clock} = W0$

A Overflow Flip-Flop (OF$_i$)

$OF_iD = (\overline{A_0Q \cdot P18}) \cdot (\overline{FB \cdot P2}) \cdot (8 \; P85 \oplus \overline{FU}) \cdot$ $K_7Q \cdot P18+FB \cdot P2 \cdot (P85 \oplus FU) \cdot K_7Q$ $\overline{OF_i \text{ Clock}} = (FT+FU) \cdot \overline{P3}$

Lamp Display Register (L$_3$—L$_{15}$)

$L_{15}D = A_0Q$
$L_N \text{ Clock} = OW\text{-}11$

Numeric Display Register (N$_0$—N$_{15}$)

$N_{15}D = A_0Q$
$N_N \text{ Clock} = OW\text{-}9$

TABLE II

P Terms $P0 = \Sigma A$ $P1 = ]93 \; M$ $P2 = [I0 \cdot B7+I1 \cdot B6+I2 \cdot B5+I3 \cdot B4+I4 \cdot B3+I5 \cdot B2+$
$I6 \cdot B1+I7 \cdot B0] \cdot [FN+FQ]+(B13 \cdot I2) \cdot (\overline{C_3Q}+C_2Q+C_1Q+$
$\overline{C_0Q})+I1 \cdot B14+I0 \cdot B15+I4 \cdot B11 \cdot C_3Q \cdot C_2Q+$
$(I3 \cdot B12) \cdot [(\overline{C_3Q}+\overline{C_0Q})+(C_3Q \cdot \overline{C_2Q} \cdot \overline{C_1Q} \cdot C_0Q)]$ $P3 = \overline{P109 \cdot B_4Q} = \overline{(B_5Q \cdot B15\text{-}8mc \cdot \overline{B15}) \cdot B_4Q}$ = Master Clock $P3\Delta$ = P3 delayed clock $P4 = A_0Q$ $P7 = (\overline{C_1Q} \; \overline{C_0Q}+K_{11}Q)K_{10}Q \; \overline{K_0Q} \; D_1Q \; D_2Q$ $P11 = \overline{C_3Q} \cdot C_2Q$ $P12 = C_2Q \cdot \overline{C_1Q} \cdot \overline{C_2Q} \cdot C_3Q$ $P14 = C_3Q \cdot \overline{C_2Q} \cdot \overline{C_1Q} \cdot C_0Q \cdot K_{11}Q \cdot W0$

TABLE II-continued $P15 = C_2Q \cdot C_3Q$ $P16 = Y38 \cdot C_0Q = \rightarrow FT+FU$ $P17 = FW+FX+FU+FT+FAC+FAQ$ $P18 = FT+FU+FX$ $P21 = B_2Q+B_3Q$ $P22 = \overline{B_2Q}+\overline{B_3Q}$ $P24 = B0 \cdot \overline{P3} = B0(\text{Early Clock})$ $P25 = \overline{K_1Q} \cdot K_2Q$ $P26 = K_4Q+K_5Q$ $P27 = \overline{Y11 \cdot K_5Q \cdot, 2 \; K_1Q}$ $\overline{P28} =$
$FAD \cdot (K_2Q \cdot P50+K_3Q \cdot P51+K_4Q \cdot P52+K_5Q \cdot P53)+FAQ \cdot P85$ $P29 = FA+FC$ $P30 = FC+FB$ $P31 = FA+FB$ $P33 = W3 \cdot \overline{Y11}+(C_2Q \cdot C_3Q+\overline{K_1Q} \cdot K_2Q+\overline{Y11})W0+W6$ $P35 = W0+W7$ $P36 = W2+W5$ $P37 = FD+FG$ $P38 = W1+W4+W5+W2 \cdot \overline{Y11}$ $P39 = FAM+FZ$ $P40 = (FR+FS+FAI+FJ)+(FAM+FZ)$
$P41 = FR+FS$ $P42 = \overline{P3} \cdot [(B_3Q+B_2Q) \cdot (FAL+FY)+FK+FR+FD+$
$FAI+FAG \cdot P105+(\overline{B_3Q}+\overline{B_2Q}) \cdot W0+FS+F0+FG+FJ]$ $P44 = P44A+P44B = B10 \cdot (FAI+FAG \cdot P105)+B11 \cdot (FAG \cdot P105+$
$\overline{B_2Q} \cdot W0+\overline{B_2Q} \cdot W0+FS+FO+FG+FJ)$ $P44A = (FAI+FAG \cdot P105)B10$ $P44B = (FAG \cdot P105+(\overline{B_2Q}+\overline{B_3Q})W0+FS+FO+FG+FJ)B11$ $P47 = W1 \cdot SPM_0Q \cdot \overline{FY} \cdot \overline{C_3Q} \cdot C_2Q+P2 \cdot (FN+FO)+[FD+$
$(B_3Q+B_2Q) \cdot (FAL+FY)(B_3Q+B_2Q)]M_0Q+P88$ $P48 = FAL+FY+FN+FQ+B_2Q \cdot FE+FW+$
$FX+FU+FT+FAC+FC+FB+FD+FAQ$ $P50 = P133 \cdot \overline{A} \cdot \overline{B} \cdot \overline{C}$ $P51 = P133 \cdot \overline{A} \cdot \overline{B} \cdot C$ $P52 = P133 \cdot \overline{A} \cdot B \cdot \overline{C}$ $P53 = P133 \cdot \overline{A} \cdot B \cdot C$ $P54 = P133 \cdot A \cdot \overline{B} \cdot \overline{C}$ $P55 = P133 \cdot A \cdot \overline{B} \cdot C$ $P56 = P133 \cdot A \cdot B \cdot \overline{C}$ $P57 = P133 \cdot A \cdot B \cdot C$ $P58 = P134 \cdot \overline{A} \cdot \overline{B} \cdot \overline{C}$ $P59 = P134 \cdot \overline{A} \cdot \overline{B} \cdot C$ $P60 = P134 \cdot \overline{A} \cdot B \cdot \overline{C}$

TABLE II-continued

P61 = P134·$\overline{A}$·B·C

P62 = P134·A·$\overline{B}$·$\overline{C}$

P63 = P134·A·$\overline{B}$·C

P64 = P134·A·B·$\overline{C}$

P65 = P134·A·B·C

A = FAL+W0·K$_3$Q+Y11·$\overline{FY}$·W1·D$_0$Q

B = W0·K$_4$Q+Y11·$\overline{FY}$·W1·D$_1$Q+FY+$\overline{Y11·W0}$

C = W0·K$_5$Q+Y11·$\overline{FY}$·W1·D$_2$Q

P85 = SPM$_0$Q (all registers)

P87 = External interrupt

P88 = FAQ·SPM$_0$Q+FB·SPM$_0$Q+FC·ΣA+FAC·A$_0$Q

P89 = External interrupt

P90 = (FR+FS)+(FD+FG)

P91 = Y6·W1·$\overline{C_3Q}$·C$_2$Q+FAB+FAC+FAD+FAH

P92 = B7·B$_4$Q·(P36+P91) = Cycle initiate command

P93 = B3·B$_4$Q·(P36+P91) = Restore command $\overline{P97}$ = (FAL+FY)(B$_3$Q+B$_2$Q)

P98 = FAL+FY

P99 = $\overline{ΣA·FB}$

P101 = $\overline{B11·I_4·C_2Q·C_3Q}$

P102 = $\overline{(\overline{C_0Q}·\overline{C_3Q})+(C_0Q·\overline{C_1Q}·\overline{C_2Q}·C_3Q)}$ P103 = (K$_5$Q·$\overline{Y11}$)(M$_9$Q+$\overline{M_{10}Q}$+$\overline{M_{11}Q}$) = RW Mode P104 = $\overline{P3}$·FAB

P105 = P50·DI-0+P51·DI-1+P52·DI-2+P53·DI-3+P54·DI-4+

P55·DI-5+P56·DI-6+P57·DI-7+P58·DI-8+P59·DI-9+P60·

DI-10+P61·DI-11 (Discrete Input DI-n To Data Processor)

P106 = FAH·P51 = DO-2

(Resets L$_1$ flip flop during power turn-on)

P108 = IW-0·P50+IW-1·P51+IW-2·P52+IW-3·P53+IW-4·

P54+IW-5·P55+IW-6·P56+IW-7·P57

P109 = B$_5$Q·B15+8mc·$\overline{B15}$

P110 = $\overline{M_9Q+\overline{M_{10}Q}+\overline{M_{11}Q}}$

P111 = $\overline{I_6}$·P59 = $\overline{I_6}$(FAM+FZ)

P112 = (FR+FS+FAI+FJ+FAM+FZ)B0·$\overline{P3}$

P113 = (FAM+FZ)B0·$\overline{P3}$ $\overline{P114}$ = FAI+FAG·P105+($\overline{B_3Q}$+$\overline{B_2Q}$)·W0+FS+FO+FG+FJ

P115 = FAQ+FAB

P116 = ($\overline{FAB+FAG+FAH}$)I$_1$Q

P120 = SPM$_0$Q (4 registers)

P121 = SPM$_0$Q (4 registers)

$\overline{P133}$ = Y11·$\overline{FY}$·W1·$\overline{D_4Q}$·$\overline{D_3Q}$ $\overline{P134}$ = Y11·$\overline{FY}$·W1·$\overline{D_4Q}$·D$_3$Q $\overline{P135}$ = Y11·$\overline{FY}$·W1·D$_4$Q·$\overline{D_3Q}$ $\overline{P136}$ = Y11·$\overline{FY}$·W1·D$_4$Q·D$_3$Q $\overline{P151}$ = $\overline{JOG}$·($\overline{S8}$+$\overline{S9}$+$\overline{S10}$+$\overline{S11}$)

P152 = Servo Lockup+JOG·($\overline{S8}$+$\overline{S9}$+$\overline{S10}$+$\overline{S11}$)

P153 = $\overline{S8}$

P154 = $\overline{S9}$

P155 = $\overline{S10}$

P156 = $\overline{S11}$

P158 = $\overline{Y11·K_5Q·W2}$

P511 = FN+FQ

Memory Output Lines

I$_7$ - Most Significant Bit
I$_6$ - Second Significant Bit
I$_5$ - Third Significant Bit
I$_4$ - Fourth Significant Bit
I$_3$ - Fifth Significant Bit
I$_2$ - Sixth Significant Bit
I$_1$ - Seventh Significant Bit
I$_0$ - Least Significant Bit

Y Terms

Y1 = ($\overline{C_1Q}$·$\overline{C_0Q}$·K$_{11}$Q)K$_{10}$Q·$\overline{K_0Q}$·D$_0$Q+Y6+K$_1$Q·K$_2$Q Y2 = $\overline{Y11}$·$\overline{K_{11}Q}$K$_{10}$Q·C$_1$Q·$\overline{C_0Q}$ D$_1$Q·D$_0$Q Y3 = $\overline{C_3Q}$·$\overline{C_2Q}$·C$_1$Q·$\overline{C_0Q}$·$\overline{K_{11}Q}$I1·$\overline{I0}$

Y4 = K$_1$Q·K$_2$Q+Y6

Y5 = Y3+K$_2$Q

Y6 = C$_1$Q·$\overline{C_0Q}$·$\overline{K_{11}Q}$·D$_0$Q

Y7 = $\overline{L_3Q}$+K$_1$Q

Y10 = (P89+Y7)$\overline{L_1Q}$

Y11 = C$_2$Q+C$_3$Q

Y38 = $\overline{Y6}$·W1·$\overline{C_3Q}$·C$_2$Q

Y39 = C$_3$Q·$\overline{C_2Q}$·C$_2$Q

B Terms

B0 = $\overline{B_3Q}$·$\overline{B_2Q}$·$\overline{B_1Q}$·$\overline{B_0Q}$

B1 = $\overline{B_3Q}$·$\overline{B_2Q}$·$\overline{B_1Q}$·B$_0$Q

B2 = $\overline{B_3Q}$·$\overline{B_2Q}$·B$_1$Q·$\overline{B_0Q}$

B3 = $\overline{B_3Q}$·$\overline{B_2Q}$·B$_1$Q·B$_0$Q

B4 = $\overline{B_3Q}$·B$_2$Q·$\overline{B_1Q}$·$\overline{B_0Q}$

B5 = $\overline{B_3Q}$·B$_2$Q·$\overline{B_1Q}$·B$_0$Q

B6 = $\overline{B_3Q}$·B$_2$Q·B$_1$Q·$\overline{B_0Q}$

B7 = $\overline{B_3Q}$·B$_2$Q·B$_1$Q·B$_0$Q

B8 = B$_3$Q·$\overline{B_2Q}$·$\overline{B_1Q}$·$\overline{B_0Q}$

B9 = B$_3$Q·$\overline{B_2Q}$·$\overline{B_1Q}$·B$_0$Q

B10 = B$_3$Q·$\overline{B_2Q}$·B$_1$Q·$\overline{B_0Q}$

B11 = B$_3$Q·$\overline{B_2Q}$·B$_1$Q·B$_0$Q

B12 = B$_3$Q·B$_2$Q·$\overline{B_1Q}$·$\overline{B_0Q}$

B13 = B$_3$Q·B$_2$Q·$\overline{B_1Q}$·B$_0$Q

B14 = B$_3$Q·B$_2$Q·B$_1$Q·$\overline{B_0Q}$

TABLE II-continued $B15 = B_3Q \cdot B_2Q \cdot B_1Q \cdot B_0Q$

W Terms $W0 = \overline{W_2Q} \cdot \overline{W_1Q} \cdot \overline{W_0Q}$ $W1 = \overline{W_2Q} \cdot \overline{W_1Q} \cdot W_0Q$ $W2 = \overline{W_2Q} \cdot W_1Q \cdot \overline{W_0Q}$ $W3 = \overline{W_2Q} \cdot W_1Q \cdot W_0Q$ $W4 = W_2Q \cdot \overline{W_1Q} \cdot \overline{W_0Q}$ $W5 = W_2Q \cdot \overline{W_1Q} \cdot W_0Q$ $W6 = W_2Q \cdot W_1Q \cdot \overline{W_0Q}$ $W7 = W_2Q \cdot W_1Q \cdot W_0Q$

Input Words $IW\text{-}0 = B11 \cdot P3 + B10 \cdot P2 + B9 \cdot P1 + B8 \cdot P0 + B7 \cdot \text{Spare} + B6 \cdot J2 + B5 \cdot J1 + B4 \cdot J0 + B3 \cdot M2 + B2 \cdot M1 + B1 \cdot M0 + B0 \cdot \text{Spare}$ (Selector Switch Scanout and Input Channel-0)

$IW\text{-}1 = B7 \cdot SA + B6 \cdot SB + B5 \cdot SC + B4 \cdot SD + B3 \cdot SE + B2 \cdot \text{Spare} + B1 \cdot SV + B0 \cdot \overline{SJ}$ (Momentary Switch Scanout and Input Channel-1)

$IW\text{-}2 = \text{Spare}$ $IW\text{-}3 = B11 \cdot S11 + B10 \cdot S10 + B9 \cdot S9 + B8 \cdot S8 + B7 \cdot S7 + B6 \cdot S6 + B5 \cdot S5 + B4 \cdot S4 + B3 \cdot S3 + B2 \cdot S2 + B1 \cdot S1 + B0 \cdot \text{Spare}$ (Auxiliary Control Signals)

$IW\text{-}4 = B11 \cdot T0 + B10 \cdot T1 + B9 \cdot T2 + B8 \cdot T3 + B7 \cdot T4 + B6 \cdot T5 + B5 \cdot T6 + B4 \cdot T7 + B3 \cdot \text{Spare} + B2 \cdot \text{Spare} + B1 \cdot \text{Spare} + B0 \cdot T8$ (Elemental Tape Reader Inputs)

$IW\text{-}5 = NRR_0Q$ (Numeric Display Register)

$IW\text{-}6 = \text{Spare}$ $IW\text{-}7 = \text{Spare}$

Output Words $OW\text{-}3 = \overline{P53 \cdot P104}$ $OW\text{-}4 = \overline{P54 \cdot P104}$ $OW\text{-}6 = \overline{P56 \cdot P104}$ $OW\text{-}7 = \overline{P57 \cdot P104}$ $OW\text{-}8 = \overline{P58 \cdot P104}$ $OW\text{-}9 = \overline{P59 \cdot P104}$ $OW\text{-}10 = \overline{P60 \cdot P104}$ $OW\text{-}11 = \overline{P61 \cdot P104}$

Discrete Outputs $DO\text{-}0 = FAH \cdot P50$
$DO\text{-}1 = FAH \cdot P51$
$DO\text{-}2 = FAH \cdot P52$
$DO\text{-}3 = FAH \cdot P53$
$DO\text{-}4 = FAH \cdot P54$
$DO\text{-}5 = FAH \cdot P55$
$DO\text{-}6 = FAH \cdot P56$
$DO\text{-}7 = FAH \cdot P57$
$DO\text{-}8 = FAH \cdot P58$
$DO\text{-}9 = FAH \cdot P59$
$DO\text{-}10 = FAH \cdot P60$
$DO\text{-}11 = FAH \cdot P61$

S Terms $S3 = 1 \text{ MHZ}$

TABLE II-continued $S100 = FAB \cdot \overline{N_{20}Q}$ $S101 = \overline{S100 + S3 \cdot N_{20}Q}$ $S103 = \overline{\overline{S3} \cdot BS7}$ $BS7 = $ Bit time 7 in the servo bit time counter $S118 = N_{20}Q \cdot \overline{N_{21}Q}$ $\emptyset A = N_{22}Q$ $\emptyset B = N_{23}Q$

TABLE III $FA = W0 \cdot \overline{K_1Q} \cdot (\overline{B15 \cdot Y3 + K_2Q})$ $FB = W0 \cdot K_1Q \cdot (\overline{B15 \cdot Y3 + K_2Q})$ $FC = W0 \cdot (B15 \cdot \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0} + K_2Q)$ $FD = \overline{C_3Q} \cdot \overline{C_2Q} \cdot K_5Q \cdot W1$ $FE = \overline{C_3Q} \cdot \overline{C_2Q} \cdot K_5Q \cdot W2$ $FF = \overline{C_3Q} \cdot \overline{C_2Q} \cdot K_5Q \cdot W3$ $FG = \overline{C_3Q} \cdot \overline{C_2Q} \cdot K_5Q \cdot W4$ $FH = \overline{C_3Q} \cdot \overline{C_2Q} \cdot K_5Q \cdot W5$ $FI = \overline{C_3Q} \cdot \overline{C_2Q} \cdot K_5Q \cdot W6$ $FJ = \overline{C_3Q} \cdot \overline{C_2Q} \cdot (\overline{K_4Q} + K_5Q) \cdot W7$ $FK = \overline{C_3Q} \cdot \overline{C_2Q} \cdot \overline{K_5Q} (B11 \cdot \overline{Y1} + K_3Q) \cdot \overline{FAI}$ $FL = \overline{C_3Q} \cdot \overline{C_2Q} \cdot \overline{K_5Q} (B11 \cdot Y1 + K_3Q) \cdot W1$ $FM = \overline{C_3Q} \cdot \overline{C_2Q} \cdot \overline{K_5Q} \cdot \overline{K_3Q} \cdot W2$ $FN = \overline{C_3Q} \cdot \overline{C_2Q} \cdot \overline{K_5Q} \cdot \overline{K_3Q} \cdot W3$ $FO = \overline{C_3Q} \cdot \overline{C_2Q} \cdot \overline{K_5Q} \cdot \overline{K_3Q} \cdot W4$ $FP = \overline{C_3Q} \cdot \overline{C_2Q} \cdot \overline{K_5Q} \cdot \overline{K_1Q} \cdot W5$ $FQ = \overline{C_3Q} \cdot \overline{C_2Q} \cdot \overline{K_5Q} \cdot \overline{K_1Q} \cdot W6$ $FR = \overline{C_3Q} \cdot \overline{C_2Q} \cdot \overline{K_5Q} \cdot K_4Q \cdot \overline{K_3Q} \cdot \overline{K_3Q} \cdot \overline{K_1Q} \cdot W7$ $FS = \overline{C_3Q} \cdot \overline{C_2Q} \cdot \overline{K_5Q} \cdot K_4Q \cdot K_3Q \cdot \overline{K_1Q} \cdot W7$ $FT = Y38 \cdot \overline{C_1Q} \cdot C_0Q$ $FU = Y38 \cdot C_1Q \cdot C_0Q$ $FV = Y38 \cdot C_1Q \cdot \overline{C_0Q}$ $FW = Y38 \cdot \overline{C_1Q} \cdot \overline{C_0Q} \cdot K_{11}Q$ $FX = Y38 \cdot \overline{C_1Q} \cdot \overline{C_0Q} \cdot \overline{K_{11}Q}$ $FY = \overline{C_3Q} \cdot C_2Q \cdot C_1Q \cdot C_0Q \cdot \overline{K_{11}Q} \cdot K_{10}Q \cdot D_0Q \cdot W1$ $FZ = (C_3Q + C_2Q)W2$ $FAB = C_3Q \cdot \overline{C_2Q} \cdot C_1Q \cdot \overline{C_0Q} \cdot W1$ $FAC = C_3Q \cdot \overline{C_2Q} \cdot \overline{C_1Q} \cdot \overline{C_0Q} \cdot W1$ $FAD = C_3Q \cdot \overline{C_2Q} \cdot \overline{C_1Q} \cdot C_0Q \cdot \overline{K_{11}Q} \cdot W1$ $FAE = C_3Q \cdot \overline{C_2Q} \cdot \overline{C_1Q} \cdot C_0Q \cdot K_{11}Q \cdot \overline{K_{10}Q} \cdot W1$ $FAF = C_3Q \cdot \overline{C_2Q} \cdot \overline{C_1Q} \cdot C_0Q \cdot K_{11}Q \cdot K_{10}Q \cdot W1$ $FAG = C_3Q \cdot C_2Q \cdot C_1Q \cdot W1$ $FAH = C_3Q \cdot C_2Q \cdot \overline{C_1Q} \cdot W1$ $FAI = \overline{C_3Q} \cdot \overline{C_2Q} \cdot K_2Q \cdot \overline{K_1Q} \cdot W1$

TABLE III-continued

FAJ = $L_1Q \cdot W3$

FAK = $\overline{L_1Q} \cdot \overline{P89} \cdot Y7 \cdot W3$

FAL = $K_1Q \cdot W4$

FAM = $K_1Q \cdot W5$

TABLE III-continued

FAN = $K_1Q \cdot W6$

FAO = $K_1Q \cdot W7$

FAP = $\overline{C_3Q} \cdot C_2Q \cdot Y6 \cdot \overline{K_{10}Q} \cdot W1$

FAQ = $C_1Q \cdot C_0Q \cdot Y39$

TABLE IV

| | Logic Card | | | | | | | | | |
|---|---|---|---|---|---|---|---|---|---|---|
| | A | B | C | D | K | W | SPM | IFA-1 | IFA-2 | IFA-3 |
| | | | | | Reference Figure | | | | | |
| Pin | 6 | 7 | 8 | 9 | 10 | 11 | 12 | 13 | 14 | 15 |
| 1 | Vcc | Vcc | Vcc | Vcc | Vcc | Vcc | Vcc | Vcc | Vcc | Vcc |
| 2 | — | — | — | B14 | $\overline{P30}$ | — | — | C9Q | W0 | — |
| 3 | Vcc | Vcc | Vcc | Vcc | Vcc | Vcc | Vcc | Vcc | Vcc | Vcc |
| 4 | $M_6Q$ | — | — | B15 | FC | — | — | C6Q | — | — |
| 5 | $M_8Q$ | — | — | B13 | $\overline{B15}$ | P27 | — | C8Q | OW-7 | — |
| 6 | $M_7Q$ | B9 | — | $\overline{P12}$ | W0 | P24 | — | C7Q | — | — |
| 7 | $\overline{M_{10}Q}$ | 8 MHZ | I2 | I0 | $\overline{Y11}$ | $\overline{FAM}$ | — | — | S1 | — |
| 8 | $M_9Q$ | B8 | — | I2 | $\overline{Y3}$ | Y11 | — | P105 | — | — |
| 9 | $\overline{M_{11}Q}$ | — | I3 | B4 | — | $\overline{FAL}$ | — | P104 | S0 | — |
| 10 | — | B6 | I4 | B7 | — | KIQ | — | OW-6 | — | — |
| 11 | P110 | — | I5 | I5 | — | $\overline{FD}$ | — | DI-5 | M1 | $\overline{S3}$ |
| 12 | $\overline{P110}$ | B5 | I7 | A | FAB | $\overline{P38}$ | — | DI-6 | — | — |
| 13 | — | — | $\overline{P113}$ | I7 | FK | P48 | — | DI-7 | — | $\overline{S0}$ |
| 14 | P110 | B4 | $\overline{P111}$ | B2 | P27 | — | — | DI-4 | $\overline{W0}$ | $\overline{S41}$ |
| 15 | FK | — | $\overline{P112}$ | I6 | FA1 | K5Q | — | P60 | — | — |
| 16 | FW | B3 | FAG | B0 | Y11 | Y10 | — | P59 | — | $\overline{S42}$ |
| 17 | — | — | $\overline{FV}$ | I4 | FL | W0 | — | P58 | B0 | — |
| 18 | W0 | B2 | P17 | B3 | D0Q | — | — | P57 | — | — |
| 19 | $\overline{FAD}$ | B0 | $\overline{FAH}$ | B6 | Y2 | K4Q | — | P56 | B3 | $\overline{S2}$ |
| 20 | $\overline{FAF}$ | B1 | W1 | $\overline{D0Q}$ | D2Q | W7 | — | P55 | B1 | $\overline{S1}$ |
| 21 | P16 | $\overline{P3}$ | C3Q | B5 | B11 | K3Q | — | P54 | — | — |
| 22 | P115 | — | P16 | I1 | DIQ | $\overline{FS}$ | — | P61 | B2 | — |
| 23 | $\overline{FAC}$ | B4Q | $\overline{K0Q}$ | P102 | — | — | — | L1Q | M0 | — |
| 24 | $\overline{FR}$ | — | $\overline{P7}$ | P37 | W0 | $\overline{P36}$ | — | DI-9 | T8 | — |
| 25 | D0Q | P93 | D1Q | $\overline{P112}$ | W1 | $\overline{P35}$ | — | DI-10 | S2 | — |
| 26 | P97 | — | — | P40 | W7 | $\overline{FR}$ | — | — | M2 | TX(0) |
| 27 | P114 | B7 | $\overline{Y6}$ | $\overline{P113}$ | — | K3Q | — | DI-11 | — | B5 |
| 28 | $\overline{FY}$ | P92 | $\overline{FAC}$ | $\overline{P3}$ | B0 | W1 | — | DI-8 | S3 | — |
| 29 | P98 | — | $\overline{FU}$ | B12 | C3Q | FA1 | — | C10Q | S9 | B6 |
| 30 | — | — | FU | P39 | $\overline{FV}$ | PAJ | $\overline{P48}$ | — | — | — |
| 31 | FAB | P3 | Y2 | P101 | Y10 | P87 | — | C12Q | P3 | B7 |
| 32 | P108 | — | $\overline{FAB}$ | $\overline{P111}$ | P99 | FJ | $\overline{P50}$ | C11Q | S11 | — |
| 33 | FAE | — | FY | P2 | FB | $\overline{FJ}$ | — | $\overline{D0-4}$ | T1 | B4 |
| 34 | $K_1Q$ | B15 | FY | B11 | $\overline{FAD}$ | P26 | $\overline{P51}$ | $\overline{D0-5}$ | P2 | — |
| 35 | FC | $\overline{P36}$ | I0 | P41 | FZ | P40 | — | $\overline{D0-7}$ | B10 | P51 |
| 36 | P28 | $\overline{B15}$ | — | P29 | — | $\overline{W7}$ | $\overline{P52}$ | OW-8 | T2 | — |
| 37 | $\overline{B0}$ | P109 | $\overline{FAF}$ | P4 | P0 | FZ | — | $\overline{D0-6}$ | B9 | B0 |

TABLE IV-continued

|  |  |  |  |  |  |  |  |  |  |
|---|---|---|---|---|---|---|---|---|---|
| 38 | FAQ | — | — | P21 | — | $\overline{P15}$ | $\overline{P53}$ | OW-7 | B11 | — |
| 39 | $\overline{FAL}$ | — | FAQ | P105 | $\overline{C3Q}$ | $\overline{P25}$ | — | $\overline{D0\text{-}10}$ | T0 | P104 |
| 40 | $\overline{P88}$ | P22 | $\overline{P12}$ | P99 | — | $\overline{W0}$ | $\overline{P54}$ | $\overline{D0\text{-}8}$ | B8 | — |
| 41 | P21 | — | $\overline{D1Q}$ | P22 | $\overline{K1Q}$ | $\overline{P33}$ | — | $\overline{I1Q}$ | P1 | — |
| 42 | B9 | — | — | FAG | $\overline{K1Q}$ | — | $\overline{P55}$ | OW10 | T3 | — |
| 43 | FX | P21 | D0Q | FK | B14 | $\overline{F0}$ | — | $\overline{D0\text{-}11}$ | S8 | TTY"C" |
| 44 | P37 | $\overline{B0}$ | — | M0Q | P85 | P37 | $\overline{P56}$ | $\overline{D0\text{-}9}$ | P0 | — |
| 45 | $\overline{K_5Q}$ | — | FAB | $\overline{FD}$ | $\overline{P35}$ | $\overline{FF}$ | — | FAH | IW-0 | "C" |
| 46 | — | P24 | — | $\overline{FF}$ | — | P41 | $\overline{P57}$ | DW-9 | S10 | — |
| 47 | $\overline{FD}$ | — | $\overline{C3Q}$ | B0Δ | — | P98 | — | P104 | IW-4 | "C" |
| 48 | Y11 | $\overline{P38}$ | — | $\overline{FS}$ | P106 | L1Q | $\overline{P133}$ | C13Q | P4 | — |
| 49 | B0 | — | P102 | $\overline{FY}$ | — | P2 | — | P50 | IW-3 | TS-7 |
| 50 | — | $\overline{D3Q}$ | — | $\overline{P90}$ | $\overline{L2Q}$ | — | C | P51 | YL5 | TS-5 |
| 51 | FU | — | — | Y11 | — | $\overline{P30}$ | — | P53 | S7 | TS-6 |
| 52 | — | $\overline{D2Q}$ | — | W1 | — | P97 | B | P52 | YL4 | TW-4 |
| 53 | B15 | — | — | K3Q | P4 | $\overline{K1Q}$ | — | OW-11 | J2 | $V_S$ |
| 54 | $\overline{P4}$ | $\overline{D1Q}$ | — | K4Q | $\overline{P3}$ | K2Q | A | — | S6 | — |
| 55 | P103 | — | I1 | $\overline{P44B}$ | $\overline{W7}$ | P39 | — | IW-5 | T6 | TX(1) |
| 56 | $\overline{P110}$ | $\overline{D0Q}$ | — | $\overline{FAL}$ | $\overline{P53}$ | Y11 | $\overline{P3A}$ | IW-6 | — | IW-1 |
| 57 | $K_5Q \cdot \overline{Y11}$ | — | — | B10 | P53 | $\overline{P90}$ | — | IW-7 | B7 | B1 |
| 58 | — | P14 | — | $\overline{FAI}$ | P51 | B2Q | P47 | IW-4 | T5 | B2 |
| 59 | — | $\overline{P91}$ | Y11 | P44A | P51 | P17 | — | P108 | B4 | B3 |
| 60 | P85 | $\overline{P33}$ | — | $\overline{K5Q}$ | — | P47 | — | OW-11 | B6 | — |
| 61 | $\overline{P3C}$ | — | — | B | P52 | P88 | — | OW-4 | T7 | — |
| 62 | P2 | — | — | — | P28 | P511 | $\overline{P121C}$ | OW-5 | B5 | — |
| 63 | $\overline{FC}$ | — | $\overline{P91}$ | FY | P115 | M0Q | — | IW-3 | J0 | TS-3 |
| 64 | FB | B14 | — | FV | $\overline{P52}$ | $\overline{P89}$ | P85 | OW-3 | T4 | — |
| 65 | P0 | — | P15 | W0 | P50 | — | — | IW-0 | S5 | TS-2 |
| 66 | P4 | B13 | $\overline{Y3}$ | P114 | $\overline{P50}$ | L3Q | — | IW-2 | J1 | — |
| 67 | D1-7 | — | $\overline{FAD}$ | P133 | $\overline{K3Q}$ | — | — | D1-3 | MFE | TS-0 |
| 68 | $\overline{P44A}$ | B12 | FX | $\overline{P134}$ | K2Q | P3 | $\overline{P120D}$ | 1W-1 | S4 | — |
| 69 | $\overline{P44B}$ | — | FW | C | $\overline{K0Q}$ | P11 | — | D1-2 | XL4 | TS-1 |
| 70 | $M_1Q$ | B11 | FAE | — | K3Q | — | P120C | D1-1 | XL2 | — |
| 71 | $M_0Q$ | — | — | $\overline{D1Q}$ | $\overline{Y6}$ | $\overline{FY}$ | — | $\overline{D0\text{-}1}$ | — | C14Q |
| 72 | $M_2Q$ | B2Q | Y11 | P511 | P7 | P85 | $\overline{P121B}$ | D1-0 | YL-1 | OW-8 |
| 73 | $M_3Q$ | — | $\overline{Y11}$ | $\overline{D2Q}$ | $\overline{FA}$ | — | — | $\overline{D0\text{-}2}$ | — | — |
| 74 | FT | B10 | W0 | $\overline{D3Q}$ | $\overline{P25}$ | — | $\overline{P120B}$ | $\overline{D0\text{-}0}$ | XL1 | — |
| 75 | $M_4Q$ | — | P14 | $\overline{D4Q}$ | $\overline{FC}$ | $\overline{LZQ}$ | — | C14Q | XL5 | — |
| 76 | $M_5Q$ | — | B11 | D5Q | P26 | — | $\overline{P121D}$ | $\overline{D0\text{-}3}$ | YL2 | — |
| 77 | GRD | GRD | GRD | GRD | GRD | GRD | GRD | GRD | GRD | GRD |
| 78 | — | — | P101 | D6Q | P26 | — | — | C15Q | YL3 | — |
| 79 | GRD | GRD | GRD | GRD | GRD | GRD | GRD | GRD | GRD | GRD |
| 80 | — | — | — | D7Q | — | — | — | A0Q | — | — |
| 90 | — | — | — | $\overline{P136}$ | — | — | — | — | — | — |
| 91 | — | — | — | $\overline{P135}$ | — | — | — | — | — | — |
| 92 | — | — | — | P116 | — | — | — | — | — | — |

TABLE IV-continued

| 93 | — | — | — | $\overline{FAD}$ | — | — | — | — | — |

| | Logic Card | | | Logic Card | | | Logic Card | |
|---|---|---|---|---|---|---|---|---|
| | Servo Common | Servo Channel | | Servo Common | Servo Channel | | Servo Common | Servo Channel |
| | Reference Figure | | | Reference Figure | | | Reference Figure | |
| Pin | 16 | 17 | Pin | 16 | 17 | Pin | 16 | 17 |
| 1 | GND | 8 MHZ | A | −30 V | — | 2A | — | 70 V Ret |
| 2 | GND | — | B | 68 VAC | — | 3A | — | Motor High |
| 3 | — | — | C | CT | +20 V | 4A | — | — |
| 4 | — | Resolver Rotor | D | −21 V | ØB | 5A | — | Motor Low |
| 5 | $\overline{L_1Q}$ | — | E | +30 V | ØA | 6A | — | Motor Low Res. |
| 6 | — | — | F | −15 V | — | 2B | — | ØB |
| 7 | 13 | +30 V | G | — | — | 3B | — | ØB |
| 8 | 13 | Resolver Ret. | H | +Ramp | S3 = 1 MHZ | 4B | — | — |
| 9 | ØA | Resolver Ret. | I | — | +70 V | 5B | — | ØA |
| 10 | $\overline{P3}$ | — | J | +20 V | — | 6B | — | ØA |
| 11 | ØB | — | K | −RAMP | S118 | A6 | S104(B) | — |
| 12 | N29Q | — | L | +20 V | $\overline{BS7}$ = 125 KH7 | B7 | S103(B) | — |
| 13 | W₀ | — | M | 250 KHZ | 1/0-1 | T1 | 1 MH₂ | — |
| 14 | — | — | N | 250 KHZ | S101 | T5 | — | — |
| 15 | $\overline{DC-13}$ | | O | — | — | μ | $\overline{8 MHZ}$ | — |
| 16 | ΔX0Q | — | P | $\overline{FAB}$ | 1/0-2 | | | |
| 17 | — | — | Q | — | — | | | |
| 18 | SD-13 | — | R | 8 MHZ | S100 | | | |
| 19 | FRQ | +Ramp | S | — | N20Q | | | |
| 20 | S101 | −Ramp | T | 8 MHZ | S103 | | | |
| 21 | S118 | — | U | — | −30 V | | | |
| | | | V | S3 | −21 V | | | |
| | | | W | S3 | — | | | |
| | | | X | $\overline{BS7}$ | — | | | |
| | | | Y | — | — | | | |
| | | | Z | — | 250 KHZ | | | |

TABLE V

| Micro Operation | Word Time | Bit Times |
|---|---|---|
| FA | 0 | 16 |
| FB | 0 | 16 |
| FC | 0 | 16 |
| FD | 1 | 12 |
| FE | 2 | 8 |
| FF | 3 | 1 |
| FG | 4 | 12 |
| FH | 5 | 8 |
| FI | 6 | 8 |
| FJ | 7 | 12 |
| FK | 1 | 12 |
| FL | 1 | 1 |
| FM | 2 | 8 |
| FN | 3 | 8 |
| FO | 4 | 12 |
| FP | 5 | 8 |
| FQ | 6 | 8 |
| FR | 7 | 12 |
| FS | 7 | 12 |
| FT | 1 | 16 |
| FU | 1 | 16 |
| FV | 1 | 16 |
| FW | 1 | 16 |
| FX | 1 | 16 |
| FY | 1 | 16 |
| FZ | 2 | 8 |
| FAA | — | — |
| FAB | 1 | 16 |
| FAC | 1 | 16 |
| FAD | 1 | 16 |
| FAE | 1 | 1-16 |
| FAF | 1 | 1-16 |
| FAG | 1 | 12 |
| FAH | 1 | 12 |
| FAI | 1 | 12 |
| FAJ | 3 | 16 |
| FAK | 3 | 16 |
| FAL | 4 | 16 |
| FAM | 5 | 8 |
| FAN | 6 | — |
| FAO | 7 | 12 |
| FAP | — | — |
| FAQ | 1 | 16 |

Conclusion

Although there has been described above a specific arrangement of a numerical control system in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What I claim is as follows:

1. A computer system comprising:
    a single chip stored program digital computer implemented on a single integrated circuit chip, said single chip stored program digital computer including
    (1) an integrated circuit read only memory storing computer instructions, wherein said integrated circuit read only memory is implemented on said single integrated circuit chip;
    (2) an integrated circuit alterable memory storing computer operands, wherein said integrated circuit alterable memory is implemented on said single integrated circuit chip; and (3) an integrated circuit processing circuit coupled to the integrated circuit alterable memory and processing the computer operands stored by said integrated circuit alterable memory in response to the computer instructions stored by said integrated circuit read only memory, wherein said integrated circuit processing circuit is implemented on said single integrated circuit chip.

2. A computer system as set forth in claim 1, wherein said integrated circuit read only memory is arranged to store at least one of the computer instructions as an eight bit byte computer instruction, wherein said integrated circuit alterable memory is arranged to store at least one of the computer operands as a sixteen bit computer operand, and wherein said integrated circuit processing circuit is arranged to process a sixteen bit computer operand stored by said integrated circuit alterable memory in response to an eight bit byte computer instruction stored by said integrated circuit read only memory.

3. A computer system as set forth in claim 1, wherein said integrated circuit read only memory is arranged to store the computer instructions as eight bit bytes.

4. A computer system as set forth in claim 1, wherein said integrated circuit read only memory is arranged to store the computer instructions as eight bit bytes, wherein said integrated circuit processing circuit includes a transfer instruction execution circuit executing a transfer instruction, wherein said transfer instruction execution circuit includes a first accessing circuit accessing three sequential eight bit bytes stored by said integrated circuit read only memory and a transfer control circuit coupled to the first accessing circuit and transferring control to a next instruction in response to the three eight bit bytes accessed by said first accessing circuit.

5. A computer system as set forth in claim 1, wherein said integrated circuit read only memory is arranged to store computer instructions as eight bit bytes, said computer system further comprising an integrated circuit transfer execution circuit coupled to the integrated circuit read only memory and executing a transfer instruction stored thereby, wherein said integrated circuit transfer execution circuit is implemented on said single integrated circuit chip, and wherein said integrated circuit transfer circuit includes (a) a first accessing circuit accessing a first eight bit byte stored by said integrated circuit read only memory,
(b) a first transfer circuit coupled to the first accessing circuit and generating a transfer signal in response to detecting of a particular code of said first eight bit byte,
(c) a second accessing circuit coupled to the first transfer circuit and accessing a second eight bit byte and a third eight bit byte stored by said integrated circuit read only memory in response to the detecting of the particular code of said first eight bit byte by said first transfer circuit,
(d) a second transfer circuit coupled to the second accessing circuit and generating a transfer address in response to the second eight bit byte and the third eight bit byte accessed by said second accessing circuit, and
(e) a third accessing circuit coupled to the second transfer circuit and accessing a next instruction eight bit byte stored by said integrated circuit read only memory in response to the transfer address generated by said second transfer circuit.

6. A computer system as set forth in claim 1, wherein said integrated circuit read only memory is a computer main program memory.

7. A computer system as set forth in claim 1, further comprising an integrated circuit micro-instruction circuit executing a plurality of micro-instructions under control of an instruction stored in said integrated circuit read only memory, wherein said integrated circuit micro-instruction circuit is implemented on said single integrated circuit chip.

8. A computer system as set forth in claim 1, further comprising an integrated circuit micro-operation circuit executing a plurality of sequential micro-operations under control of an instruction stored in said integrated circuit read only memory, wherein said integrated circuit micro-operation circuit is implemented on said single integrated circuit chip, and wherein said micro-operation circuit includes a micro-instruction circuit executing at least one micro-instruction for each of the plurality of sequential micro-operations.

9. A computer system as set forth in claim 1, further comprising:
an integrated circuit address register storing a sixteen bit instruction address, wherein said integrated circuit address register is implemented on said single integrated circuit chip, and
an integrated circuit instruction access circuit accessing an instruction stored by said integrated circuit read only memory in response to the sixteen bit instruction address stored by said integrated circuit address register, wherein said integrated circuit instruction access circuit is implemented on said single integrated circuit chip.

10. A computer system as set forth in claim 1, further comprising:
an integrated cicuit interrupt circuit generating an interrupt signal, wherein said integrated circuit interrupt circuit is implemented on said single integrated circuit chip;
an integrated circuit transfer circuit coupled to the integrated circuit interrupt circuit and accessing an interrupt instruction stored by said integrated circuit read only memory in response to the interrupt signal, wherein said integrated circuit transfer circuit is implemented on said single integrated circuit chip; and
an integrated circuit return circuit coupled to the integrated circuit interrupt circuit and storing a return address in said integrated circuit alterable memory in response to the interrupt signal generated by said integrated circuit interrupt circuit, wherein said integrated circuit return circuit is implemented on said single integrated circuit chip.

11. A computer system as set forth in claim 1, wherein said integrated circuit processing circuit includes
an integrated circuit accumulator register storing a computer operand, wherein said integrated circuit accumulator register is implemented on said single integrated circuit chip;
an integrated circuit add circuit adding a computer operand stored by said integrated circuit accumulator register and a computer operand stored by said integrated circuit alterable memory in response to an add instruction stored by said integrated circuit read only memory, wherein said integrated circuit add circuit is implemented on said single integrated circuit chip;

an integrated circuit subtract circuit subtracting a computer operand stored by said integrated circuit accumulator register and a computer operand stored by said integrated circuit alterable memory in response to a subtract instruction stored by said integrated circuit read only memory, wherein said integrated circuit subtract circuit is implemented on said single integrated circuit chip;

an integrated circuit logical circuit logically processing a computer operand stored by said integrated circuit accumulator register and a computer operand stored by said integrated circuit alterable memory in response to a logical instruction stored by said integrated circuit read only memory, wherein said integrated circuit logical circuit is implemented on said single integrated circuit chip; and an integrated circuit transfer circuit generating a transfer signal in response to a transfer instruction stored by said integrated circuit read only memory, wherein said integrated circuit transfer circuit is implemented on said single integrated circuit chip, and wherein said integrated circuit transfer circuit includes an accessing circuit accessing an instruction stored by said integrated circuit read only memory in response to the transfer signal generated by said integrated circuit transfer circuit and includes a return address storing circuit storing a return address in said integrated circuit alterable memory in response to the transfer signal generated by said integrated circuit transfer circuit.

12. A computer system as set forth in claim 1, wherein said integrated circuit processing circuit includes an inline circuit processing an inline instruction, said inline circuit including:

a first accessing circuit accessing an inline instruction byte stored by said integrated circuit read only memory;

a first inline execution circuit generating an inline signal in response to an inline instruction byte accessed by said first accessing circuit;

a second accessing circuit coupled to said first inline execution circuit and accessing at least one inline computer operand byte stored by said integrated circuit read only memory in response to the inline signal; and a second inline execution circuit coupled to said second accessing circuit and processing the at least one inline computer operand byte accessed by said second accessing circuit.

13. A computer system as set forth in claim 1, wherein said integrated circuit read only memory is adapted to store at least one operand, wherein said integrated circuit processing circuit includes a loading circuit loading an operand stored by said integrated circuit read only memory into said integrated circuit alterable memory, and wherein said loading circuit includes:

a first accessing circuit accessing a load instruction stored by said integrated circuit read only memory;

a second accessing circuit accessing an operand to be loaded that is stored by said integrated circuit read only memory in response to the load instruction accessed by said first accessing circuit; and a storing circuit coupled to said first accessing circuit and to said second accessing circuit and storing the operand accessed by said second accessing circuit into said integrated circuit alterable memory in response to the load instruction accessed by said first accessing circuit.

14. A computer system as set forth in claim 1, further comprising an integrated circuit indirect transfer circuit providing indirect transfer of program control, wherein said integrated circuit indirect transfer circuit is implemented on said single integrated circuit chip, and wherein said integrated circuit indirect transfer circuit includes:

a first accessing circuit coupled to said integrated circuit read only memory and accessing an indirect transfer instruction stored by said integrated circuit read only memory;

an indirect transfer execution circuit coupled to said first accessing circuit and generating an indirect transfer signal in response to an indirect transfer instruction accessed by said first accessing circuit;

a second accessing circuit coupled to said integrated circuit alterable memory and to said indirect transfer execution circuit and accessing an indirect transfer address stored by said integrated circuit alterable memory in response to the indirect transfer signal; and a third accessing circuit coupled to said integrated circuit read only memory and to said second accessing circuit and accessing an instruction stored by said integrated circuit read only memory in response to the indirect transfer address accessed by said second accessing circuit.

15. A computer system as set forth in claim 1, further comprising a communication device communicating with an operator in response to the instructions stored by said integrated circuit read only memory.

16. A computer system as set forth in claim 1, further comprising an integrated circuit serial output circuit coupled to said integrated circuit read only memory and generating a serial output computer operand in response to at least one of the computer instructions stored by said integrated circuit read only memory, wherein said serial output circuit is implemented on said single integrated circuit chip.

17. A computer system as set forth in claim 1, further comprising an integrated circuit serial input circuit inputting a serial input computer operand in response to at least one of the computer instructions stored by said integrated circuit read only memory, wherein said integrated circuit serial input circuit is implemented on said single integrated circuit chip, and an integrated circuit alterable memory input circuit coupled to said integrated circuit alterable memory and to said integrated circuit serial input circuit and storing the serial input computer operand into said integrated circuit alterable memory in response to at least one of the computer instructions stored by said integrated circuit read only memory, wherein said integrated circuit alterable memory input circuit is implemented on said single integrated circuit chip.

18. A computer system as set forth in claim 1, wherein said computer system is a factored computer system; said factored computer system further comprising:

a controller controlling a machine tool in response to a serial machine control signal generated by said single chip stored program digital computer;

a display device displaying information to an operator in response to a serial display signal generated by said single chip stored program digital computer;

a serial elemental extremity operating under computer coaction in response to a serial interface signal generated by said single chip stored program digital computer;

a remote computer communicating with said single chip stored program digital computer in response to a serial communication signal;

a parallel elemental extremity operating under computer coaction in response to a parallel interface signal generated by said single chip stored program digital computer;

a physically distributed interface operating in response to a distributed interface signal generated by said single chip stored program digital computer; and wherein said single chip stored program digital computer further includes (a) an integrated circuit serial output circuit generating the serial machine control signal, the serial display signal, and the serial interface signal in response to at least one of the computer instructions stored by said integrated circuit read only memory, wherein said integrated circuit serial output circuit is implemented on said single integrated circuit chip, (b) an integrated circuit parallel output circuit generating the parallel interface signal in response to at least one of the computer instructions stored by said integrated circuit read only memory, (c) an integrated circuit serial communication circuit serially communicating with said remote computer with the serial communication signal, wherein said integrated circuit parallel output circuit is implemented on said single integrated circuit chip, and (d) an integrated circuit distributed output circuit generating the distributed response to at least one of the computer instructions stored by said integrated circuit read only memory.

19. A stored program data processor comprising:

a single integrated circuit chip to implement said stored program data processor;

an integrated circuit read only memory storing processor instructions, wherein said integrated circuit read only memory is implemented on said single integrated circuit chip;

an integrated circuit alterable memory storing processed information, wherein said integrated circuit alterable memory is implemented on said single integrated circuit chip;

an integrated circuit processor coupled to said integrated circuit read only memory and to said integrated circuit alterable memory and processing the information stored by said integrated circuit alterable memory in response to the instructions stored by said integrated circuit read only memory, wherein said integrated circuit processor is implemented on said single integrated circuit chip; and an integrated circuit transfer circuit transferring instruction control in response to a triple byte transfer instruction stored by said integrated circuit read only memory, wherein said integrated circuit transfer circuit is implemented on said single integrated circuit chip, and wherein said integrated circuit transfer circuit includes (a) a first accessing circuit coupled to said integrated circuit read only memory and accessing a first byte of a triple byte transfer instruction, (b) a first transfer circuit coupled to said first accessing circuit and generating a transfer signal in response to the first byte of the triple byte transfer instruction, (c) a second accessing circuit coupled to said integrated circuit read only memory and to said first transfer circuit and accessing a second byte and a third byte of the triple byte transfer instruction in response to the transfer signal, (d) a combining circuit coupled to said second accessing circuit and generating a double byte transfer address by combining said second byte and said third byte accessed by said second accessing circuit, and (e) a transfer circuit coupled to said combining circuit and transferring instruction control in response to the double byte transfer address.

20. A stored program data processor as set forth in claim 19, further comprising an integrated circuit return address circuit coupled to said integrated circuit alterable memory and storing a return address in said integrated circuit alterable memory in response to the triple byte transfer instruction stored by said integrated circuit read only memory.

21. A stored program data processor as set forth in claim 19, further comprising an integrated circuit serial output circuit generating a serial output computer operand in response to at least one of the processor instructions stored by said integrated circuit read only memory, wherein said integrated circuit serial output circuit is implemented on said single integrated circuit chip.

22. A stored program data processor as set forth in claim 19, further comprising:

an integrated circuit serial input circuit inputting a serial input operand in response to at least one of the processor instructions stored by said integrated circuit read only memory, wherein said integrated circuit serial input circuit is implemented on said single integrated circuit chip, and an integrated circuit alterable memory input circuit coupled to said integrated circuit alterable memory and to said integrated circuit serial input circuit and storing the serial input operand into said integrated circuit alterable memory in response to at least one of the processor instructions stored by said integrated circuit read only memory, wherein said integrated circuit alterable memory input circuit is implemented on said single integrated circuit chip.

23. A stored program data processor comprising:

a single integrated circuit chip to implement said stored program data processor;

an integrated circuit read only memory storing processor instructions, wherein said integrated circuit read only memory is implemented on said single integrated circuit chip;

an integrated circuit alterable memory storing processed information, wherein said integrated circuit alterable memory is implemented on said single integrated circuit chip;

an integrated circuit processor coupled to said integrated circuit read only memory and to said integrated circuit alterable memory and processing the information stored by said integrated circuit alterable memory in response to the instructions stored by said integrated circuit read only memory, wherein said integrated circuit processor is implemented on said single integrated circuit chip, and wherein said integrated circuit processor includes
(a) a first accessing circuit accessing a single byte instruction stored by said integrated circuit read only memory,
(b) a first execution circuit executing the single byte instruction accessed by said first accessing circuit,
(c) a second accessing circuit accessing a double byte instruction stored by said integrated circuit read only memory,
(d) a second execution circuit executing the double byte instruction accessed by said second accessing circuit,
(e) a third accessing circuit accessing a triple byte instruction stored by said integrated circuit read only memory, and
(f) a third execution circuit executing the triple byte instruction accessed by said third accessing circuit.

24. A stored program data processor as set forth in claim 23, further comprising an integrated circuit serial output circuit generating a serial output operand in response to at least one of the processor instructions stored by said integrated circuit read only memory, wherein said integrated circuit serial output circuit is implemented on said single integrated circuit chip.

25. A stored program data processor system comprising:
an input device generating input business information and
a single chip integrated circuit data processor processing data in response to a stored program, said single chip integrated circuit data processor including
(a) an integrated circuit read only main memory storing a program, wherein said integrated circuit read only main memory is included on said single chip;
(b) an integrated circuit alterable memory storing operands, wherein said integrated circuit alterable memory is included on said single chip;
(c) an integrated circuit input circuit generating a processor input signal in response to the input business information generated by said input device in response to the program stored in said integrated circuit read only main memory, wherein said integrated circuit input circuit is included on said single chip;
(d) an integrated circuit storing circuit storing an operand into said integrated circuit alterable memory in response to the program stored by said integrated circuit read only main memory and in response to the processor input signal generated by said integrated circuit input circuit, wherein said integrated circuit storing circuit is included on said single chip;
(e) an integrated circuit processing circuit processing operands stored by said integrated circuit alterable memory in response to the program stored by said integrated circuit read only main memory, wherein said integrated circuit processing circuit is included on said single chip; and
(f) an integrated circuit output circuit outputting business information in response to the program stored by said integrated circuit read only main memory in response to the processing of operands by said integrated circuit processing circuit, wherein said integrated circuit output circuit is included on said single chip.

26. A stored program data processor system as set forth in claim 19, wherein said integrated circuit output circuit is arranged to output the business information in serial form.

27. A computer system comprising:
an input device generating a digital input signal;
a single chip integrated circuit digital computer coupled to said input device and generating a digital output signal in response to the digital input signal generated by said input device, said single chip integrated circuit digital computer including:
(a) an integrated circuit read only main memory included on said single chip and storing a computer program,
(b) an integrated circuit alterable memory included on said single chip and storing computer operands,
(c) an integrated circuit processing circuit included on said single chip and coupled to said integrated circuit alterable memory, to said integrated circuit read only memory, and to said input device and processing a computer operand stored by said integrated circuit alterable memory on the same chip in response to the computer program stored by said integrated circuit read only main memory on said single chip in response to the digital input signal, and
(d) an integrated circuit output circuit included on said single chip and coupled to said integrated circuit read only memory and to said integrated circuit processing circuit and generating the digital output signal in response to the computer program stored by said integrated circuit read only main memory on said single chip and in response to the digital input signal responsive processing of a computer operand by said processing circuit on said single chip; and
a process controller coupled to said integrated circuit output circuit and controlling a process in response to the digital output signal.

28. A computer system as set forth in claim 27, wherein said integrated circuit output circuit is adapted to generate the digital output signal as a serial digital output signal.

29. A computer on a chip comprising:
an integrated circuit chip having a computer implemented thereon;
an integrated circuit main memory storing computer instructions, wherein said integrated circuit main memory is included on said integrated circuit chip;
an integrated circuit operand memory storing operands, wherein said integrated circuit operand memory is included on said integrated circuit chip; and
an integrated circuit processing circuit processing the operands stored by said integrated circuit operand memory in response to the instructions stored by said integrated circuit main memory, wherein said processing circuit is included on said integrated circuit chip.

30. A computer on a chip as set forth in claim 29, wherein said integrated circuit main memory includes an integrated circuit read only memory storing the instructions in read only form.

31. A computer on a chip as set forth in claim 29, wherein said integrated circuit operand memory includes an integrated circuit random access memory storing the operands in random access form.

32. A computer on a chip as set forth in claim 29, further comprising at least one additional integrated circuit chip; wherein said additional integrated circuit chip includes additional memory coupled to extend said integrated circuit main memory on said computer integrated circuit chip and storing additional computer instructions.

33. A computer on a chip as set forth in claim 29, further comprising at least one additional integrated circuit chip; wherein said additional integrated circuit chip includes an interface circuit coupled to said computer integrated circuit chip and transferring information between said integrated circuit chip and an external device.

34. A computer on a chip as set forth in claim 29, further comprising:
an integrated circuit output circuit coupled to said integrated circuit processing circuit and generating a display output signal, wherein said integrated circuit operand memory is included on said integrated circuit chip, and
an operator display coupled to said integrated circuit output circuit and displaying information in response to the display output signal.

35. A computer on a chip as set forth in claim 29, further comprising an integrated circuit serial output circuit generating a serial output operand in response to at least one of the computer instructions stored by said integrated circuit main memory, wherein said serial output circuit is included on said chip.

36. An integrated circuit stored program computer comprising:
an integrated circuit read only memory storing computer instructions;
an integrated circuit alterable memory storing computer operands;
an integrated circuit processing logic circuit coupled to said integrated circuit read only memory and to said integrated circuit alterable memory and generating the computer operands stored by said integrated circuit alterable memory in response to the computer instructions stored by said integrated circuit read only memory;
an integrated circuit interrupt input logic circuit generating an interrupt input signal;
an integrated circuit transfer logic circuit coupled to said integrated circuit read only memory and to said integrated circuit interrupt logic circuit and accessing an interrupt instruction stored by said integrated circuit read only memory in response to the interrupt input signal; and
an integrated circuit interrupt return logic circuit coupled to said integrated circuit alterable memory and to said integrated circuit interrupt input logic circuit and storing a return address in said integrated circuit alterable memory in response to the interrupt input signal.

37. An integrated circuit stored program computer comprising:
an integrated circuit read only memory storing computer instructions;
an integrated circuit alterable memory storing computer operands;
an integrated circuit processing logic circuit coupled to said integrated circuit read only memory and to said integrated circuit alterable memory and generating the computer operands stored by said integrated circuit alterable memory in response to the instructions stored by said integrated circuit read only memory;
an integrated circuit transfer logic circuit coupled to said integrated circuit read only memory and transferring instruction control in response to a triple byte transfer instruction stored by said integrated circuit read only memory, said integrated circuit transfer logic circuit including
(a) a first accessing circuit accessing a first byte of a triple byte transfer instruction stored by said integrated circuit read only memory,
(b) a first transfer circuit coupled to said first accessing circuit and generating a transfer signal in response to said first byte of a triple byte transfer instruction,
(c) a second accessing circuit coupled to said first transfer circuit and accessing a second byte and a third byte of a triple byte transfer instruction stored by said integrated circuit read only memory in response to the transfer signal,
(d) a combining circuit coupled to said second accessing circuit and generating a double byte transfer address by combining said second byte and said third byte of a triple byte transfer instruction, and
(f) a second transfer circuit coupled to said combining circuit and transferring instruction control in response to the double byte transfer address.

38. An integrated circuit stored program computer as set forth in claim 37, further comprising an integrated circuit return address circuit coupled to said integrated circuit transfer logic circuit and storing a return address in said integrated circuit alterable memory in response to the transferring of instruction control by said integrated circuit transfer logic circuit.

39. An integrated circuit stored program computer comprising:
an integrated circuit read only memory storing computer instructions;
an integrated circuit alterable memory storing computer operands;
an integrated circuit processing logic circuit coupled to said integrated circuit read only memory and to said integrated circuit alterable memory and processing the computer operands stored by said integrated circuit alterable memory in response to the computer instructions stored by said integrated circuit read only memory, wherein said integrated circuit processing logic circuit includes
(a) a first accessing logic circuit accessing a single byte computer instruction stored by said integrated circuit read only memory,
(b) a first instruction execution logic circuit coupled to said first accessing logic circuit and executing the single byte computer instruction accessed by said first accessing logic circuit,
(c) a second accessing logic circuit accessing the double byte computer instruction stored by said integrated circuit read only memory,
(d) a second instruction execution logic circuit coupled to said second accessing logic circuit and executing the double byte computer instruction accessed by said second accessing logic circuit, (e) a third accessing logic circuit accessing a triple byte computer instruction stored by said integrated circuit read only memory, and (f) a third instruction execution logic circuit coupled to said third accessing logic circuit and executing the triple byte computer instruction accessed by said third accessing logic circuit.

40. An integrated circuit stored program computer comprising:

an integrated circuit read only memory storing computer instructions;

an integrated circuit alterable memory storing computer operands; and an integrated circuit processing logic circuit coupled to said integrated circuit read only memory and to said integrated circuit alterable memory and processing the computer operands stored by said integrated circuit alterable memory in response to the computer instructions stored by said integrated circuit read only memory, wherein said integrated circuit processing logic circuit includes an inline logic circuit executing an inline instruction, said inline logic circuit including:

(1) a first accessing logic circuit accessing an inline computer instruction byte stored by said integrated circuit read only memory, (2) a first execution logic circuit coupled to said first accessing logic circuit and generating an inline signal in response to an inline computer instruction byte accessed by said first accessing logic circuit, (3) a second accessing logic circuit coupled to said first execution logic circuit and accessing at least one inline operand byte stored by said integrated circuit read only memory in response to the inline signal, and (4) a second execution logic circuit coupled to said second accessing logic circuit and processing the at least one inline operand byte accessed by said second accessing logic circuit.

41. An integrated circuit stored program computer comprising:

an integrated circuit read only memory storing computer instructions;

an integrated circuit alterable memory storing computer operands;

an integrated circuit processor coupled to said integrated circuit read only memory and to said integrated circuit alterable memory and processing the computer operands stored by said integrated circuit alterable memory in response to the computer instructions stored by said integrated circuit read only memory; and an integrated circuit indirect transfer logic circuit coupled to said integrated circuit read only memory and to said integrated circuit alterable memory and providing indirect transfer of program control, said indirect transfer means including:

(1) a first accessing logic circuit accessing an indirect transfer computer instruction stored by said integrated circuit read only memory, (2) an indirect transfer logic circuit coupled to said first accessing logic circuit and generating an indirect transfer signal in response to an indirect transfer computer instruction accessed by said first accessing logic circuit, (3) a second accessing logic circuit coupled to said indirect transfer logic circuit and accessing an indirect transfer address stored by said integrated circuit alterable memory in response to the indirect transfer signal, and (4) a third accessing logic circuit coupled to said second accessing logic circuit and accessing an instruction stored by said integrated circuit read only memory in response to the indirect transfer address accessed by said second accessing logic circuit.

* * * * *

Adverse Decisions In Interference

Patent No. 4,942,516, Gilbert P. Hyatt, SINGLE CHIP INTEGRATED CIRCUIT COMPUTER ARCHITECTURE, Interference No. 102,598, final judgment adverse to the patentee rendered September 19, 1995, as to claims 1-35.

*(Official Gazette October 27, 1998)*